United States Patent
Hoang et al.

(10) Patent No.: US 10,292,258 B2
(45) Date of Patent: May 14, 2019

(54) VERTICAL SHIELDING AND INTERCONNECT FOR SIP MODULES

(71) Applicant: Apple Inc., Cupertino, CA (US)

(72) Inventors: Lan H. Hoang, San Jose, CA (US); Takayoshi Katahira, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/713,705

(22) Filed: Sep. 25, 2017

(65) Prior Publication Data

US 2018/0049311 A1 Feb. 15, 2018

Related U.S. Application Data

(63) Continuation-in-part of application No. 15/080,523, filed on Mar. 24, 2016.

(Continued)

(51) Int. Cl.
*H05K 1/02* (2006.01)
*H05K 1/11* (2006.01)
(Continued)

(52) U.S. Cl.
CPC ......... *H05K 1/0218* (2013.01); *H01L 21/481* (2013.01); *H01L 21/4817* (2013.01); *H01L 23/552* (2013.01); *H01L 25/0652* (2013.01); *H01L 25/105* (2013.01); *H01L 25/112* (2013.01); *H05K 1/0203* (2013.01); *H05K 1/0216* (2013.01); *H05K 1/111* (2013.01); *H05K 1/144* (2013.01); *H05K 1/181* (2013.01); *H05K 3/284* (2013.01); *H05K 3/368* (2013.01); *H05K 3/4038* (2013.01);
*H05K 9/0024* (2013.01); *H01L 21/4867* (2013.01); *H01L 23/295* (2013.01); *H01L 23/49811* (2013.01); *H01L 23/5386* (2013.01); *H01L 24/13* (2013.01); *H01L 24/16* (2013.01); *H01L 24/32* (2013.01); *H01L 25/16* (2013.01); *H01L 25/162* (2013.01); *H01L 25/165* (2013.01);
(Continued)

(58) Field of Classification Search
USPC .................................. 361/760, 761, 818
See application file for complete search history.

(56) References Cited

U.S. PATENT DOCUMENTS 5,274,570 A 12/1993 Izumi et al.
8,294,252 B1 10/2012 Patel et al.
(Continued)

FOREIGN PATENT DOCUMENTS

CN 103517577 A 1/2014
CN 103579114 A 2/2014
(Continued)

OTHER PUBLICATIONS

U.S. Appl. No. 14/296,449, "Advisory Action," dated May 18, 2016, 4 pages.
(Continued)

*Primary Examiner* — Andargie M Aychillhum
(74) *Attorney, Agent, or Firm* — Kilpatrick Townsend & Stockton, LLP

(57) ABSTRACT

Vertical shielding and interconnect structures for system-in-a-package modules, where the vertical shielding and interconnect structures are readily manufactured and are space efficient.

20 Claims, 65 Drawing Sheets

Related U.S. Application Data

(60) Provisional application No. 62/399,274, filed on Sep. 23, 2016, provisional application No. 62/138,951, filed on Mar. 26, 2015, provisional application No. 62/166,006, filed on May 24, 2015.

(51) Int. Cl.

| | |
|---|---|
| *H05K 3/28* | (2006.01) |
| *H05K 9/00* | (2006.01) |
| *H05K 1/14* | (2006.01) |
| *H05K 3/36* | (2006.01) |
| *H05K 3/40* | (2006.01) |
| *H05K 1/18* | (2006.01) |
| *H01L 21/48* | (2006.01) |
| *H01L 23/552* | (2006.01) |
| *H01L 25/065* | (2006.01) |
| *H01L 25/10* | (2006.01) |
| *H01L 25/11* | (2006.01) |
| *H05K 3/34* | (2006.01) |
| *H01L 23/29* | (2006.01) |
| *H01L 23/498* | (2006.01) |
| *H01L 23/538* | (2006.01) |
| *H01L 23/00* | (2006.01) |
| *H01L 25/16* | (2006.01) |

(52) U.S. Cl.
CPC .......... *H01L 2224/131* (2013.01); *H01L 2224/16105* (2013.01); *H01L 2224/16106* (2013.01); *H01L 2224/16227* (2013.01); *H01L 2224/32225* (2013.01); *H01L 2224/73204* (2013.01); *H01L 2224/8184* (2013.01); *H01L 2225/1023* (2013.01); *H01L 2225/1047* (2013.01); *H01L 2225/1058* (2013.01); *H01L 2924/15151* (2013.01); *H01L 2924/15311* (2013.01); *H01L 2924/15322* (2013.01); *H01L 2924/16251* (2013.01); *H01L 2924/1815* (2013.01); *H01L 2924/18161* (2013.01); *H01L 2924/19041* (2013.01); *H01L 2924/19042* (2013.01); *H01L 2924/19043* (2013.01); *H01L 2924/19105* (2013.01); *H01L 2924/19106* (2013.01); *H05K 3/341* (2013.01); *H05K 2201/041* (2013.01); *H05K 2201/042* (2013.01); *H05K 2201/10015* (2013.01); *H05K 2201/10022* (2013.01); *H05K 2201/10287* (2013.01); *H05K 2201/10371* (2013.01); *H05K 2201/10515* (2013.01); *H05K 2201/10522* (2013.01); *H05K 2201/10545* (2013.01); *H05K 2203/1316* (2013.01); *H05K 2203/1327* (2013.01); *Y02P 70/611* (2015.11)

(56) References Cited

U.S. PATENT DOCUMENTS

| | | |
|---|---|---|
| 2003/0165051 A1 | 9/2003 | Kledzik et al. |
| 2006/0115928 A1 | 6/2006 | Nguyen et al. |
| 2006/0163707 A1 | 7/2006 | Hooi et al. |
| 2007/0057357 A1* | 3/2007 | Chen .......... H01L 24/73 257/686 |
| 2008/0246008 A1* | 10/2008 | Kuroda .......... C08G 59/621 252/510 |
| 2009/0000114 A1* | 1/2009 | Rao .......... H01L 23/552 29/832 |
| 2010/0140759 A1 | 6/2010 | Pagaila |
| 2010/0290191 A1* | 11/2010 | Lin .......... H01L 23/49816 361/704 |
| 2010/0331738 A1 | 12/2010 | Stein et al. |
| 2011/0286194 A1 | 11/2011 | Kawabata et al. |
| 2012/0061814 A1 | 3/2012 | Camacho et al. |
| 2012/0217624 A1 | 8/2012 | Morris et al. |
| 2013/0223038 A1 | 8/2013 | Yamamoto et al. |
| 2013/0241044 A1 | 9/2013 | Kim et al. |
| 2013/0343023 A1 | 12/2013 | Nakagoshi et al. |
| 2014/0103527 A1 | 4/2014 | Marimuthu et al. |
| 2014/0167232 A1 | 6/2014 | LoBianco |
| 2014/0203457 A1 | 7/2014 | Kim et al. |
| 2015/0187742 A1 | 7/2015 | Kwon et al. |
| 2015/0200182 A1 | 7/2015 | Wang et al. |
| 2015/0200185 A1 | 7/2015 | Yu et al. |
| 2015/0206854 A1 | 7/2015 | Lane et al. |
| 2015/0348865 A1 | 12/2015 | Vincent |
| 2015/0359099 A1 | 12/2015 | Pennathur et al. |
| 2016/0021756 A1 | 1/2016 | Lee et al. |
| 2016/0270213 A1 | 9/2016 | Salehi et al. |
| 2016/0286647 A1 | 9/2016 | Hoang et al. |

FOREIGN PATENT DOCUMENTS

| | | |
|---|---|---|
| CN | 204905477 | 12/2015 |
| DE | 202015004098 | 8/2015 |
| JP | 2011514015 | 4/2011 |
| JP | 3199281 | 7/2015 |
| KR | 1020090022749 | 3/2009 |
| WO | 2013095402 | 6/2013 |
| WO | 2013176426 | 11/2013 |
| WO | 2015187972 | 12/2015 |
| WO | 2016154494 | 9/2016 |

OTHER PUBLICATIONS

U.S. Appl. No. 14/296,449, "Final Office Action," dated Feb. 4, 2016, 18 pages.
U.S. Appl. No. 14/296,449, "Non-Final Office Action," dated Aug. 14, 2015, 13 pages.
U.S. Appl. No. 14/296,449, "Non-Final Office Action," dated Jun. 24, 2016, 13 pages.
U.S. Appl. No. 14/296,449, "Restriction Requirement," dated Apr. 23, 2015, 8 pages.
U.S. Appl. No. 14/730,250, "Non-Final Office Action," dated Sep. 8, 2016, 18 pages.
U.S. Appl. No. 14/730,250, "Restriction Requirement," dated May 4, 2016, 8 pages.
CN201520379217.8, "Notice of Decision to Grant," dated Nov. 19, 2015, 2 pages.
CN201520379217.8, "Office Action," dated Aug. 7, 2015, 4 pages.
KR10-2016-0037062, "Office Action," dated May 10, 2016, 13 pages.
PCT/US2015/034233, "International Search Report and Written Opinion," dated Sep. 15, 2015, 13 pages.
PCT/US2016/024110, "International Search Report and Written Opinion," dated Oct. 5, 2016, 17 pages.
PCT/US2016/024110, "Invitation to Pay Add'l Fees and Partial Search Report," dated Jun. 29, 2016, 6 pages.
TW104208922, "Office Action," dated Jan. 15, 2016, 3 pages.
TW105203852, "Office Action," dated May 12, 2016, 2 pages.
Office Action dated Apr. 30, 2018 in U.S. Appl. No. 15/080,523, 13 pages.
Office Action dated Oct. 18, 2018 in U.S. Appl. No. 15/713,453, 14 pages.
Utility Model Patent Evaluation Report dated Dec. 20, 2018 in Chinese Patent No. ZL2016900002705, 6 pages.
Notice of Allowance dated Feb. 7, 2019 in U.S. Appl. No. 15/713,453, 8 pages.

\* cited by examiner

VERTICAL SHIELDING AND INTERCONNECT FOR SIP MODULES

CROSS-REFERENCES TO RELATED APPLICATIONS

This application is a continuation-in-part of U.S. patent application Ser. No. 15/080,523, filed Mar. 24, 2016, which claims the benefit of U.S. provisional application Nos. 62/138,951, filed Mar. 26, 2015 and 62/166,006, filed May 24, 2015. This application also claims the benefit of U.S. provisional patent application 62/399,274, filed Sep. 23, 2016, which is incorporated by reference.

BACKGROUND

The number of types of electronic devices that are commercially available has increased tremendously the past few years and the rate of introduction of new devices shows no signs of abating. Devices, such as tablet, laptop, netbook, desktop, and all-in-one computers, cell, smart, and media phones, storage devices, portable media players, navigation systems, monitors, and others, have become ubiquitous.

The functionality of these devices has likewise greatly increased. This in turn has led to increased complexity inside of these electronic devices. At the same time, the dimensions of these devices have become smaller. For example, smaller and thinner devices are becoming more popular.

This increasing functionality and decreasing size have necessitated the use of space-efficient circuit techniques. As one example, system-in-a-package modules and other similar structures may be used to increase an electronic device's functionality while reducing space consumed in the device.

These system-in-a-package modules may include electronic devices or components placed on a board and then sealed and encapsulated in a plastic or other material. But in some circumstances, it may be desirable to shield electronic devices in one circuit from electronic devices in another circuit in the same system-in-a-package module. This may consume a great deal of space, thereby making the system-in-a-package module less space-efficient.

Thus, what is needed are vertical shielding and interconnect structures for system-in-a-package modules, where the vertical shielding and interconnect structures are readily manufactured and are space efficient.

SUMMARY

Accordingly, embodiments of the present invention may provide vertical shielding and interconnect structures for system-in-a-package (SIP) modules, where the vertical shielding and interconnect structures are readily manufactured and are space efficient.

An illustrative embodiment of the present invention may provide a SIP module where two or more circuits in the module are shielded from each other by vertical shields. These vertical shields may be formed by closely spaced columns of conductive material. These columns may be grounded. These conductive columns may form a Faraday cage to isolate circuits from each other. In these and other embodiments of the present invention, the vertical shields may be formed of walls of conductive materials. These walls may be grounded.

In these and other embodiments of the present invention, the vertical columns may be formed by stacking drops of solder. The solder droplets may be formed using solder jets or other techniques. In these and other embodiments of the present invention, the vertical columns may be formed by sintering, for example by layering a copper-tin material such that a column is built up. In these and other embodiments of the present invention, the vertical columns may be formed by printing, such as by using an ink-jet type printer, a 3-D printer, aerosol jet printer, or other type of printer.

In these and other embodiments of the present invention, the vertical walls may be formed by stacking layers of solder. The solder layers may be formed using solder jets or other techniques. In these and other embodiments of the present invention, the vertical walls may be formed by sintering, for example by layering a copper-tin material such that a wall is built up. In these and other embodiments of the present invention, the vertical walls may be formed by printing, such as by using an ink-jet type printer, a 3-D printer, aerosol jet printer, or other type of printer. In these and other embodiments of the present invention, the vertical walls may be formed by stitching a wire bond such that it makes contact with a substrate of the SIP module in several locations.

In these and other embodiments of the present invention, the vertical walls and columns may be formed using an adhesive paste or other material. The walls and columns may be formed using printing, stenciling, or other appropriate technique. These walls or columns may be formed of metal, such as aluminum, copper, steel, or other conductive material and fixed to a surface of a substrate of the SIP module.

In these and other embodiments of the present invention, after electronic circuits are placed on a substrate and these walls and columns are formed on the substrate, an overmold or other material may be formed covering the electronic circuits, walls, and columns. A top portion of the overmold above the walls and columns may be removed by chemical or laser etching, or other process, thereby exposing tops of the walls and columns. A top shield layer may be applied to the top surface of the overmold such that electrical contact is made between the top shield and the walls and columns. The top shield layer may be formed by printing, such as by ink-jet, 3-D, aerosol-jet, or other type of printing, plating, sputtering, vapor deposition (chemical or physical), or other technique.

In these and other embodiments of the present invention, the walls and columns may be formed on a first substrate. The first substrate may be flipped over and used as a cap or cover for a SIP module.

In these and other embodiments of the present invention, these same techniques that may be used to form walls and columns may be used to form vertical interconnect structures. These vertical interconnect structures may be used to stack electronic circuits or components in order to save space or reduce trace length on a printed circuit board, or both. For example, a first electronic circuit or component may be attached to a surface of a substrate. Vertical interconnect structures may be built up on each side the first electronic circuit or component. A second electronic circuit or component may be electrically connected and attached to the vertical interconnect structures. In this way, the second electronic circuit or component may be stacked above the first electronic circuit or component. In this configuration, the first electronic circuit or component may be between the second electronic circuit or component and a substrate. In these and other embodiments of the present invention these electronic circuits or components may be stacked in various ways.

These stacked electronic circuits may be formed of capacitors, resistors, inductors, transformers, or other active or passive components. In one method of manufacturing capacitors may be placed on a layer of high-temperature tacky tape. These capacitors may be placed using a pick-and-place machine or other appropriate machine or method. Sintered regions may be formed on contacts of the capacitors. This may be done using screen-printing, ink jet, or 3-D printing, aerosol-jet printing, stenciling or other type of printing or manufacturing process. One or more additional capacitors may be placed on the sintered capacitors using a pick-and-place machine or other appropriate machine or method. The stacked capacitor structure may then be heated to reflow temperatures such that the sintered regions join the stacked capacitors together. The completed stacked capacitor structure may then be removed from the tacky tape, again by using a pick-and-place machine or other machine or method. In these and other embodiments of the present invention, instead of sintering, soldered regions may be formed on contacts of the capacitors, again using screen-printing, ink jet, or 3-D printing, aerosol jet printing, stenciling or other type of printing or manufacturing process.

This method may be useful where a stack of capacitors may be formed and moved as a module. In other embodiments of the present invention, these stacked capacitor structures may be formed on a printed circuit board or other appropriate substrate. In one example, regions of solder or sinter may be formed on a printed circuit board. These regions may be formed of tin-silver-copper (SAC) solder, other soldering or sintering material, or other material. This may be done using screen-printing, ink jet, or 3-D printing, aerosol jet printing, stenciling or other type of printing or manufacturing process. Capacitors may be placed using a pick-and-place machine or other appropriate machine or method onto the printed circuit board. One or more additional capacitors may be dipped in solder paste or other solder or sintering material to form solder paste regions on its contacts. The additional capacitors may be placed on the capacitors that are on the printed circuit board. A reflow step may be used to solder the capacitors together. In these various methods and stacked capacitor structures, vertical interconnect structures may be used to connect stacked capacitors together.

In these and other embodiments of the present invention, SIP modules may include vertical interconnect structures that may extend from to a top surface of a module overmold. These SIP modules may then be attached to each other and the vertical interconnect structures may form interconnect between the modules for power or signals, or both. More specifically, vertical interconnect structures may be placed on a top or other surface of a substrate, device, component, circuit, or other portion of a SIP module. Electronic devices or components may be placed on the substrate as well. An overmold may cover the vertical interconnect structures and the electronic devices or components. A top of the overmold may be ground down such that the top of the interconnect structures are exposed. A top side of a second SIP module, a flexible circuit board, or other structure, may be mated with the top of the SIP module. Vertical interconnect structures in the SIP module may form electrical pathways with corresponding vertical interconnect structures in the second SIP module. Conductive paste may be used to connect the vertical interconnect structures together between the two SIP modules. One or more carriers may be used to simplify the handling of multiple vertical interconnect structures. These carriers may be removed during the grinding process on the top surface of the SIP module.

In these and other embodiments of the present invention, various electrical and mechanical components may be shielded in various ways. For example, a number of components may be soldered or otherwise attached to a board or other substrate. An insulative coating may be formed over the components. A shield may be formed over the insulative coating. An edge of the insulative coating may be partially overlapping a contact on the board, it may be adjacent to the contact, or it may be near the contact such that the shield is electrically connected to the contact. In various embodiments of the present invention, the insulative coating may be a conformal coating, a mold, plastic, film, or other insulating material. The insulative coating may be formed by spraying, printing, such as by ink-jet, 3-D, aerosol-jet, or other type of printing, vapor deposition (chemical or physical), it may be a conformal film with a metal backing, or it may be another type of coating. In various embodiments of the present invention, the insulative coating may be a phase change material that is applied, heated such that it melts, and covered with the metal shield. The shield may be conductive and may be formed by printing, such as by ink-jet, 3-D, aerosol-jet, or other type of printing, by using plating, sputtering, vapor deposition, or other technique.

In these and other embodiments of the present invention, during its formation, the shield may overflow the contact and form undesired electrical connections. Accordingly, an embodiment of the present invention may employ a vertical block or dam. The dam may either be conductive or it may be nonconductive. When nonconductive, it may be coated or plated with a conductive material. The dam may prevent overflow of the shield metal beyond the contact and dam during shield formation. The dam may be formed by depositing a ring of conductive or non-conductive material, or it may be placed as a structural component. The dam may be formed in the same or similar manner as the vertical columns or walls shown herein. The dam may then form an electrical connection from the shield, through the dam (if the dam is conductive) or its coating or plating (if the dam is non-conductive) to the pad or contact on the supporting board or substrate.

In these and other embodiments of the present invention, one or more electrical or mechanical components may be individually shielded. An illustrative embodiment of the present invention may provide a device having one or more electrical components attached on a top side of a printed circuit board or other appropriate substrate. An adhesive layer may be formed over the components and at least a portion of a top surface of the printed circuit board, again by various techniques such as ink-jet-type printing, 3-D printing, aerosol jet printing, or other type of printing, plating, sputtering, vapor deposition, or other technique. A shield may be formed over the components and the adhesive layer by plating, sputtering, vapor deposition, ink-jet-type printing, 3-D printing, aerosol jet printing, or other type of printing or technique, for example by using a cap. This shield may be grounded using side plating or vias. In other embodiments of the present invention, these shields may be spot or laser welded to contacts on a top surface of a printed circuit board or other appropriate substrate.

In these and other embodiments of the present invention a shield may be formed using conductive particles. Specifically, a molding around one or more components may include conductive particles. The conductive particles may be driven to migrate near a top surface of the molding, thereby forming a shield. In various embodiments of the present invention, these conductive particles may be driven or encouraged to migrate using gravity, magnetism, buoyancy, or other appropriate technique. In still other embodiments of the present invention, a layer of molding having an attached conductive film may be used. In still other embodiments of the present invention, a film that has an insulating layer and a conductive layer may be used.

In these and other embodiments of the present invention, instead of attaching components to a top surface of a printed circuit board, one or more components may be located inside a board type structure. This embedded substrate may then be shielded using a top and bottom shield. The top and bottom shields may be connected together by vias that are space apart from each other to form a Faraday cage. These vias may be connected together by one or more rings on one or more layers in the embedded substrate. In other embodiments of the present invention, a top and bottom shields may be connected by edge plating. The top and bottom shields and side plating may be formed by plating, sputtering, vapor deposition printing, such as by ink-jet, 3-D, aerosol-jet, or other type of printing, or other technique.

It should be noted that while the interconnect structures described above are well-suited to forming system-in-a-package modules, in other embodiments of the present invention, other types of electronic devices may be formed using these techniques. Embodiments of the present invention may be used at different levels in the manufacturing of a SIP module. For example, a SIP module may be formed of one or more other sub-modules, and these embodiments of the present invention may be used in one or more of these sub-modules. The SIP module itself may be formed by employing one or more embodiments of the present invention.

In various embodiments of the present invention, contacts, interconnect paths, and other conductive portions of SIP modules may be formed by stamping, metal-injection molding, machining, micro-machining, ink jet, 3-D printing, aerosol jet printing, or other type of printing or manufacturing process. The conductive portions may be formed of stainless steel, steel, copper, copper titanium, aluminum, phosphor bronze, or other material or combination of materials. They may be plated or coated with nickel, gold, or other material. The nonconductive portions may be formed using injection or other molding, ink-jet, 3-D, aerosol-jet, or other type of printing, machining, or other manufacturing process. The nonconductive portions, such as the various overmolded portions, may be formed of silicon or silicone, rubber, hard rubber, plastic, nylon, liquid-crystal polymers (LCPs), plastic, epoxy, resin, or other nonconductive material or combination of materials. The printed circuit board or other appropriate substrates used may be formed of FR-4, BT or other material. Printed circuit boards may be replaced by other substrates, such as flexible circuit boards, in many embodiments of the present invention, while flexible circuit boards may be replaced by printed circuit boards in these and other embodiments of the present invention.

Embodiments of the present invention may provide SIP modules that may be located in various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices.

Various embodiments of the present invention may incorporate one or more of these and the other features described herein. A better understanding of the nature and advantages of the present invention may be gained by reference to the following detailed description and the accompanying drawings.

DESCRIPTION OF EXEMPLARY EMBODIMENTS

Figure 1:
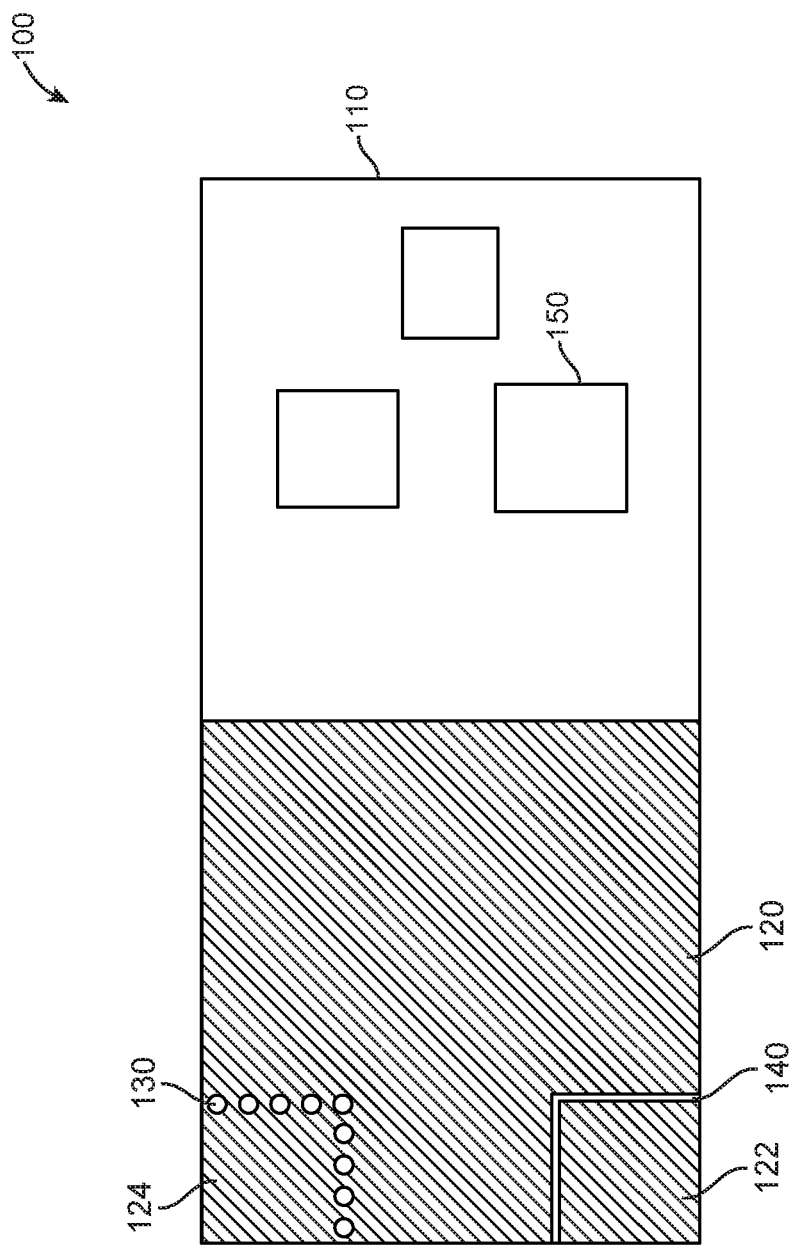
FIG. 1 illustrates a portion of an electronic device including a SIP module according to an embodiment of the present invention.

FIG. 1 illustrates a portion of an electronic device including a system-in-a-package module according to an embodiment of the present invention. This figure, as with the other included figures, is shown for illustrative purposes and does not limit either the possible embodiments of the present invention or the claims.

This figure includes a printed circuit board or other appropriate substrate 110 having a number of electronic circuits, sub-modules, components, or other electrical or mechanical devices 150 on a top surface. An overmold 120 may be formed over one or more other electrical or mechanical components (not shown.) These components may be encapsulated in a plastic, epoxy, resin, or other type of overmold 120.

In these and other embodiments of the present invention, it may be desirable to isolate some components from other components in the module. This may be done using one or more columns (which may also be referred to as posts) or walls. These columns or walls, shown here as columns 130 and walls 140, may be formed of aluminum, steel, copper, or other conductive material. These columns or walls may be formed by stamping, forging, metallic injection molding (MIM), machining, micro-machining, or other manufacturing technique. In still other embodiments of the present invention, these columns or walls may be formed of a conductive adhesive. These conductive adhesive columns or walls may be formed using printing, stenciling, or other appropriate technique. In these and other embodiments of the present invention, columns 130 and walls 140 may be formed in other ways and from other materials. These columns or walls may extend from the surface of substrate 110 to a top of overmold 120 to form electromagnetically isolated areas 122 and 124. Examples are shown in the following figures.

Figure 2:
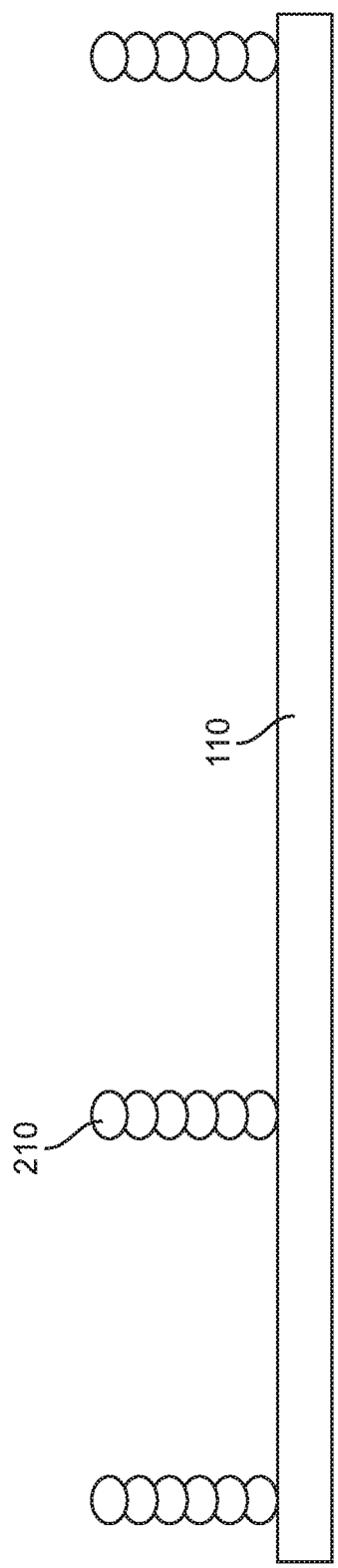
FIG. 2 illustrates a portion of a SIP module according to an embodiment of the present invention.

FIG. 2 illustrates a portion of a SIP module according to an embodiment of the present invention. In this example, vertical shield structure 210 may be formed on a top surface of substrate 110. Vertical shield structure 210 may be a column, such as a column 130, or a wall, such as wall 140 in FIG. 1. Vertical shield structure 210 may be formed as a column by stacking drops (which may instead be referred to as balls) of solder. Vertical shield structure 210 may be formed as a wall by stacking lines of solder. The solder drops or solder lines may be formed by a solder jet. Other vertical shield structure shapes, such as curved segments, may be formed by stacking curved segments or other shapes of solder. Vertical shield structure 210 may be formed before or after a number of electronic circuits or components (not shown) are attached to the top surface of substrate 110. The electronic circuits or components and vertical shield structure 210 may be overmolded with an overmold layer (not shown). Shallow trenches (not shown) may be cut in the overmold above vertical shield structure 210. This may allow a shield (not shown) formed along a top surface of the overmold to form an electrical connection with vertical shield structure 210. An example is shown in the following figure.

Figure 3:
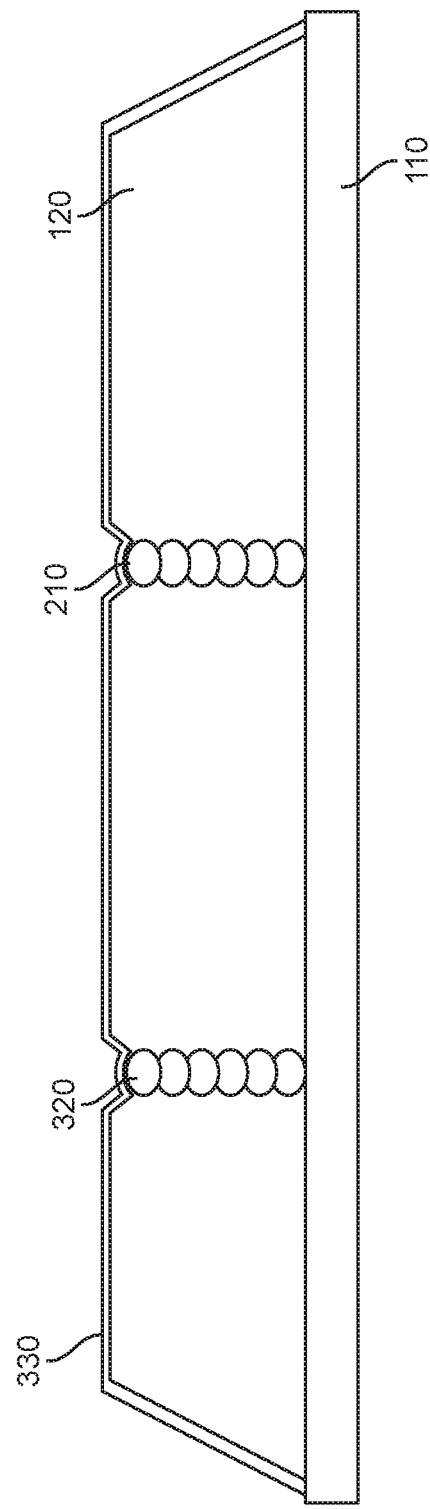
FIG. 3 illustrates a portion of a SIP module according to an embodiment of the present invention.

FIG. 3 illustrates a portion of a SIP module according to an embodiment of the present invention. Again, one or more electronic circuits or components (not shown) may be placed on a top surface of printed circuit board or other appropriate substrate 110. Vertical shield structure 210 may be formed, again from stacking drops, lines, curves, or other shapes of solder or sinter. Overmold 120 may cover the electronic circuits or components. Shallow trenches 320 may be cut in a top surface of overmold 120, thereby exposing a top of vertical shield structure 210. Trenches 320 may be formed by laser or chemical etching or other process. Shield 330 may be formed over the top surface overmold 120. Shield 330 may be conductive and may be formed by printing, such as by ink-jet, 3-D, aerosol-jet, or other type of printing, by using plating, sputtering, vapor deposition (chemical or physical), or other technique. Shield 330 may electrically connect to vertical shield structure 210. Vertical shield structure 210 may further electrically connect to a ground plane or trace of substrate 110, thereby providing a degree of electromagnetic isolation between two or more circuits in the SIP module. While this example is shown with vertical shield structure 210, in these and other embodiments of the present invention, this processing may be done with SIP modules using the other vertical shield structures shown herein or provided for by embodiments of the present invention.

Figure 4:
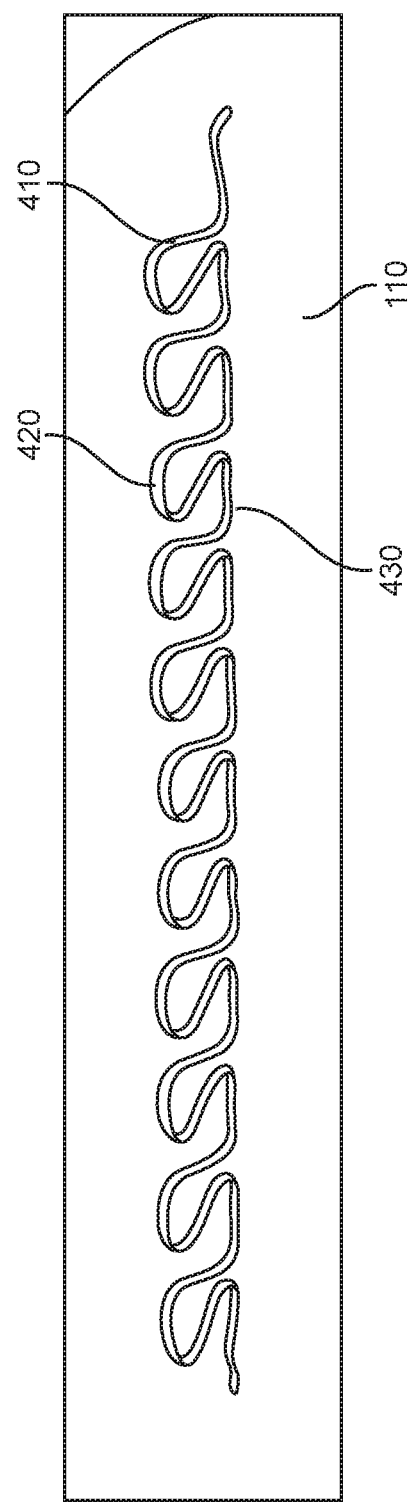
FIG. 4 illustrates a portion of a SIP module according to an embodiment of the present invention.

FIG. 4 illustrates a portion of a SIP module according to an embodiment of the present invention. In this example, wire bond for 10 may be stitched along the top surface of substrate 110 to form a vertical shield structure, such as wall 140 in FIG. 1. Wire bond 410 may have bottom loop portions 430 that may electrically contact ground pads or traces on substrate 110. Wire bond 410 may further include top loop portions 420. Top loop portions 420 may be exposed in a shallow trench in an overmold region and connected to a shield (not shown) in a manner consistent with the example shown in FIG. 3.

Figure 5:
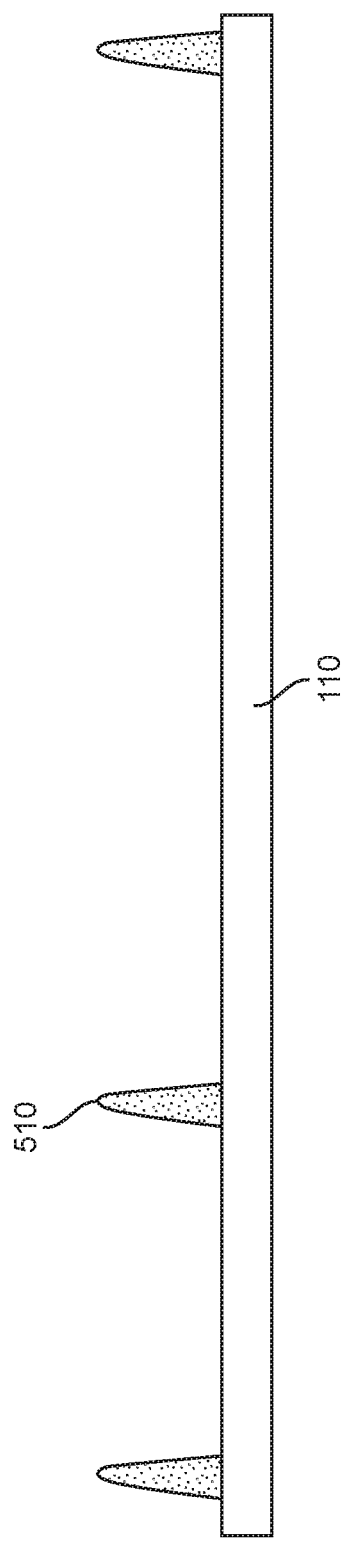
FIG. 5 illustrates a portion of a SIP module according to an embodiment of the present invention.

FIG. 5 illustrates a portion of a SIP module according to an embodiment of the present invention. In this example, vertical shield structures 510 may be formed on a top surface of substrate 110. Vertical shield structure 510 may be used to form columns or walls such as column 130 and walls 140 in FIG. 1. Vertical shield structures 510 may be formed by sintering. Successive, lines, squares, circles, or other patterned areas may be successively built up with sintered layers to form vertical shield structure 510. Vertical shield structure 510 may be formed as a column by stacking drops of sinter or sintering material. Vertical shield structure 510 may be formed as a wall by stacking lines of sinter or sintering material. Other vertical shield structure shapes, such as curved segments, may be formed by stacking curved segments or other shapes of sinter or sintering material. As before, one or more electronic circuits or components may be placed on a top surface of the substrate 110 either before or after the sintering process takes place. An overmold (not shown) may be formed over the vertical shield structures 510 and electronic circuits or components, as shown in FIG. 3. Shallow trenches may be formed in a top surface of the overmold, again as shown in FIG. 3. A shield may be applied over the top surface of the overmold, again as shown in FIG. 3.

In these and the other embodiments of the present invention, the sinter or sintering material may be copper-tin, or other tin based or other type of sinter or sintering material. The sintering process used may be a transient liquid-phase sintering or other type of sintering.

In these and other embodiments of the present invention, these sintered vertical structures may be employed in different ways. Examples are shown in the following figures.

Figure 6:
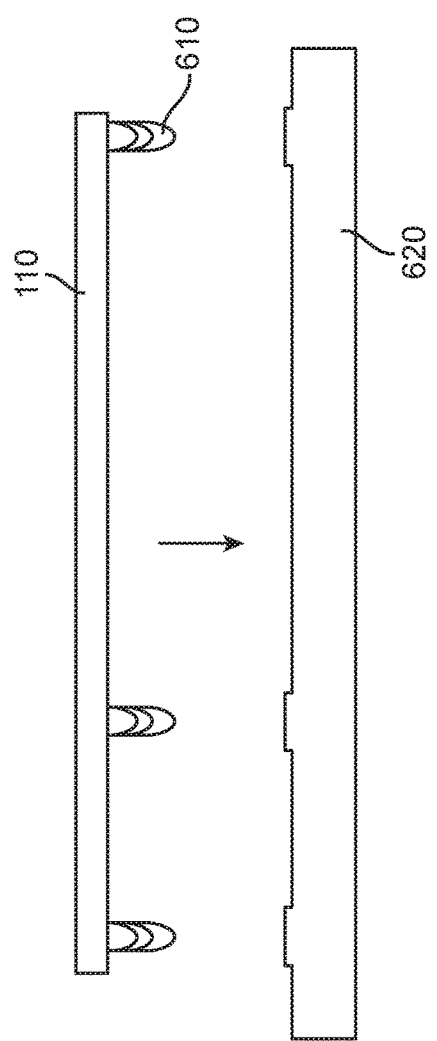
FIG. 6 illustrates a step in the manufacturing of a SIP module according to an embodiment of the present invention.

FIG. 6 illustrates a step in the manufacturing of a SIP module according to an embodiment of the present invention. In this example, vertical shield structure 610 may be formed on a top surface of substrate 110. Substrate 110 may then be flipped over and used as a cover over substrate 620. Vertical shield structures may be dipped in solder paste before being attached to substrate 620. One or more electronic circuits or components (not shown) may be attached to a top surface of substrate 640. Some of these various electronic circuits or components may be shielded from each other by vertical shield structures 610.

These soldered or sintered vertical structures may be utilized to save space in a SIP module. An example is shown in the following figure.

Figure 7:
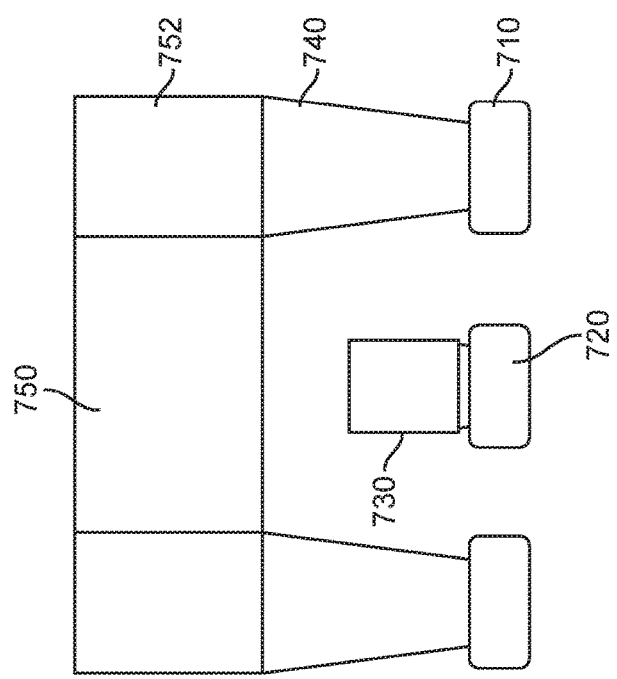
FIG. 7 illustrates a stacked electrical component structure consistent with an embodiment of the present invention.

FIG. 7 illustrates a stacked electrical component structure consistent with an embodiment of the present invention. In this example, a first electronic component 730 may be electrically connected to contact 720 on a printed circuit board or other appropriate substrate (not shown). Vertical interconnect structures 740 may be formed on contacts 710 on the substrate. Vertical interconnect structures 740 may be formed in the same or similar manner as the vertical shield structures herein. For example, vertical interconnect structures 740 may be formed by stacking solder or sinter in balls, lines, or other configuration as shown in FIGS. 2, 3, and 5 above. Vertical interconnect structures may also be formed as vertical interconnect structures 1920 in FIG. 19, or as walls or posts 2850 in FIG. 28. A second electronic component 750 may include contacts 752, which may be electrically connected to vertical interconnect structures 740. In this way, first electrical component 730 may be directly below second electrical component 750 and between second electrical component 750 and the substrate. This may save space by utilizing an area under second electrical component 750 that would otherwise be unused. First electronic component 730 and second electronic component 750 may be capacitors, resistors, inductors, transformers, or other types of components or a mix of types of components.

In these and other embodiments of the present invention, electronic components may be stacked directly on top of each other in various ways. Examples are shown in the following figures.

Figure 8:
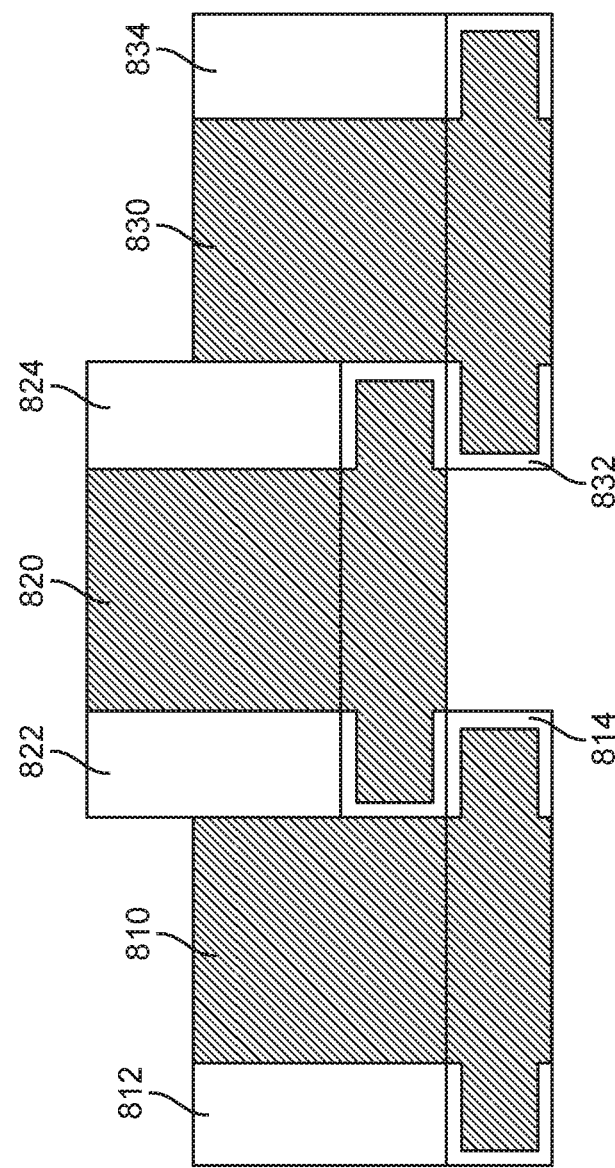
FIG. 8 illustrates a stacked capacitor structure according to an embodiment of the present invention.

FIG. 8 illustrates a stacked capacitor structure according to an embodiment of the present invention. The stacked capacitor structure may include capacitor 810, capacitor 820, and capacitor 830. Capacitor 810 may include contacts 812 and 814. Contacts 812 and 814 may be connected to contacts on a printed circuit board or other substrate (not shown). Similarly, contacts 832 and 834 of capacitor 830 may be connected to contacts on a printed circuit board or other substrate. Contact 822 of capacitor 820 may be connected to contact 814 of capacitor 810. Similarly, contact 824 of capacitor 820 may be connected to contact 832 of capacitor 830.

In various embodiments of the present invention, these capacitors may be connected to each other and to contacts on a printed circuit board in various ways. For example, one or more of the capacitor contacts may be connected by soldering. In these and other embodiments of the present invention, one or more of these contacts may be sintered. For example, contact 822 of capacitor 820 may be sintered to contact 814 of capacitor 810, and contact 824 of capacitor 820 may be sintered to contact 832 of capacitor 830. Similarly, contacts on capacitors 810 and 830 may be sintered to corresponding contacts on the printed circuit board. This sintering may provide a stacked capacitor structure that may remain intact during subsequent high-temperature processing steps. Examples of methods of manufacturing stacked capacitors are shown in the following figures.

Figure 9:
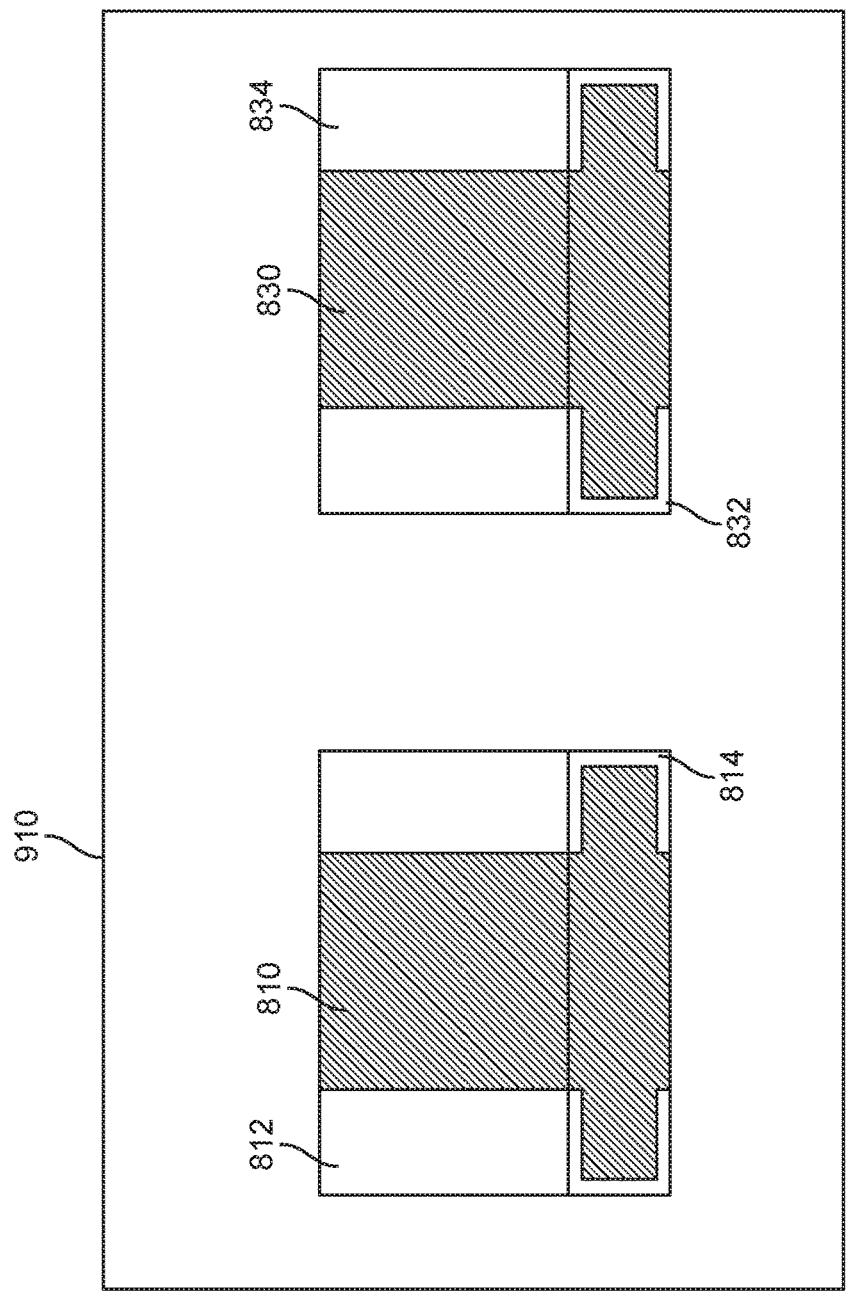
FIGS. 9-11 illustrate a method of manufacturing a stacked capacitor structure according to an embodiment of the present invention.
Figure 10:
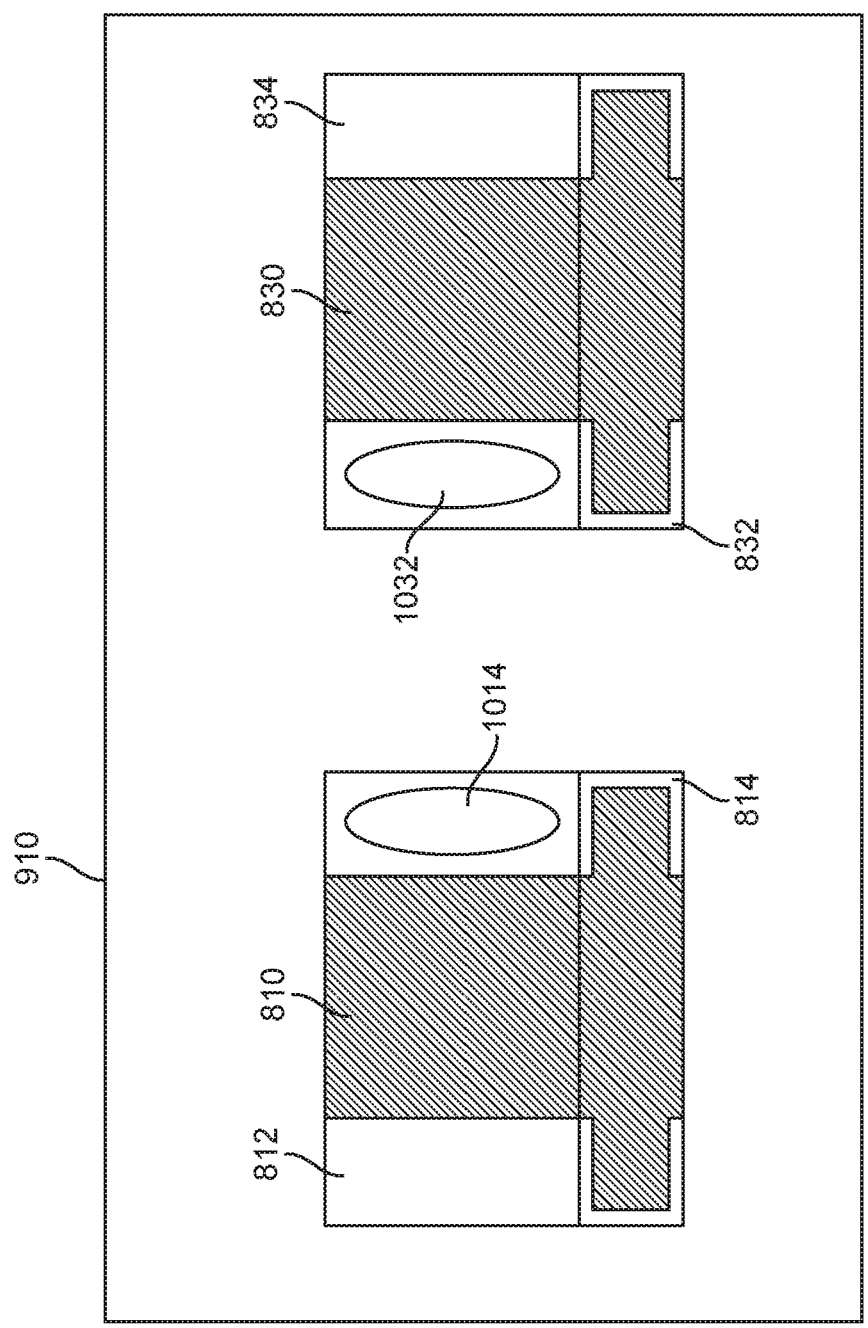
Figure 11:
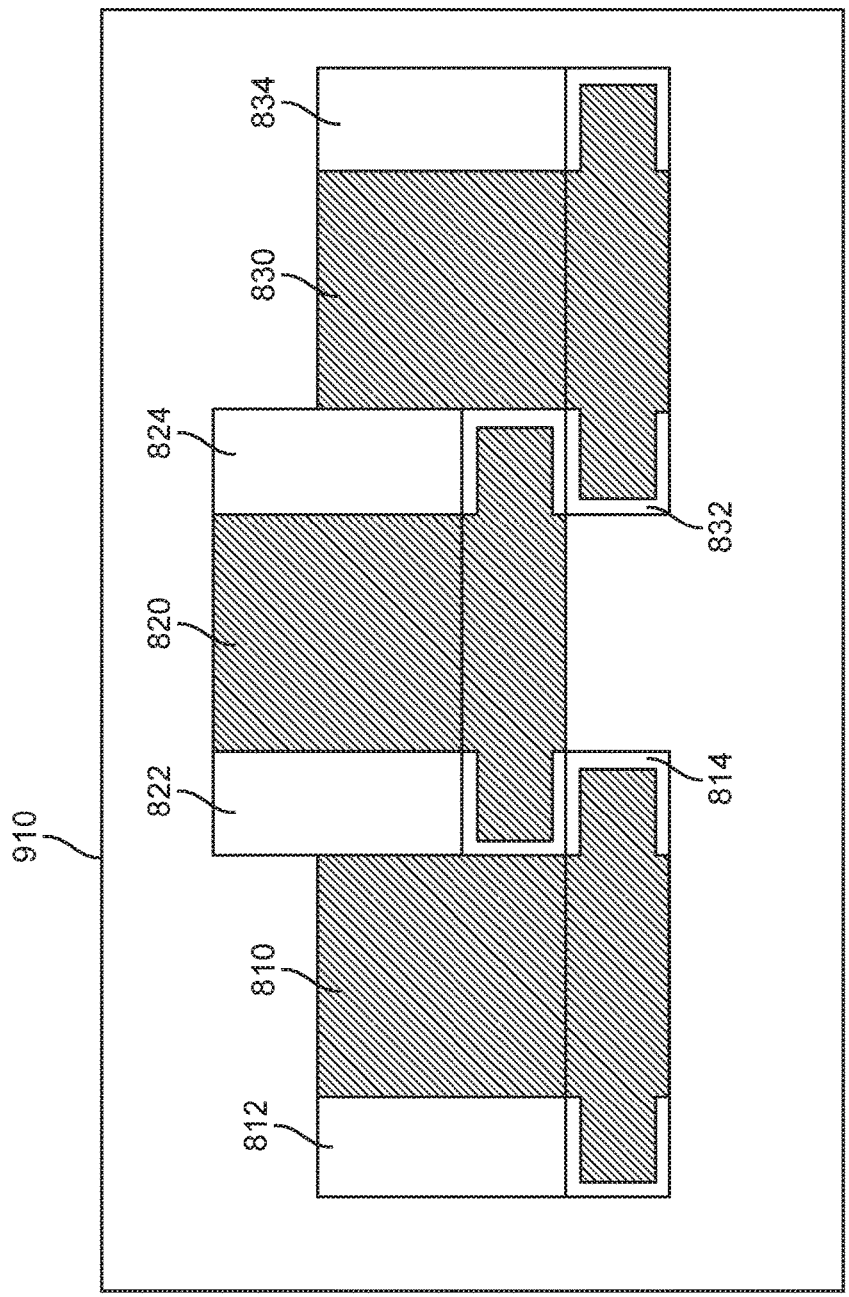

FIGS. 9-11 illustrate a method of manufacturing a stacked capacitor structure according to an embodiment of the present invention. In FIG. 9, capacitors 810 and 830 may be placed on a layer of high-temperature tacky tape 910. These capacitors may be placed using a pick-and-place machine or other appropriate machine or method. In FIG. 10, sintered region 1014 may be formed on contact 814 of capacitor 810. This may be done using screen-printing, ink jet, or 3-D printing, aerosol jet printing, stenciling or other type of printing or manufacturing process. Similarly, sintered region 1032 may be formed on contact 832 of capacitor 830. In these and other embodiments of the present invention, regions 1014 and 1032 may be soldered regions, again formed using screen-printing, ink jet, or 3-D printing, aerosol-jet printing, stenciling or other type of printing or manufacturing process. In FIG. 11, capacitor 820 may be placed on contacts 814 and 832 such that contact 822 of capacitor 820 connects to contact 814 of capacitor 810 and contact 824 of capacitor 820 connects to contact 832 of capacitor 830. Capacitor 820 may be placed on capacitors 810 and 830 using a pick-and-place machine or other appropriate machine or method. The stacked capacitor structure may then be heated to reflow temperatures such that the sintered regions 1014 and 1032 join the stacked capacitors together. The completed stacked capacitor structure may then be removed from the tacky tape 910, again by using a pick-and-place machine or other machine or method.

This method may be useful where a stack of capacitors may be formed and moved as a module. In other embodiments of the present invention, these stacked capacitor structures may be formed on a printed circuit board or other appropriate substrate. An example is shown in the following figure.

Figure 12:
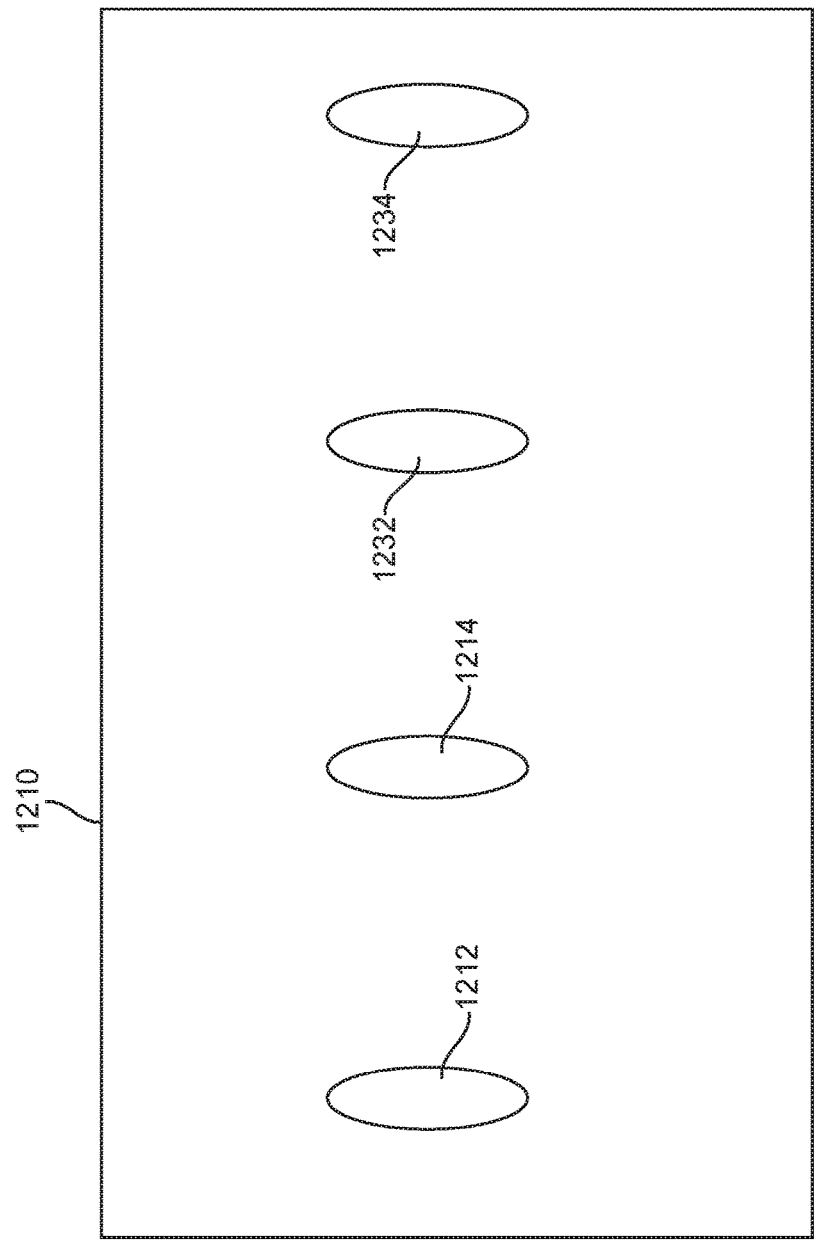
FIGS. 12-15 illustrate a method of manufacturing a stacked capacitor structure on a printed circuit board according to an embodiment of the present invention.
Figure 13:
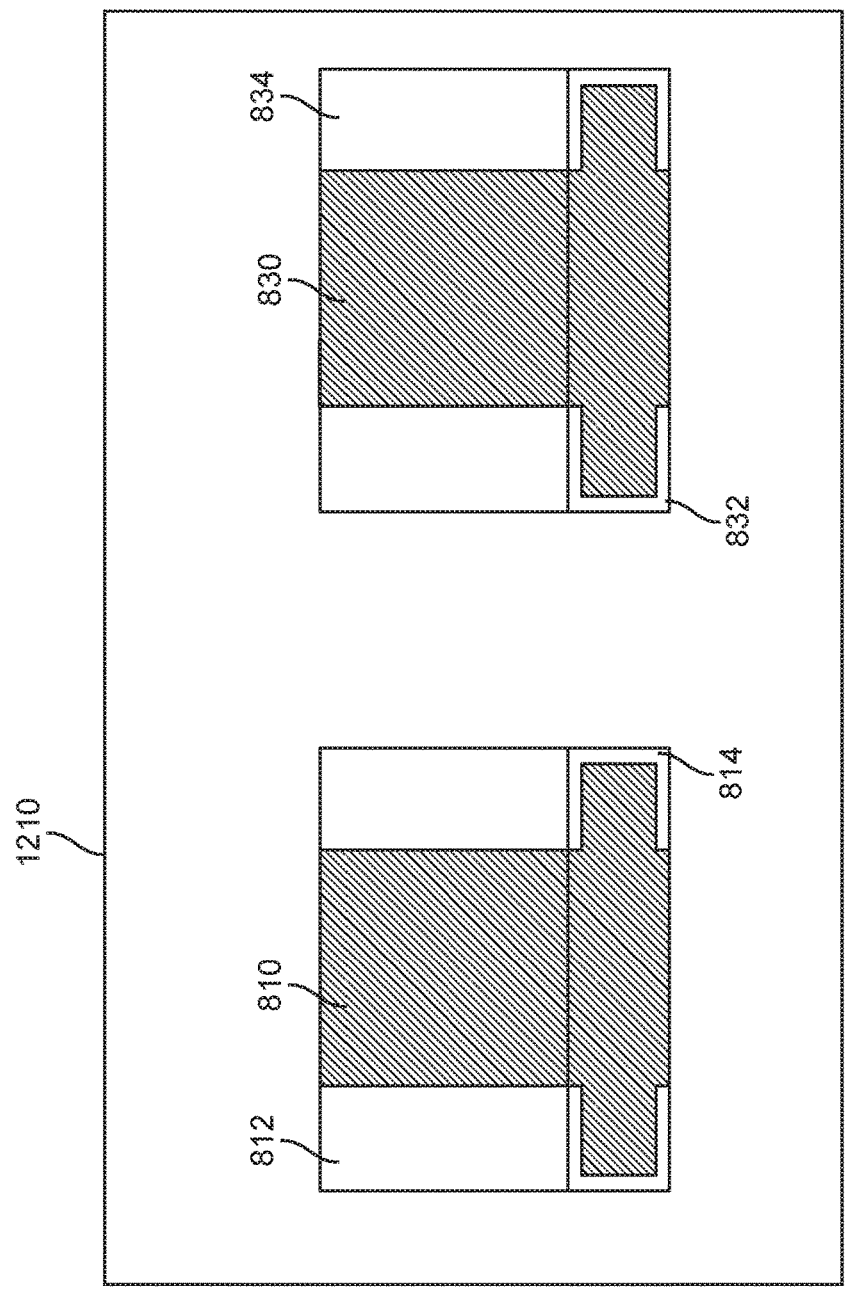
Figure 14:
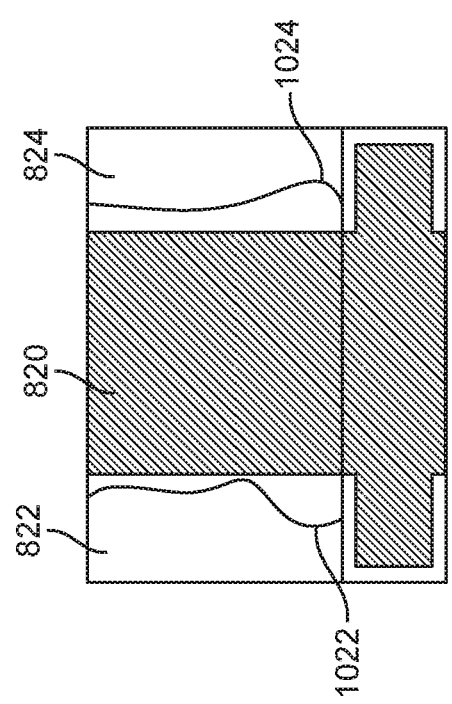
Figure 15:
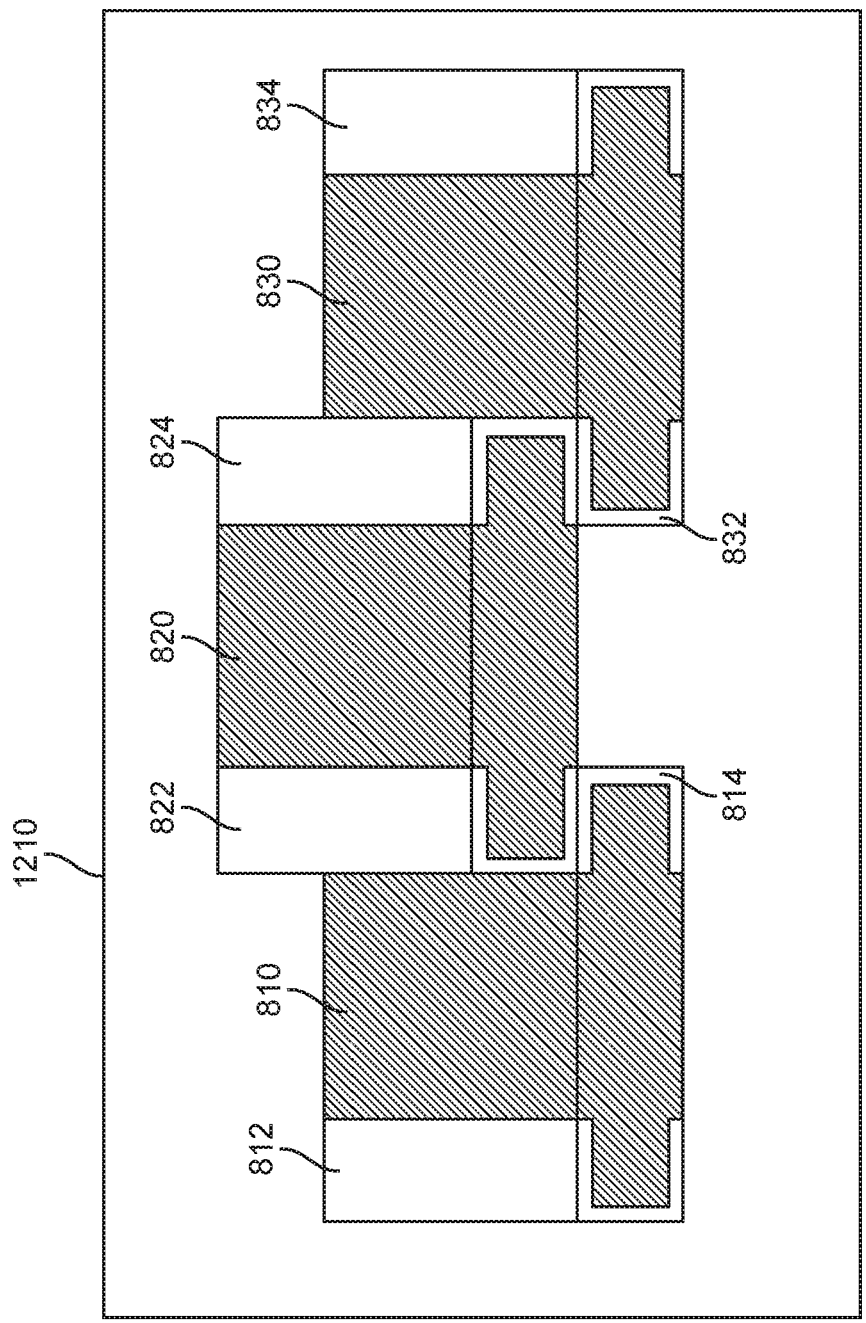

FIGS. 12-15 illustrate a method of manufacturing a stacked capacitor structure on a printed circuit board according to an embodiment of the present invention. In FIG. 12, regions of solder or sinter may be formed on printed circuit board 1210. For example, regions 1212, 1214, 1232, and 1234 may be formed of tin-silver-copper (SAC) solder or other solder or sinter material. This may be done using screen-printing, ink jet, or 3-D printing, aerosol jet printing, stenciling or other type of printing or manufacturing process. In FIG. 13, capacitors 810 and 830 may be placed using a pick-and-place machine or other appropriate machine or method onto printed circuit board 1210. Contacts 812 and 814 of capacitor 810 may be aligned with regions 1212 and 1214, while contacts 832 and 834 of capacitor 830 may be aligned with regions 1232 and 1234. In FIG. 14, capacitor 820 may be dipped in solder paste or other solder of sinter material to form solder paste regions 1022 on contact 822 and region 1024 on contact 824. In FIG. 15, capacitor 820 may be placed on contacts 814 and 832 such that contact 822 of capacitor 820 connects to contact 814 of capacitor 810 and contact 824 of capacitor 820 connects to contact 832 of capacitor 830. Capacitor 820 may be placed using a pick-and-place machine or other appropriate machine or method. A reflow step may be used to solder capacitors 810 and 830 to printed circuit board 1210 and capacitor 820 to capacitors 810 and 830.

These and other methods consistent with embodiments of the present invention may be used to form these various stacked capacitor structures shown here as well as other stacked capacitor structures in other configurations. For example, the vertical interconnect structures shown above in FIG. 7 and the other above figures may be used to form stacked capacitor structures. For example, one or more capacitors, such as capacitor 820, may be stacked above other capacitors, such as capacitors 810 and 830 through vertical interconnect structures such as vertical interconnect structures 740. These and similar techniques may be applied to the other stacked capacitors structures shown here and provided by embodiments of the present invention.

These and the other examples shown below may be well-suited to forming stacked capacitor structures. In other embodiments of the present invention, one or more of the capacitors may be replaced by another component such as a resistor, inductor, transformer, or other type of active or passive component. Also, while 3 or 4 capacitors are shown in each example, in other embodiments of the present invention, other numbers of capacitors may be used and various numbers of capacitors may be stacked on various numbers of capacitors in various configurations.

Figure 16:
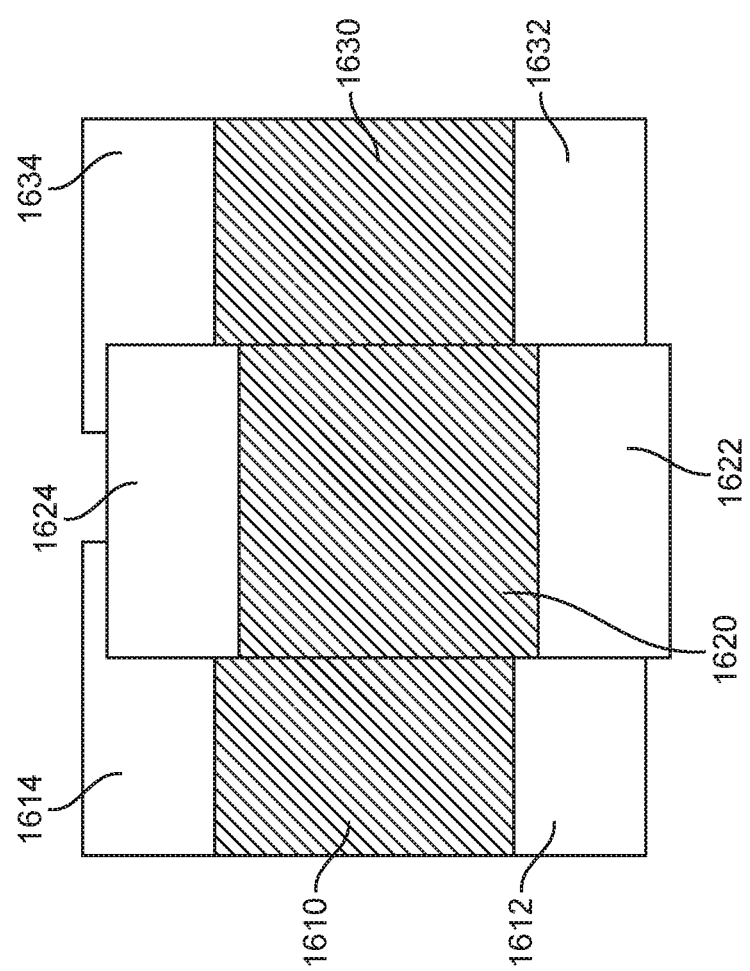
FIG. 16 illustrates another stacked capacitor structure according to an embodiment of the present invention.

FIG. 16 illustrates another stacked capacitor structure according to an embodiment of the present invention. This stacked capacitor structure may include capacitor 1610, capacitor 1620, and capacitor 1630. Contacts 1614 and 1612 of capacitor 1610 and contacts 1634 and 1632 of the capacitor 1630 may be connected to contacts on a surface of a printed circuit board or other appropriate substrate (not shown). Capacitor 1620 may include contact 1624 and 1622. Contact 1624 of capacitor 1620 may be connected to contact 1614 of capacitor 1610 and contact 1634 of capacitor 1630. Similarly, contact 1622 of capacitor 1620 may be connected to contact 1612 of capacitor 1610 and contact 1632 of capacitor 1630. Again, in these and other embodiments of the present invention, one or more of the capacitors shown may be replaced by another component, such as a resistor, inductor, transformer, or other type of component. Also, one or more of these connections may be sintered. This sintering may provide a stacked capacitor structure that may remain intact during subsequent high-temperature processing steps.

Figure 17:
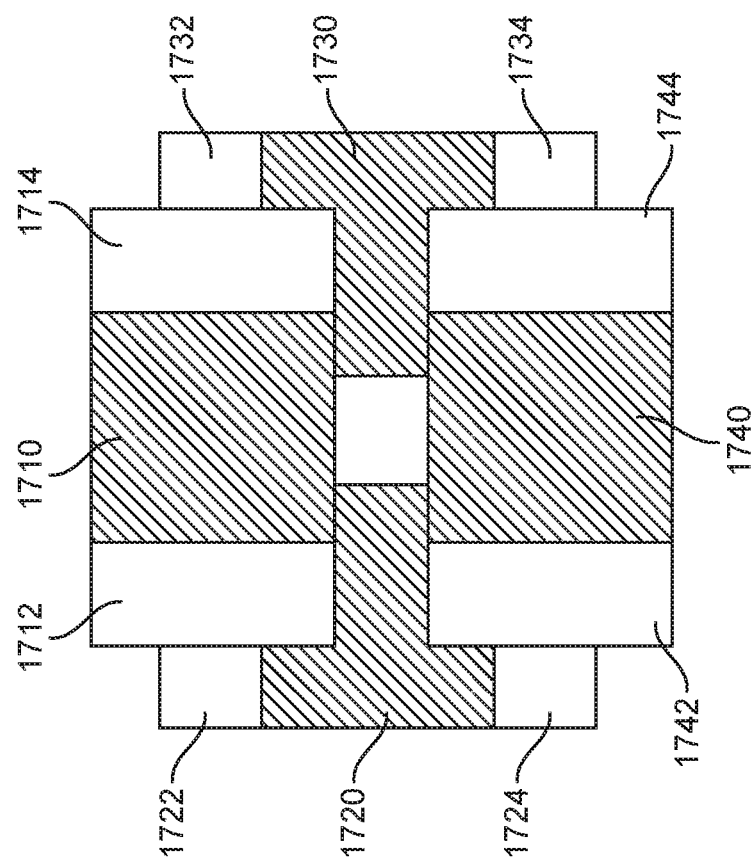
FIG. 17 illustrates another stacked capacitor structure according to an embodiment of the present invention.

FIG. 17 illustrates another stacked capacitor structure according to an embodiment of the present invention. This stacked capacitor structure may include capacitor 1710, capacitor 1720, capacitor 1730, and capacitor 1740. Contacts 1722 and 1724 of capacitor 1720 and contacts 1732 and 1734 of capacitor 1730 may be connected to contacts on a surface of a printed circuit board or other appropriate substrate (not shown.) Contact 1712 of capacitor 1710 may connect to contact 1722 of capacitor 1720. Similarly, contact 1714 of capacitor 1710 may connect to contact 1732 of capacitor 1730. Contact 1744 of capacitor 1740 may connect to contact 1734 of capacitor 1730. Contact 1742 of capacitor 1740 may connect to contact 1724 of capacitor 1720. Again, in these and other embodiments of the present invention, one or more of the capacitors shown may be replaced by another type of component, such as a resistor, electric, transformer, or other type of component. Also, one or more of these connections may be sintered. This sintering may provide a stacked capacitor structure that may remain intact during subsequent high-temperature processing steps.

Figure 18:
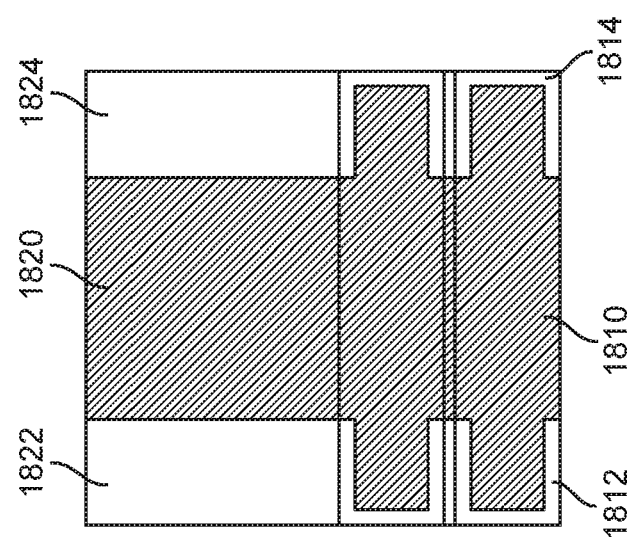
FIG. 18 illustrates another stacked capacitor structure according to an embodiment of the present invention.

FIG. 18 illustrates another stacked capacitor structure according to an embodiment of the present invention. In this example, capacitor 1820 may be placed on top of capacitor 1810. Contact 1822 of capacitor 1820 may be connected to capacitor 1812 of capacitor 1810, while contact 1824 of capacitor 1820 may be connected to capacitor 1814 of capacitor 1810.

Figure 19:
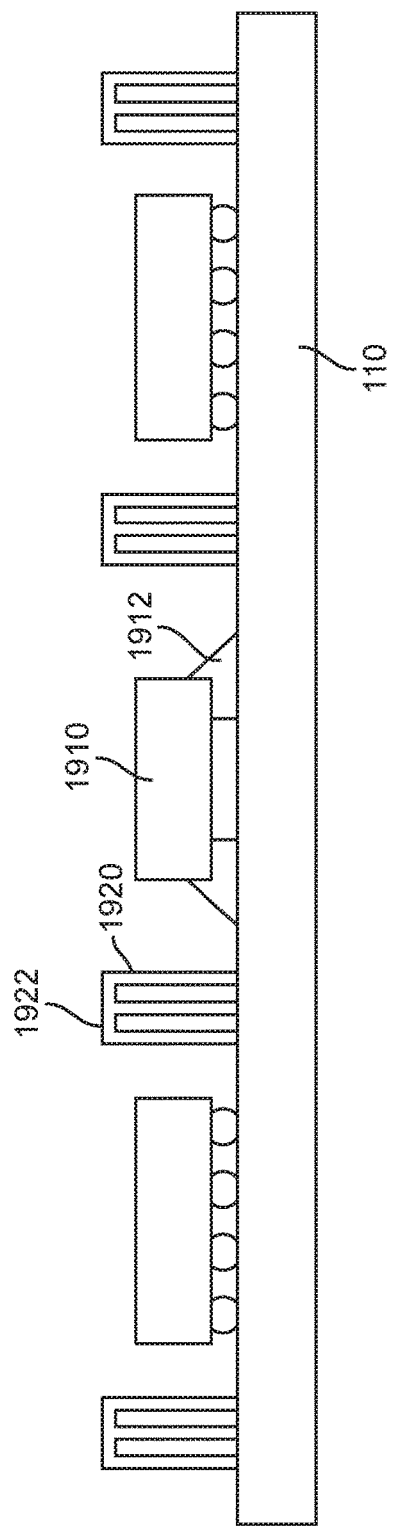
FIGS. 19-22 illustrates a method of manufacturing a SIP module according to an embodiment of the present invention.

FIGS. 19-22 illustrates a method of manufacturing a SIP module according to an embodiment of the present invention. In FIG. 19, a number of electronic circuits or components 1910 may be connected to printed circuit board or other appropriate substrate 110. Electronic circuits or components 1910 may be connected to printed circuit board 110 using solder, sintering, or other appropriate step. Vertical interconnect structures 1920 may be soldered or sintered or otherwise attached to a top surface of printed circuit board or other appropriate substrate 110. Vertical interconnect structures 1920 may be electrically connected to traces or planes of printed circuit board or other appropriate substrate 110. Vertical interconnect structures 1920 may be stamped metal, such as stainless steel, and joined by carriers 1922. Carriers 1922 may aid in the manipulation of vertical interconnect structures 1920. In these and other embodiments of the present invention, columns 130 and walls 140 may be included in this structure as well and may be formed as the columns 130 and walls 140 shown above.

Figure 20:
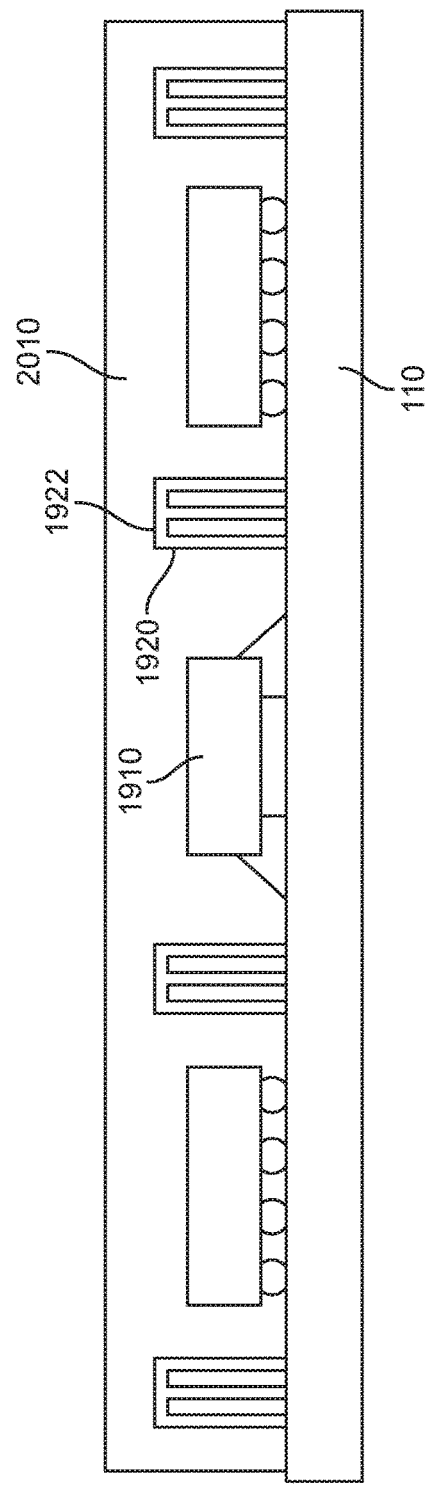

In FIG. 20, an overmold 2010 may cover the one or more electronic circuits or components 1910 and interconnect structures 1920, including carriers 1922. This overmold 2010, as with the other overmold regions in embodiments of the present invention shown here and in other embodiments of the present invention, may be formed of plastic, resin, epoxy, or other material.

Figure 21:
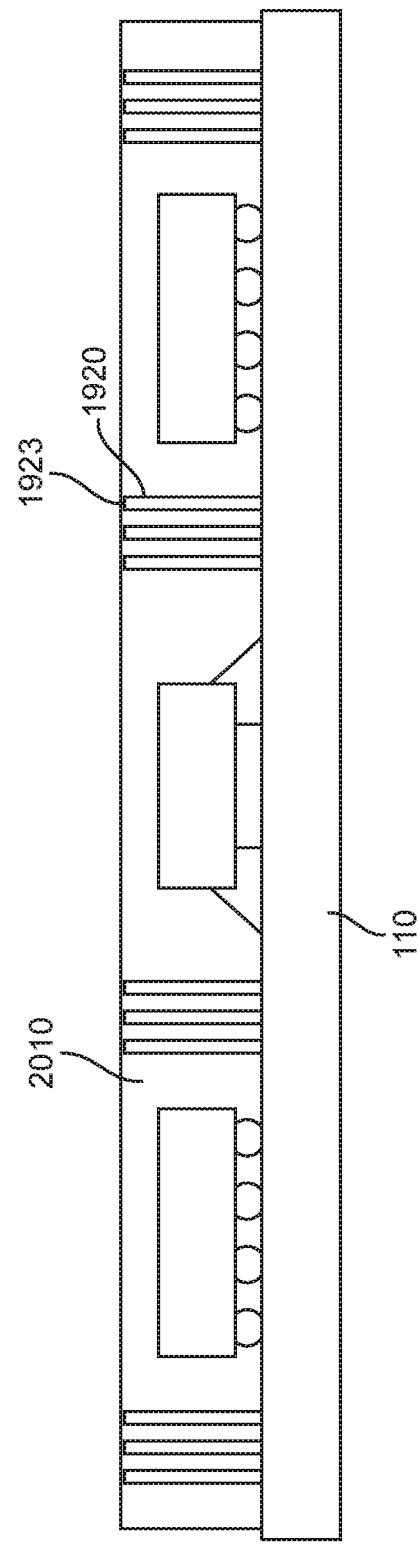

In FIG. 21, a top portion of overmold 2010 may be removed. This removal may be done by grinding, etching, or other process. Carriers 1922 may be removed during this step. This may leave tops 1923 of vertical interconnect structures 1920 exposed at a top surface of overmold 2010. The tops 1923 of vertical interconnect structures 1920 may be covered with a conductive paste or other appropriate material.

Figure 22:
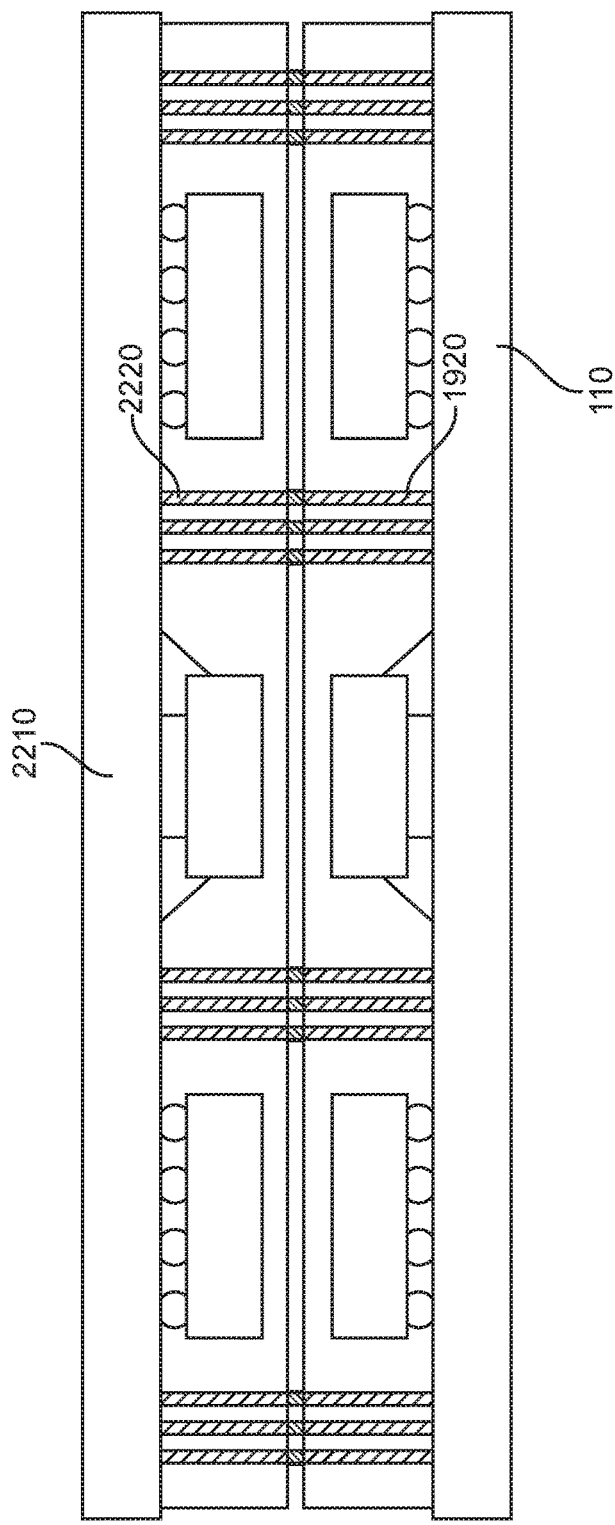

In FIG. 22, a second substrate 1210 and its vertical interconnect structures 2220 may be attached in an inverted manner along a top side the structure including substrate 110 and its vertical interconnect structures 1920. Vertical interconnect structures 1920 may be electrically connected to vertical interconnect structures 2220. Vertical interconnect structures 2220 may be electrically connected to traces or planes of second substrate 2210. In these and other embodiments of the present invention, instead of a second substrate 2210, a flexible circuit board may be attached to a top of substrate structure 110

In various embodiments of the present invention, various modifications to the above structure may be made. Examples are shown in the following figures.

Figure 23:
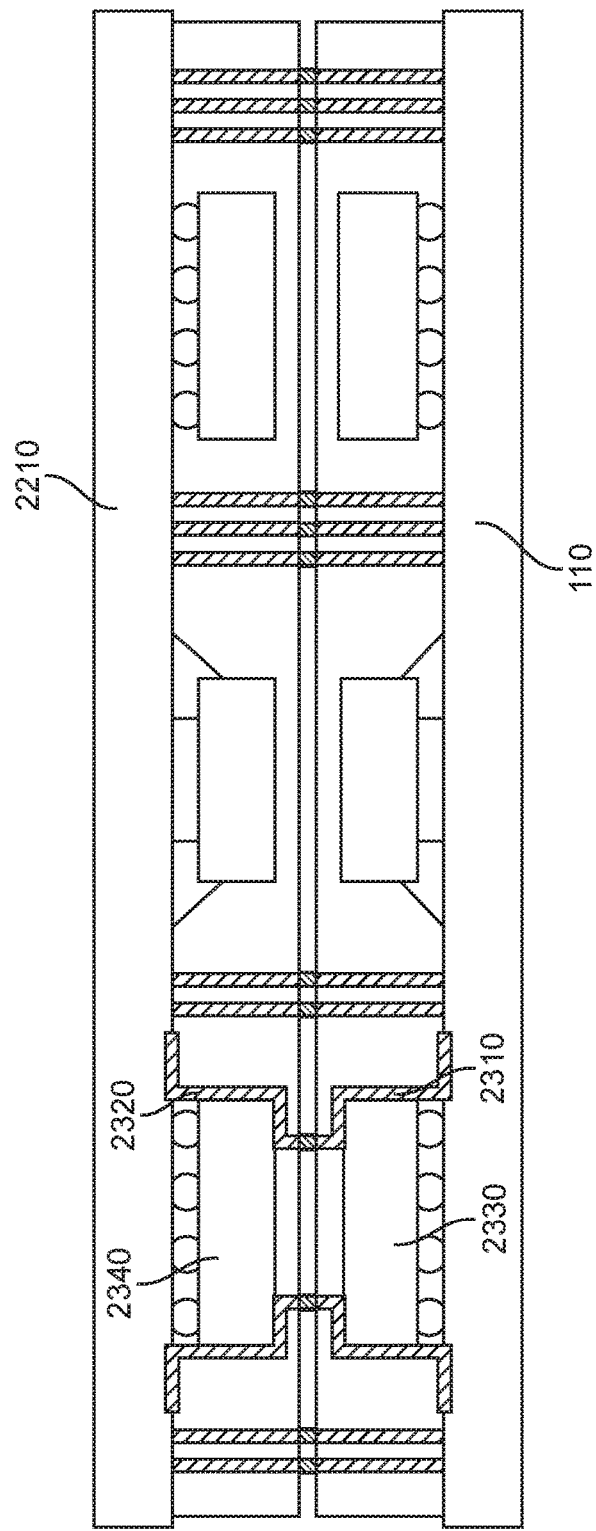
FIG. 23 illustrates another SIP module according to an embodiment of the present invention.

FIG. 23 illustrates another SIP module according to an embodiment of the present invention. In this example, interconnect traces 2310 and 2320 may be formed and placed along sides of components 2330 and 2340.

Figure 24:
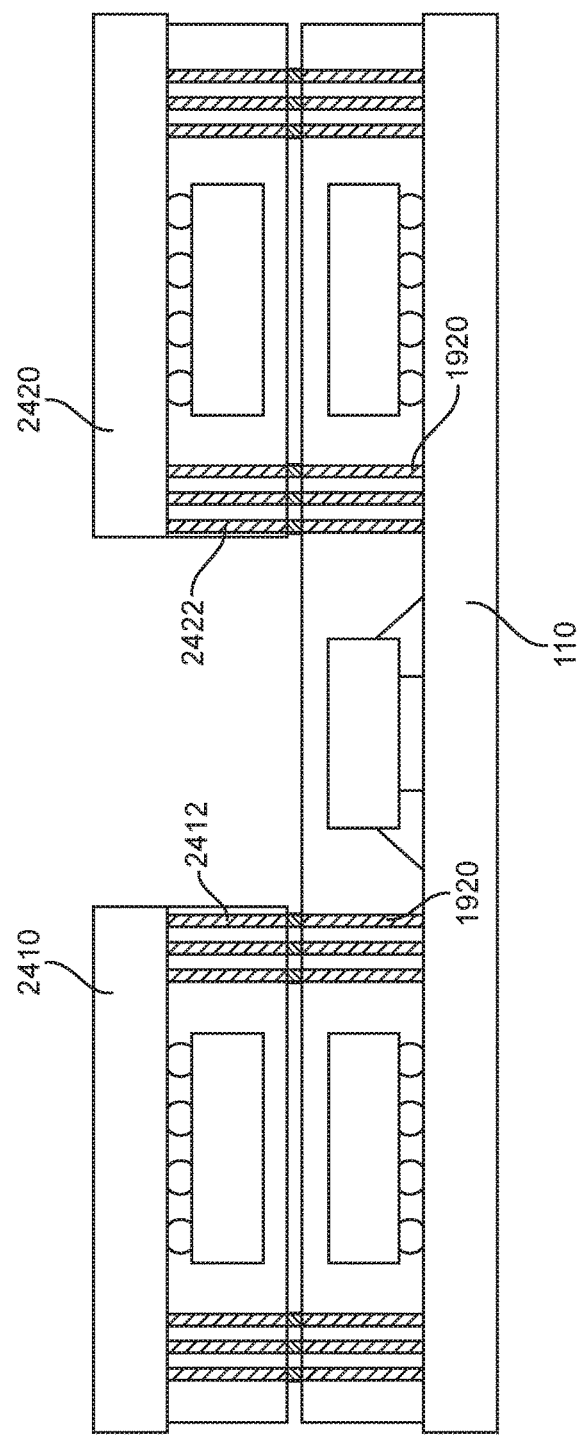
FIG. 24 illustrates another SIP module according to an embodiment of the present invention.

FIG. 24 illustrates another SIP module according to an embodiment of the present invention. In this example, a second substrate 2410 and a third substrate 2420 may be attached over substrate 110. Vertical interconnect structures 1920 may electrically connect to vertical interconnect structures 2412 and 2422. Again, these vertical interconnect structures may electrically connect to traces or pads on the respective substrates.

While in the above examples, vertical interconnect structures are shown as extending from a top surface of a substrate to a top surface of an overmold, and other embodiments of the present invention, these vertical interconnect structures may extend from one or more electronic circuits or components or other structures in or associated with their respective SIP modules.

Figure 25:
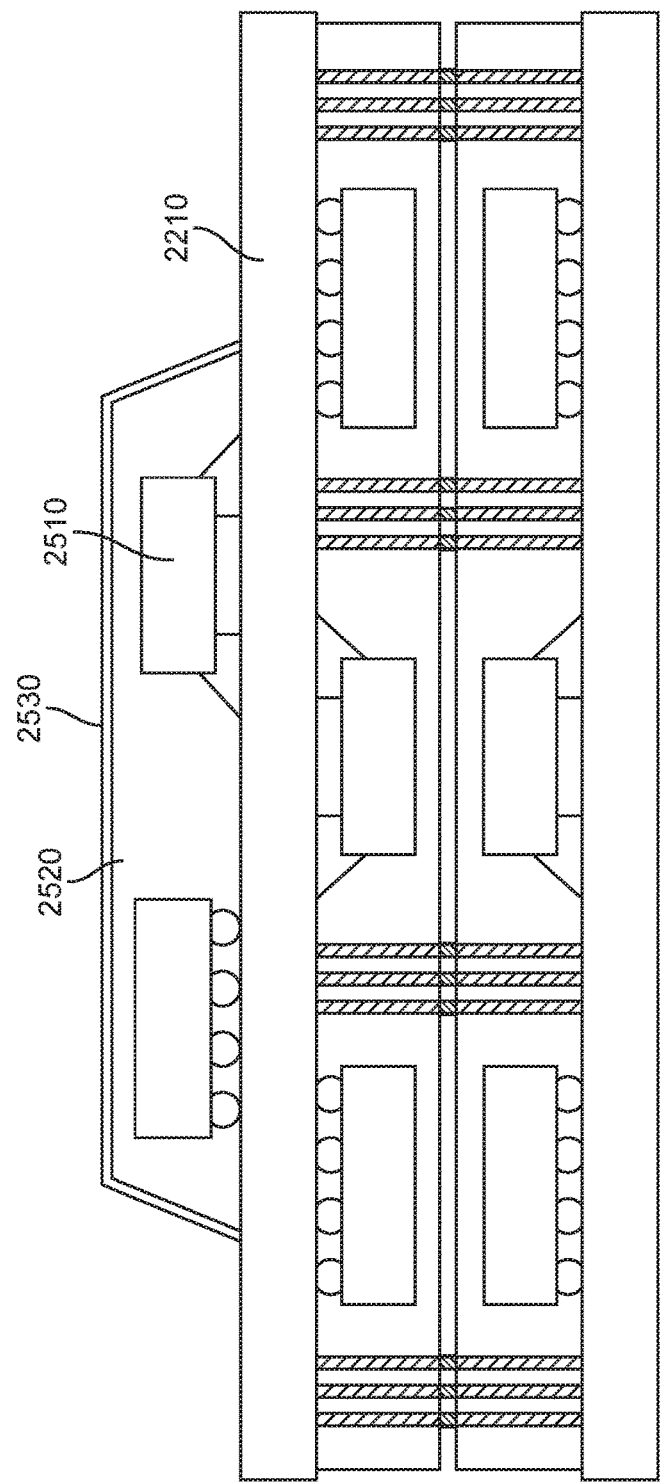
FIG. 25 illustrates another SIP module according to an embodiment of the present invention

FIG. 25 illustrates another SIP module according to an embodiment of the present invention. In this example, a bottom side of substrate 2210 may be used to connect to one or more electronic circuits or components 2510. An overmold 2520 may be shielded by shield 2530. Shield 2530 may be replaced by a cover in various embodiments of the present invention, and overmold 2520 may be omitted.

In these and other embodiments of the present invention, various electrical and mechanical components may be shielded in various ways. Examples are shown in the following figures.

Figure 26:
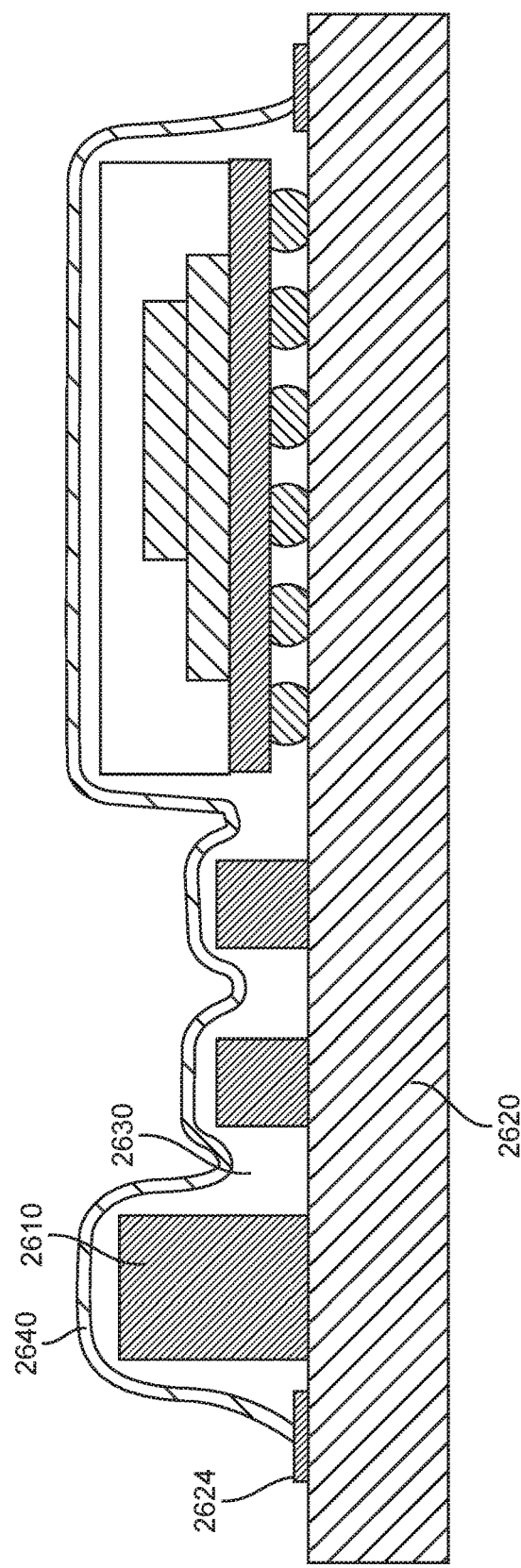
FIGS. 26 and 27 illustrate portions of a SIP module according to an embodiment of the present invention.
Figure 27:
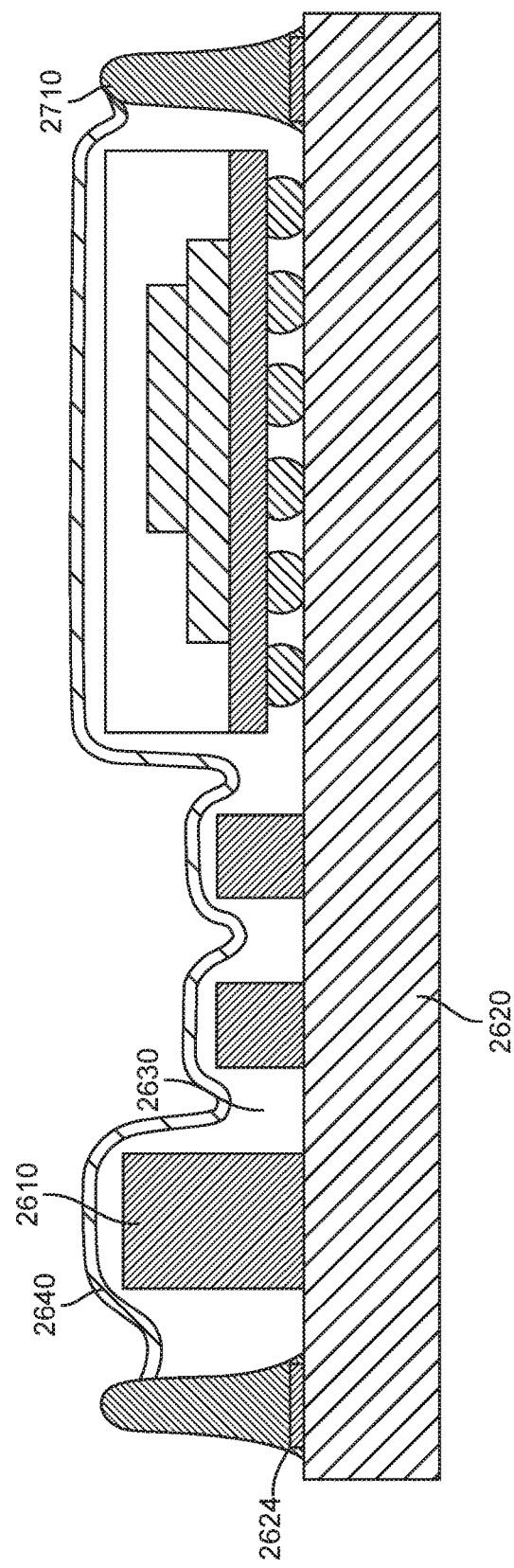

FIGS. 26 and 27 illustrate portions of SIP modules according to an embodiment of the present invention. In FIG. 26, a number of components 2610 may be soldered or otherwise attached to a board or other substrate 2620. An insulative coating 2630 may be formed over components 2610. A metal shield 2640 may be formed over insulative coating 2630. An edge of coating 2630 may be partially overlapping a contact 2624 on board 2620, it may be adjacent to contact 2624, or it may be near contact 2624 such that metal shield 2640 is electrically connected to contact 2624. In various embodiments of the present invention, insulative coating 2630 may be a conformal coating, a mold, plastic, film, or other insulating material. The insulative coating 2630 may be formed by spraying, ink-jet, 3-D, aerosol-jet, or other type of printing, vapor deposition (chemical or physical), it may be a conformal film with a metal backing, or it may be another type of coating. In various embodiments of the present invention, insulative coating 2630 may be a phase change material that is applied, heated such that it melts, and covered with metal shield 2640. Metal shield 2640 may be formed using plating, sputtering, ink-jet, 3-D, aerosol-jet, or other type of printing, vapor deposition (as with the other shields herein, it may be chemical or physical vapor deposition), or other technique.

In this embodiment, during its formation, metalized shield 2640 may overflow contact 2624 and form undesired electrical connections. Accordingly, an embodiment of the present invention may employ a vertical block or dam 2710, as shown in FIG. 27. Dam 2710 may either be conductive or it may be nonconductive and coated with a conductive material. Dam 2710 may prevent overflow of shield metal 2640 beyond contact 2624 during shield formation. Dam 2710 may be formed by depositing a ring of conductive or non-conductive material, or it may be placed as a structural component. Dam 2710 may be formed in a same or similar manner as the columns 130 and walls 140 above. Dam 2710 may then form an electrical connection from shield 2640, through dam 2710 (if dam 2710 is conductive) or its coating or plating (if dam 2710 is non-conductive) to the pad or ground contact 2624 on the supporting board or substrate 2620.

Figure 28:
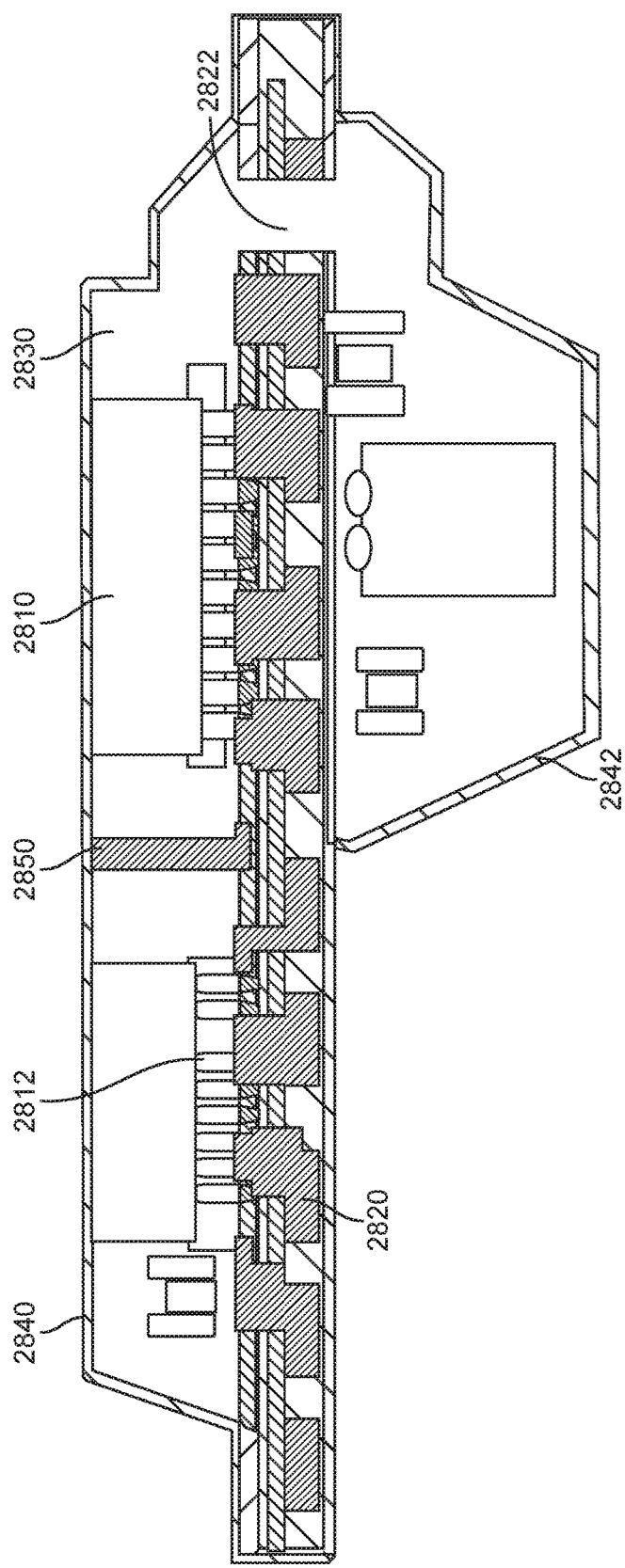
FIG. 28 illustrates a portion of a SIP module according to an embodiment of the present invention.

FIG. 28 illustrates a portion of a SIP module according to an embodiment of the present invention. In this example, a number of electrical or mechanical components 2810 may be attached through contacts 2812 to board 2820. A molding 2830 may be formed around components 2810. A shield having top and bottom portions 2840 and 2842 may be formed by printing, such as by ink-jet, 3-D, aerosol-jet, or other type of printing, plating, sputtering, vapor deposition, or other appropriate technique. These shields 2840 and 2842 may also be formed using a cap, as in the above examples. Shields 2840 and 2842, and the other shields shown herein, may be made using a molding material formed as a sheet laminated to a copper or other type of conductive layer. This may be used to form a conductive cap or shields 2840 and 2842 around molding 2830. In other embodiments of the present invention, molding 2830 may be omitted in favor of using the sheet of molding material over components 2810. One or more walls or columns 2850 may be formed between shield 2840 and one or more ground contacts on board 2820 or between shield 2840 and another structure. An opening 2822 in board 2820 may be provided to facilitate a flow of mold between a top and bottom surface of board 2820 during manufacturing.

As before, columns or walls 2850 may be formed in a same or similar manner as columns 130 and walls 140 of FIG. 1, or they may be formed of aluminum, steel, copper, or other conductive material. In still other embodiments of the present invention, these columns or walls 2850 may be formed of a conductive adhesive. These columns or walls 2850 may be formed using ink-jet, 3-D, aerosol-jet, or other type of printing, stenciling, or other appropriate technique. The conductive adhesive columns or walls 2850 may be formed by stacking sinter or solder in drops, curves, lines, or other shapes as shown above in FIGS. 2-3 and 5. The remaining portions of this structure may be formed in various ways. An example is shown in the following figures.

Figure 29:
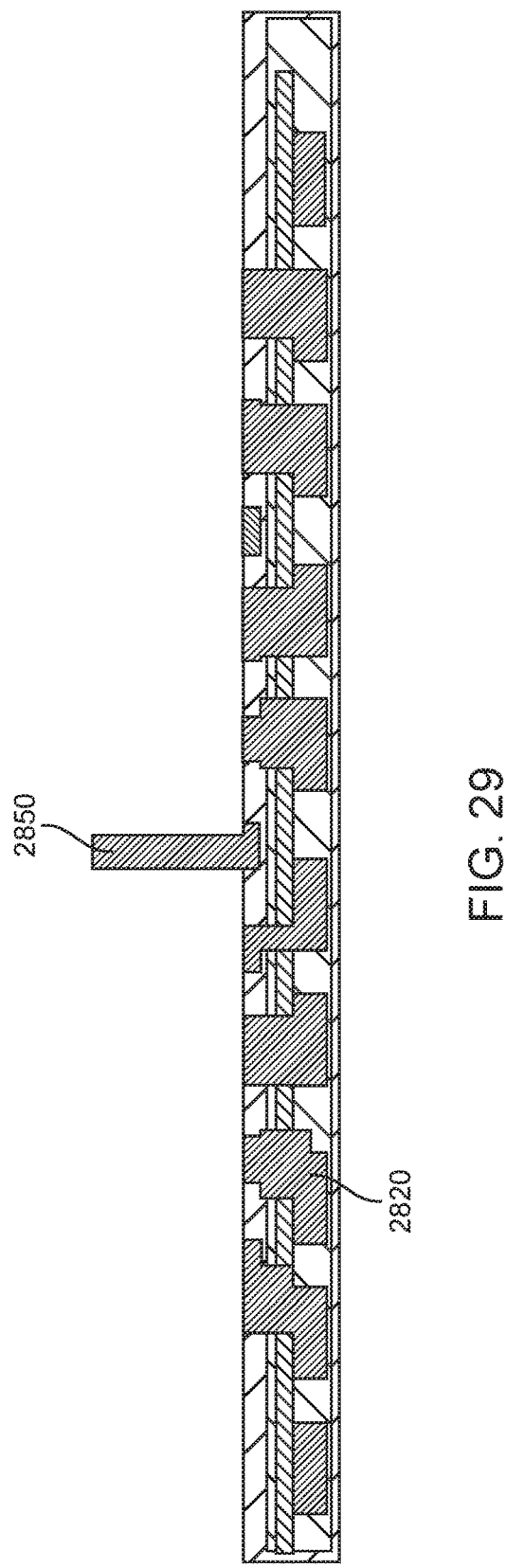
FIGS. 29-31 illustrate a method of forming a portion of a SIP module according to an embodiment of the present invention.
Figure 30:
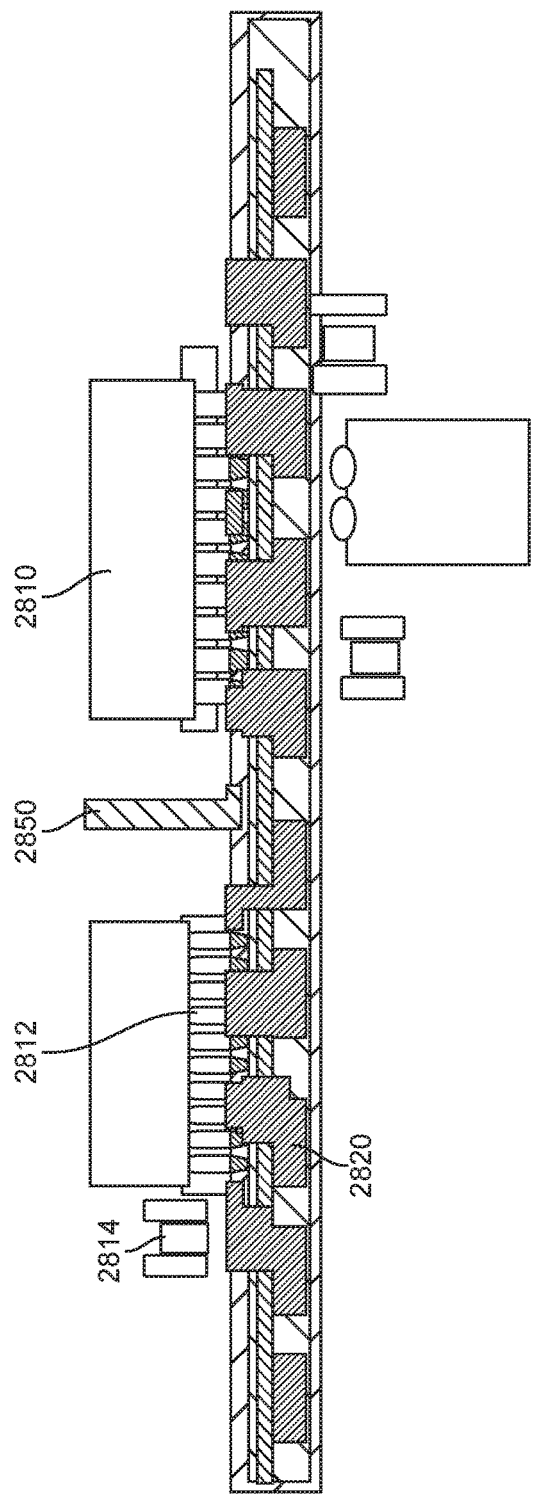
Figure 31:
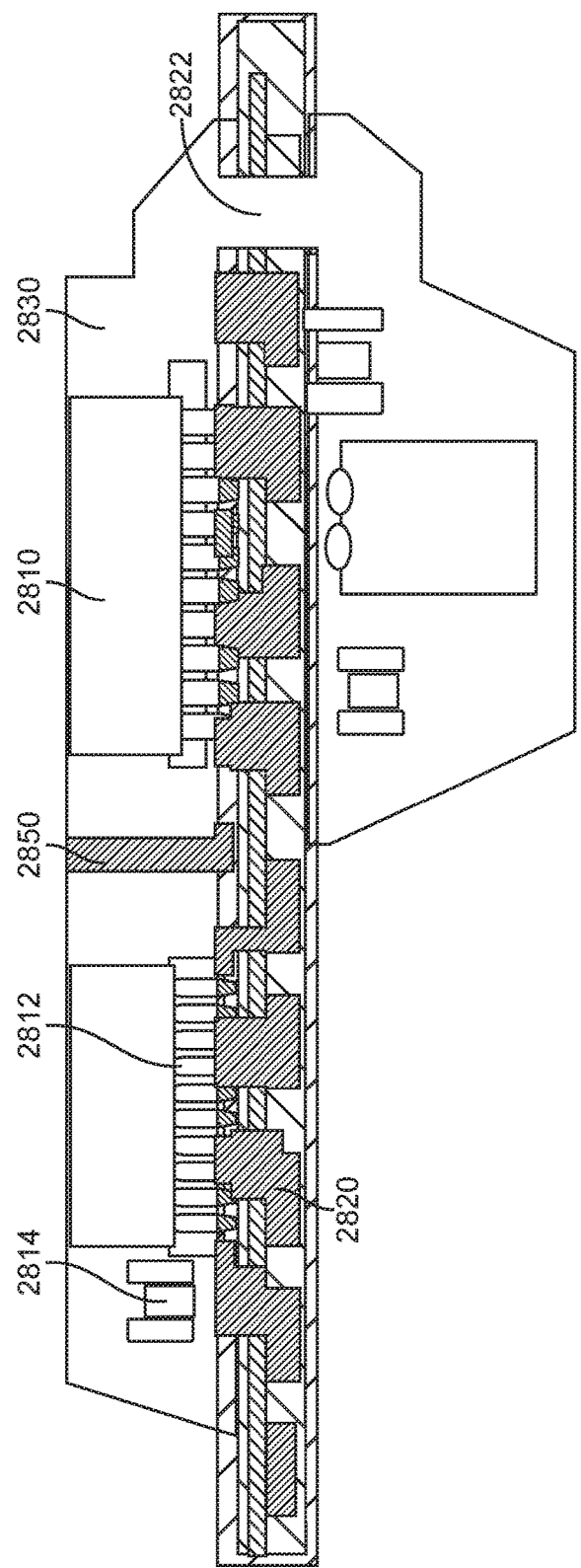

FIGS. 29-31 illustrate a method of forming a portion of a SIP module according to an embodiment of the present invention. In FIG. 29, a wall or column 2850 may be formed on a top surface of board 2820. In this example, columns or walls 2850 may be formed of aluminum, steel, copper, or other conductive material. In still other embodiments of the present invention, these columns or walls 2850 may be formed of a conductive adhesive. These conductive adhesive columns of walls 2850 may be formed using printing, stenciling, or other appropriate technique. In these and other embodiments of the present invention, columns or walls 2850 may be formed using ink-jet, 3-D, aerosol-jet, or other type of printing, stenciling, or other appropriate technique.

In FIG. 30, a number of components, such as components 2810 and 2814, may be attached to board 2820 via contacts 2812.

In FIG. 31, an opening 2822 may be formed in board 2820. Molding 2830 may be used to encapsulate components 2810 and 2814. Opening 2822 may facilitate the flow of molding compound between a top to bottom side of board 2820. Following this, a shield may be formed around the molding 2830 to generate the structure shown in FIG. 28.

In still other embodiments of the present invention, one or more electrical or mechanical components may be individually shielded. An example is shown in the following figure.

Figure 32:
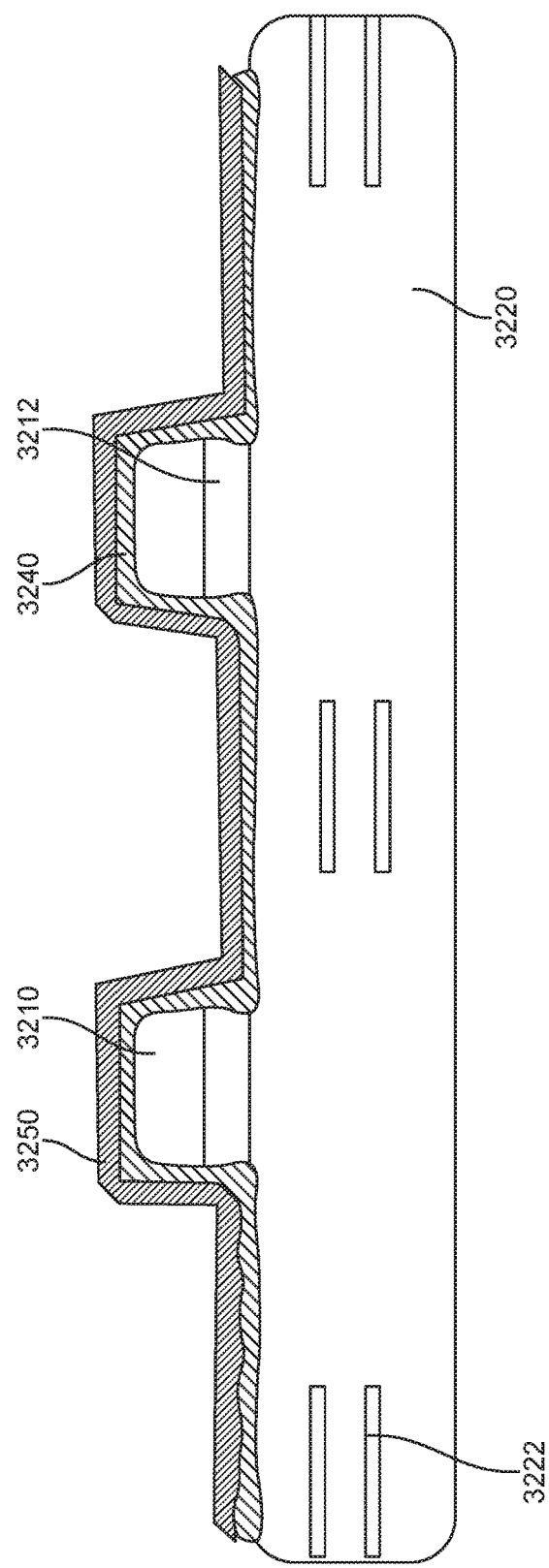
FIG. 32 illustrates a portion of a SIP module according to an embodiment of the present invention.

FIG. 32 illustrates a portion of a SIP module according to embodiments of the present invention. In this figure, a number of components 3210 having contacts 3212 may be attached to a surface of board 3220. An adhesive layer 3240 may be formed over the components 3210 and a least a portion of top surface of board 3220. This adhesive layer 3240 may act as an insulator. A shield 3250 may be formed over a top of adhesive layer 3240. Shield layer 3250 may be formed by plating, sputtering, ink-jet, 3-D, aerosol-jet, or other type of printing, vapor deposition, or other technique. Shield 3250 may be attached to ground contacts connected to traces 3222 in board 3220. This attachment may be formed using spot or laser welding or other appropriate technique. Adhesive layer 3240 and shield 3250 may be made using a molding material formed as a sheet laminated to a copper or other type of conductive layer. Adhesive layer 3240 may be formed using ink-jet, 3-D, aerosol-jet, or other type of printing.

In still other embodiments of the present invention, a molding compound, such as an epoxy, plastic, resin, may include a number of conductive particles. These conductive particles may be forced or encouraged to migrate in a manner that forms a shield. An example is shown in the following figure.

Figure 33:
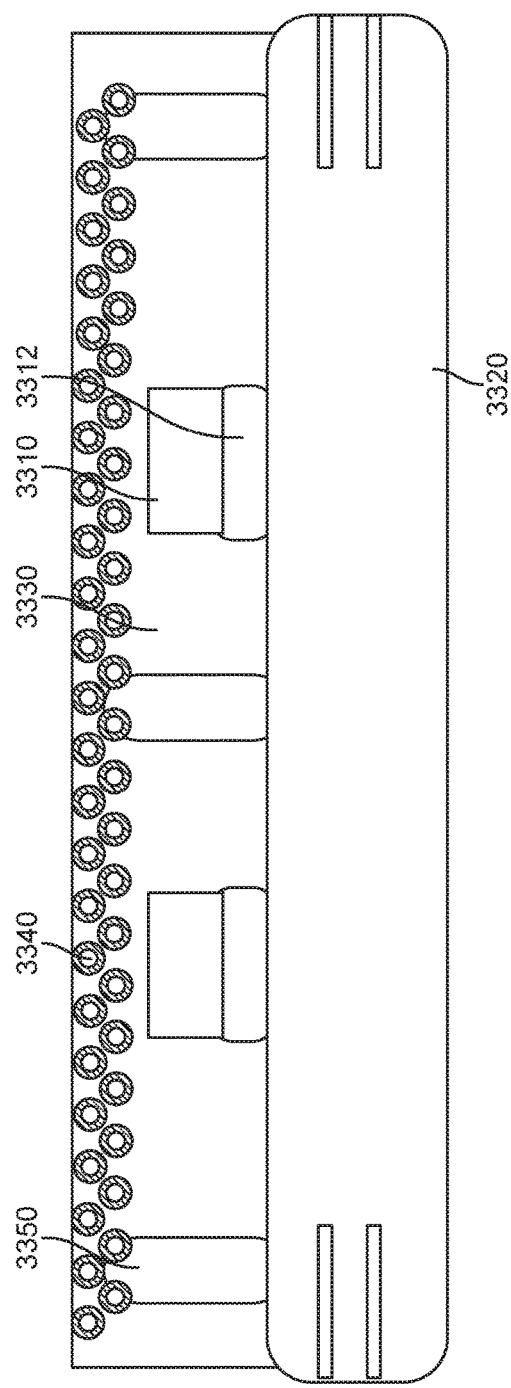
FIG. 33 illustrates a SIP module according to an embodiment of the present invention attached to a top surface of a printed circuit board.

FIG. 33 illustrates a portion of a SIP module according to an embodiment of the present invention. In this example, a number of components 3310 having contacts 3312 may be attached to a top side of board 3320. Components 3310 may be encapsulated in mold 3330. A number of walls or columns 3350 may also be included. Walls or columns 3350 may be formed as the walls 140 or columns 130 in the above examples, such as in FIGS. 2-5.

Molding 3330 may include a number of conductive particles 3340. During the curing of the molding compound used to form mold 3330, conductive particles 3340 may be encouraged to migrate to a top molding 3330 to form a shield. Specifically, particles 3340 may be encouraged to locate themselves such that they form electrical connections between columns 3350 in order to shield components 3310. This migration may be encouraged using gravity. For example, the module may be cured in upside-down position such that the heavier metal particles 3340 settle to the bottom. In other embodiments of the present invention, magnetic attraction may be used to attract the conductive particles 3340 into a desired position. In still other embodiments the present invention, particles 3340 may be filled with air or other gas, or a vacuum, and buoyancy may be relied upon to position the particles 3340 appropriately. These techniques and conductive particles 3340 may be used to form shields in the embodiments of the present invention disclosed herein and in other embodiments of the present invention, such as shield 330 in FIG. 3 and shield 2840 in FIG. 28.

In these and other embodiments of the present invention, a mold or a shield, or both, may be formed in different ways. In one embodiment of the present invention, a mold compound sheet having a conductive film attached to a top side may be used. In another embodiment the present invention, a film having and insulative side and a conductive side may be used to form a shield. In other embodiments of the present invention, shields may be made using a molding material formed as a sheet laminated to a copper or other type of conductive layer. This may be used to form a conductive cap or shield over a molding. In other embodiments of the present invention, the molding may be omitted in favor of using the sheet of molding material placed over components.

In various embodiments of the present invention, it may be desirable to isolate some components from other components in the module. This may be done using one or more columns or walls, such as columns 130 or walls 140 above, or other columns or walls provided by embodiments of the present invention. These columns or walls, such as columns 130 or walls 140 and the other columns or walls shown here may be formed of aluminum, steel, copper, or other conductive material. These columns or walls may be formed by stamping, forging, metallic injection molding, machining, micro-machining, or other manufacturing technique. In still other embodiments of the present invention, these columns or walls may be formed of a conductive adhesive. These conductive adhesive columns or walls may be formed using printing, stenciling, or other appropriate technique. These columns or walls may extend from a shield to a contact, plating, or other conductive portion on a bottom side of the module.

In the above examples, one or more electrical components may be attached to a surface of a printed circuit board or other appropriate substrate. In still other embodiments the present invention, an embedded substrate may be used where one or more electrical components are located inside of a board or board-type structure. Examples are shown in the following figures.

Figure 34:
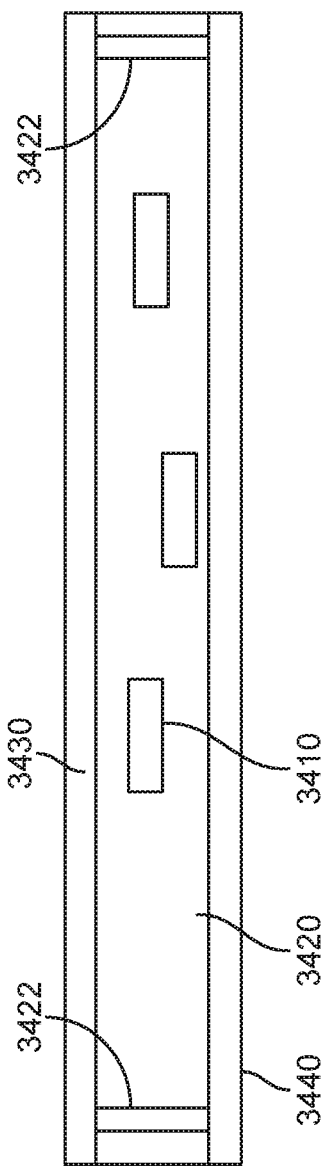
FIGS. 34 and 35 illustrate portions of electronic systems according to an embodiment of the present invention.
Figure 35:
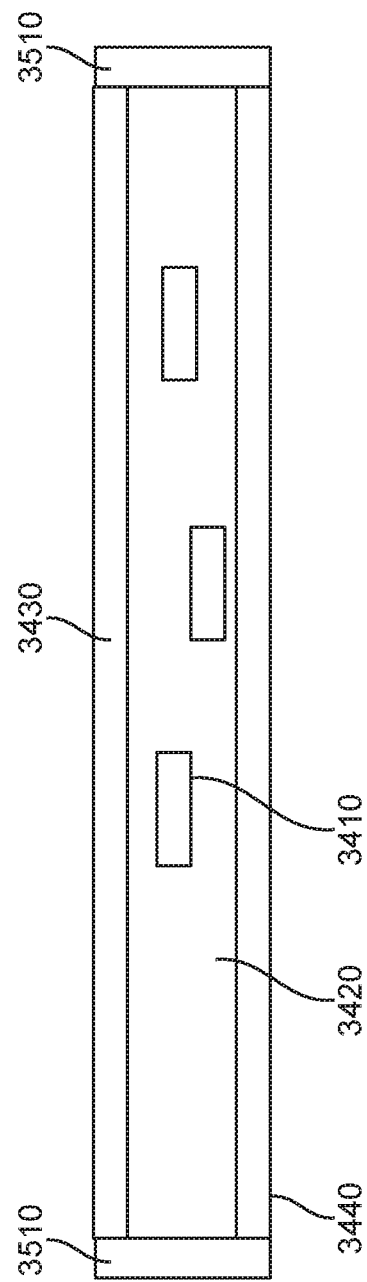

FIGS. 34 and 35 illustrate portions of electronic systems according to an embodiment of the present invention. In FIG. 34, one or more components 3410 may be located on layers in an embedded substrate 3420. Embedded substrate 3420 may be plated with a top ground plate 3430 and a bottom ground plate 3440. Either or both of these plates 3430 and 3440 may include openings for contacts to allow electrical connections to components 3410 to be made. Top plate 3430 and bottom plate 3440 may attach to each other through vias 3422. Vias 3422 may be formed in the same or similar manner as columns 130 or walls 140 in the examples above. Top plate 3430 and bottom plate 3440 may be formed by printing, such as by ink-jet, 3-D, aerosol-jet, or other type of printing, plating, sputtering, vapor deposition, or other appropriate technique. These plates may also be formed using caps, as shown in the above examples. Plates 3430 and 3440 may be made using a molding material formed as a sheet laminated to a copper or other type of conductive layer. In FIG. 35, top plate 3430 and bottom plate 3440 may electrically connect to each other by side plating 3510. Side plating 3510 may be formed by printing, such as by ink-jet, 3-D, aerosol-jet, or other type of printing, plating, sputtering, vapor deposition, or other appropriate technique.

In these and other embodiments of the present invention, the vertical route paths may be routed along an edge of a module. Examples are shown in the following figures.

Figure 36:
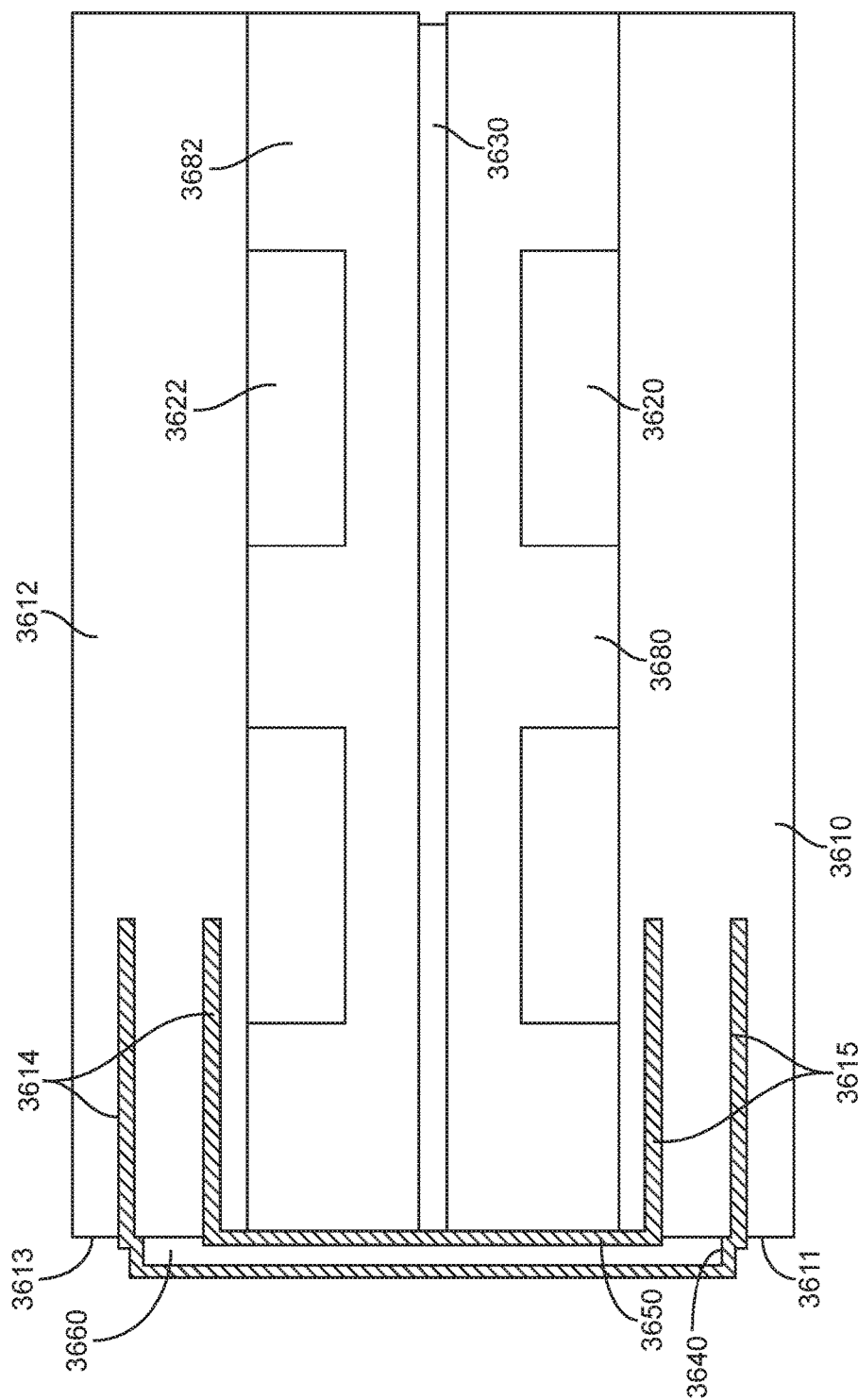
FIG. 36 illustrates methods and structures for routing traces along an edge of a system-in-a-package module according to an embodiment of the present invention.

FIG. 36 illustrates methods and structures for routing traces along an edge of a system-in-a-package module according to an embodiment of the present invention. This system in a package module may include a top printed circuit board 3612 having components 3622 on a surface and bottom printed circuit board 3610 having components 3620 on a surface. This module may be arranged such that the surfaces of top printed circuit board 3612 and bottom printed circuit board 3610 face each other. Top printed circuit board 3612 and bottom printed circuit board 3610 may be placed facing each other and separated by a film or sheet of molding compound 3630. Regions 3680 and 3682 may be encapsulated by epoxy or other molding compound. Regions 3680 and 3682 may be encapsulated in separate manufacturing steps or they may be encapsulated together during the same manufacturing step.

It may be difficult for components 622 on top printed circuit board 3612 to communicate with components 3620 on bottom printed circuit board 3610. Accordingly, embodiments of the present invention may provide vertical routing paths from traces 3614 of top printed circuit board 3612 to traces 3615 of bottom printed circuit board 3610.

In this example, traces to convey signals, power, ground, and other electrical signals may be formed on an edge of a system-in-package module. This may enable components 3622 on top printed circuit board 3612 to communicate with components 3620 on bottom printed circuit board 3610. In this example, signal trace 3650 and power or ground traces 3640 may be routed from edge 3613 of top printed circuit board 3612 to edge 3611 of bottom printed circuit board 3610. Specifically, signals may be routed along signal traces 3650. Power or ground may be routed along power or ground traces 3640. These signal traces 3650 and power traces 3640 may be separated by isolation areas 3660. Isolation areas 3660 may be deposited to prevent signal traces 3650 and power traces 3640 from shorting together. Signal traces 3650 and power or ground 3640 traces may be formed by edge plating, printing, ink printing, aerosol printing, or other technique. In these and other embodiments of the present invention, one or more of these traces may be absent, one or more traces may be additionally included, the positions of signal traces 3650 and power or ground 3640 traces may be reversed or routed in a different manner, or other changes may be made consistent with embodiments of the present invention.

Figure 37:
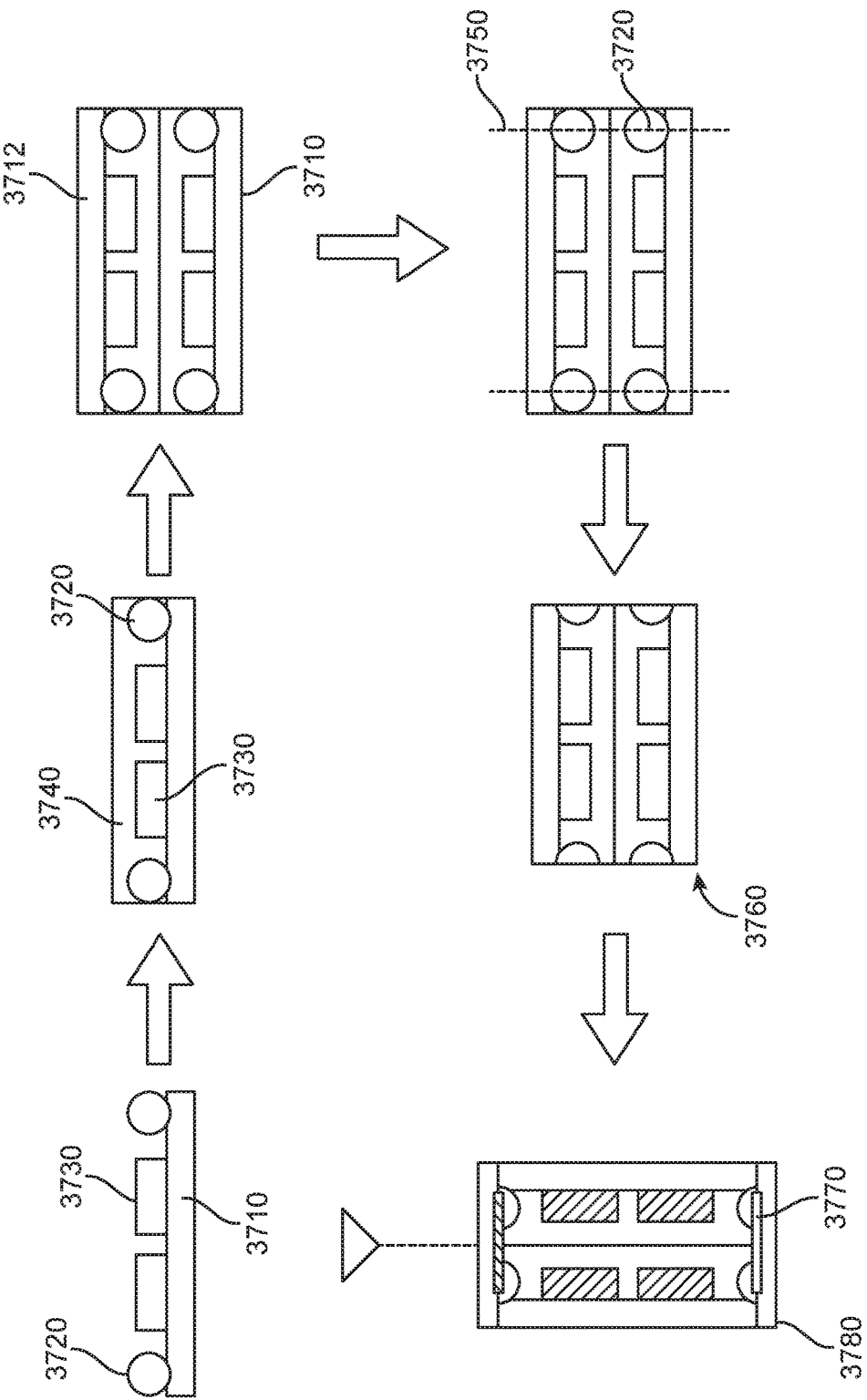
FIG. 37 illustrates methods and structures for routing traces along an edge of a system-in-a-package module according to an embodiment of the present invention.

FIG. 37 illustrates methods and structures for routing traces along an edge of a system-in-a-package module according to an embodiment of the present invention. In this example, components 3730 may be placed on a surface of board 3710. Solder balls 3720 may be formed or placed on board 3710. The surface of board 3710 may be encapsulated with material 3740. A second board 3712, formed in the same or similar manner, may be placed facing board 3710. The modules may be cut along lines 3750, which may pass through or near a center of soldered ball 3720. Interconnect 3770 may be formed along sides of boards 3710 and 3712 to connect the remaining portions of solder balls 3720 in boards 3710 and 3712. Interconnect 3770 may be formed by edge plating, printing, ink printing, aerosol printing, or other technique. Interconnect 3770 may be protected by layer 3780, which may be formed over sides of boards 3710 and 3712.

Figure 38:
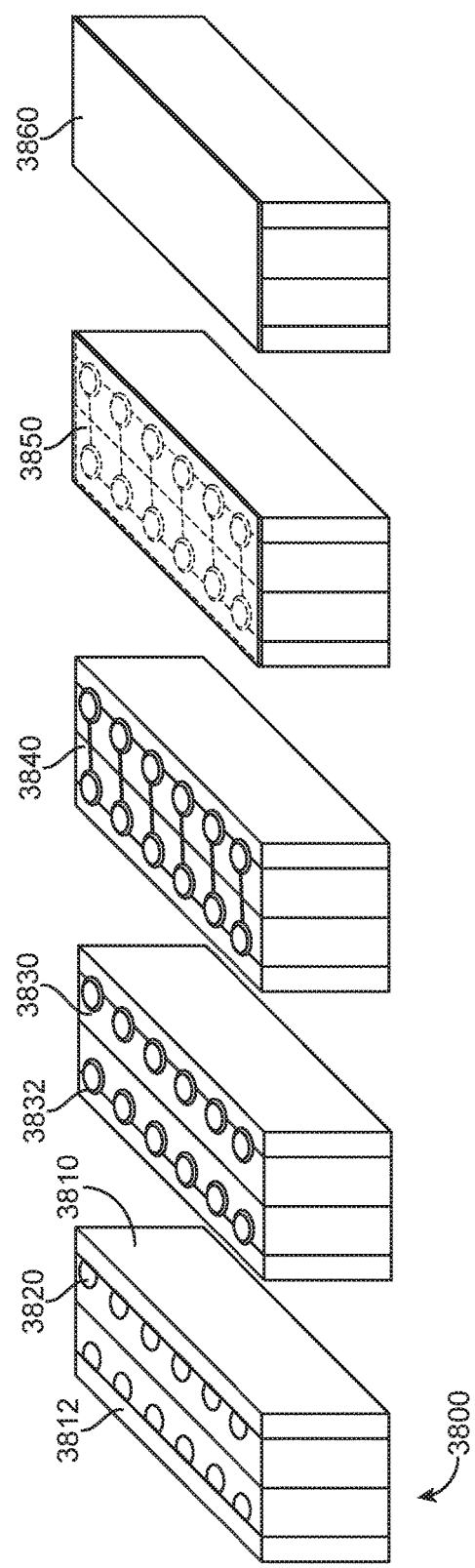
FIG. 38 illustrates methods and structures for routing traces along an edge of a system-in-a-package module according to an embodiment of the present invention.

FIG. 38 illustrates methods and structures for routing traces along an edge of a system-in-a-package module according to an embodiment of the present invention. Two printed circuit boards 3810 and 3812 having solder balls 3820 on surfaces may be placed facing each other to form combined or system-in-a-package module 3800. A dielectric layer 3830 with openings 3832 over solder balls 3820 may be printed. The traces 3840 which may connect various solder balls 3820 may be printed. Dielectric layer 3850 may be deposited or otherwise formed over the in a traces 3840. Shield layer 3860 may be printed over dielectric layer 3850. Shield layer 3860 may be connected to ground.

In these and other embodiments of the present invention, multiple layers of dielectric 3030 and traces 3040 may be stacked along sides of system in package modules 3800. These multilayer structures may provide a high level of interconnect between components on printed circuit boards 3010 and 3012.

In various embodiments of the present invention, components, such as resistors and capacitors, may be used to form vertical interconnect structures. Examples are shown in the following figures.

Figure 39:
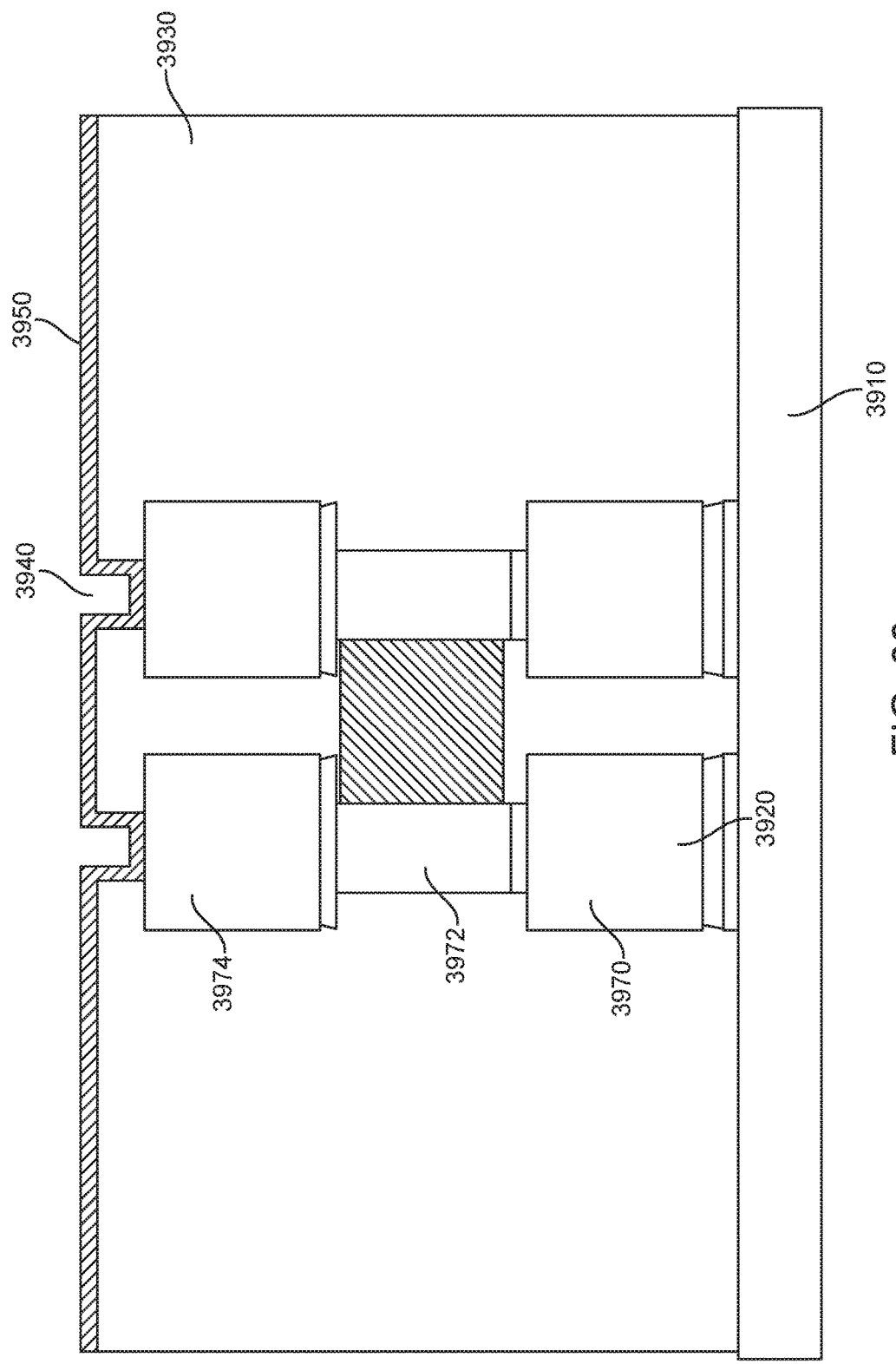
FIG. 39 illustrates a vertical interconnect structure according to an embodiment of the present invention.

FIG. 39 illustrates a vertical interconnect structure according to an embodiment of the present invention. In this example, a number of components 3920 may be stacked on board 3910. Components 3920 may be resistors, capacitors, or other components. They may be conventional components, or they may be specialized components. For example they may be components having zero resistance or zero capacitance. Trenches 3940 may be cut with a laser or other method in a top surface of molding 3930. Signal lines, power lines, shield, or other interconnect 3950 may be deposited. Interconnect 3950 may connect to the vertical interconnect structure formed by components 3920 though trench 3940. In this way, a trace (not shown) of board 3910 may be routed to a top surface of this module.

More specifically, a trace of board 3910 may electrically connect to a contact of compound 3970. This contact may be in turn connected to contacts of devices 3972 and 3974. The contacts of devices 3970, 3972, and 3974 may provide a route path from the traces in board 3910 to interconnect 3950 on a top surface of molding 3930.

In these and other embodiments of the present invention, the vertical interconnect structure formed by components 3920 may be used to connect different (such as facing) printed circuit boards in a system-in-a-package module. For example, they may be used to provide pathways between top printed circuit board 3612 and bottom printed circuit board 3610 (shown in FIG. 36.)

Figure 40:
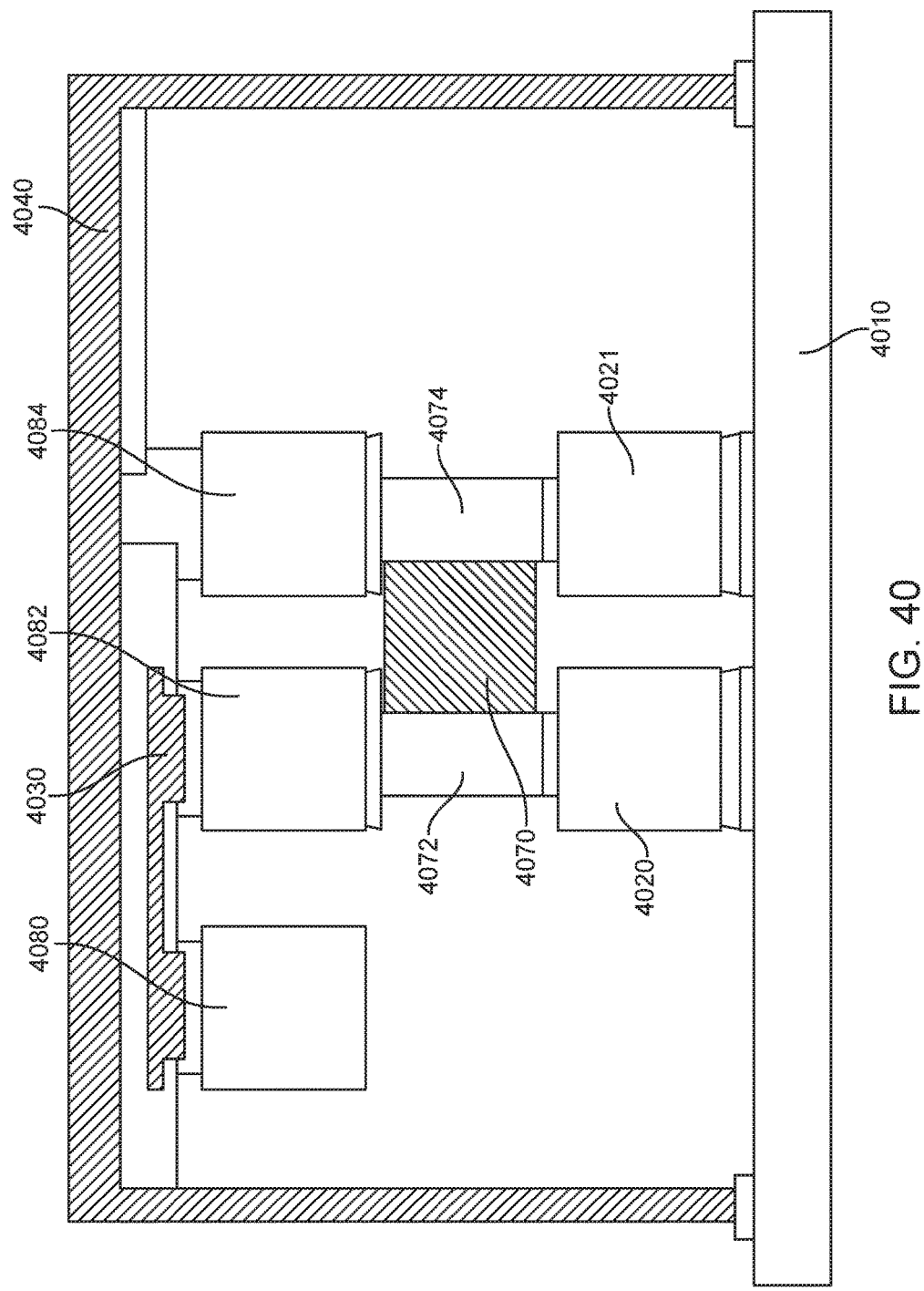
FIG. 40 illustrates another vertical interconnect structure according to an embodiment of the present invention.

FIG. 40 illustrates another vertical interconnect structure according to an embodiment of the present invention. In this example, a vertical interconnect structure formed of components 4020 may be stacked on board 4010. Components 4020 may be resistors, capacitors, or other components. Components 4020 may form an electrical connection between board 4010 and shield can 4040 and traces 4030. This vertical interconnect structure may provide EMI fences and shields as well as other isolating structures. In this example, additional components 4080 and 4082 may be attached to an inside surface of shield can 4040.

Specifically, a trace (not shown) of board 4010 may electrically connect to component 4080 and shield can 4040. Specifically, a trace of board 4010 may be routed through a contact of component 4020, contact 4072 of component 4070, a contact of component 4082, trace 4030, to a contact of component 4080. Similarly, a trace of board 4010 may connect to shield can 4040 through a contact of component 4021, contact 4074 of component 4070, and a contact of component 4084. These structures may provide useful routing paths between board 4010 and components connected to traces 4030, as well as for isolation, shielding, and other structures.

Figure 41:
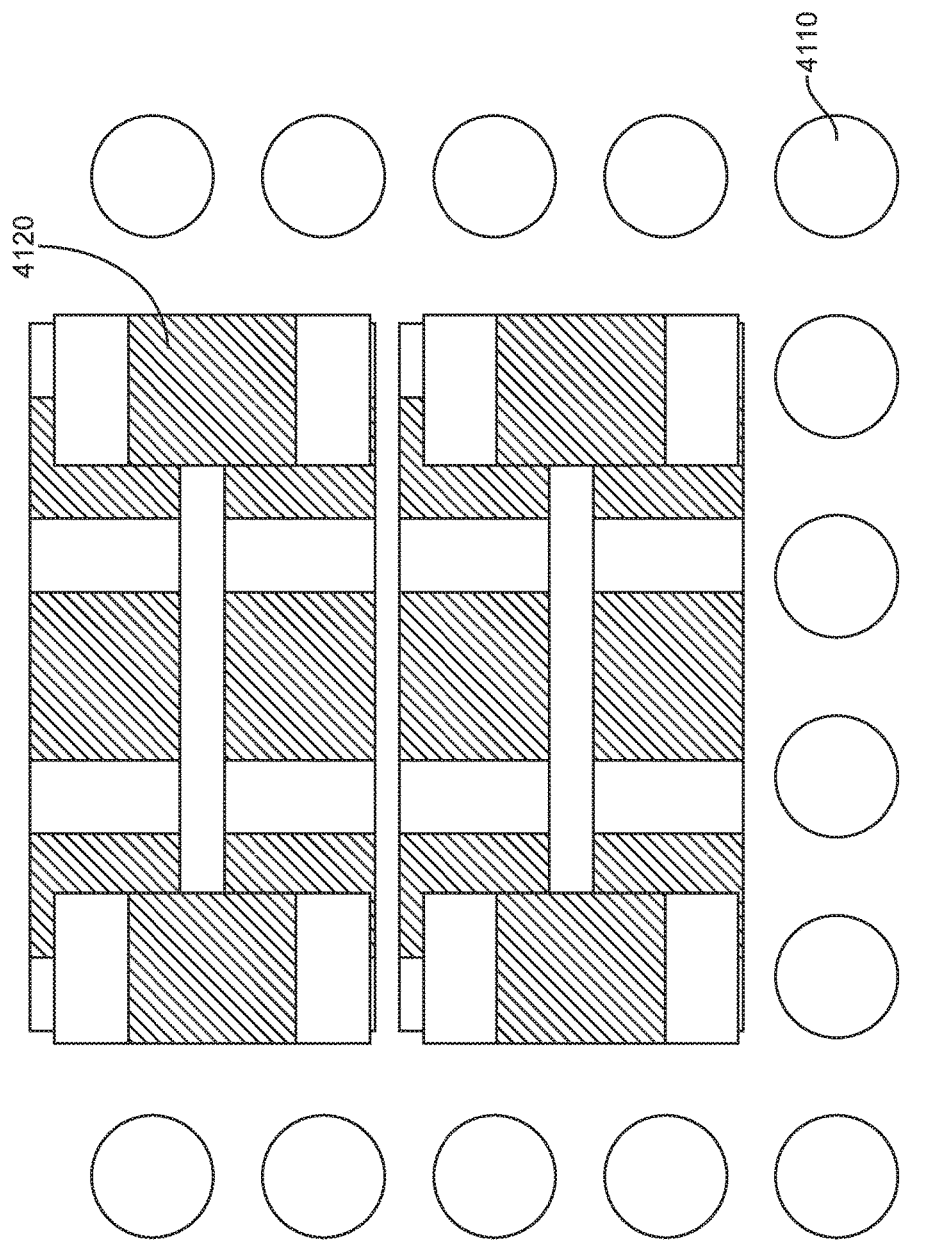
FIG. 41 illustrates a stacked interconnect structure according to an embodiment of the present invention.

FIG. 41 illustrates a stacked interconnect structure according to an embodiment of the present invention. In this example, a number of components 4120 and ball contacts 4110 may be stacked and placed on ball grid array pads.

In other embodiments the present invention, other techniques and components may be used in a forming fences, shields, and other isolating structures. Examples are shown in the following figures.

Figure 42:
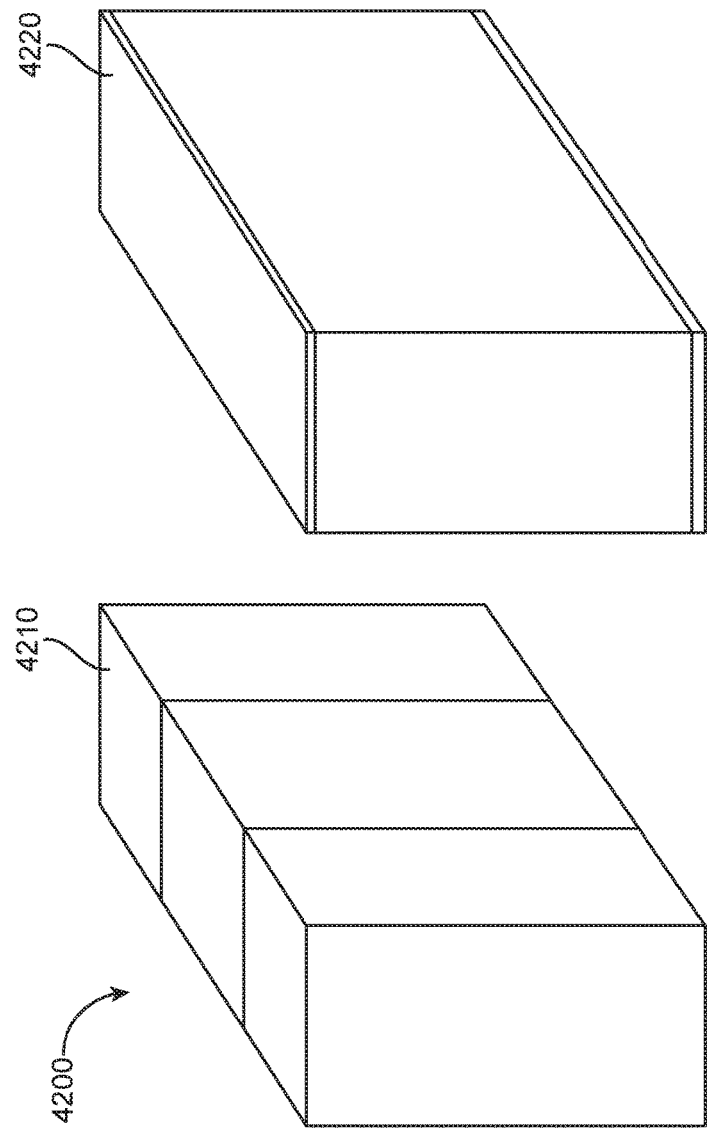
FIG. 42 illustrates bricks that may be used to provide isolation and interconnect according to embodiments of the present invention.

FIG. 42 illustrates bricks that may be used to provide isolation and interconnect according to embodiments of the present invention. In this example, bricks 4200 may be formed of metal or other material. Bricks 4200 may have solderable surfaces 4210 and 4220. These solderable surfaces 4210 and 4220 may be soldered or otherwise fixed to a board, to another brick, or to a shield can to form isolating structures, vertical interconnect, or other structure. Bricks 4200 may be placed adjacent to or near each other to form a wall or enclosure in a system-in-a-package module, such as the modules shown in the other examples herein.

In these and other embodiments of the present invention, solderable surfaces 4210 and 4220 may be the conductive surfaces on bricks 4200. Accordingly, the solderable surfaces may be used to form interconnect paths. In these and other embodiments of the present invention, bricks 4200 may otherwise be formed of a conductive material, a non-conductive material, or a semi-conductive material. Bricks 4200 may be magnetically conductive or magnetically insulative. In other embodiments of the present invention, other portions of bricks 4200 may have solderable surfaces in different shapes. Moreover, bricks 4200 themselves may have various shapes. For example, they may be L-shaped, T-shaped, U-shaped, or have other shapes or profiles.

Figure 43:
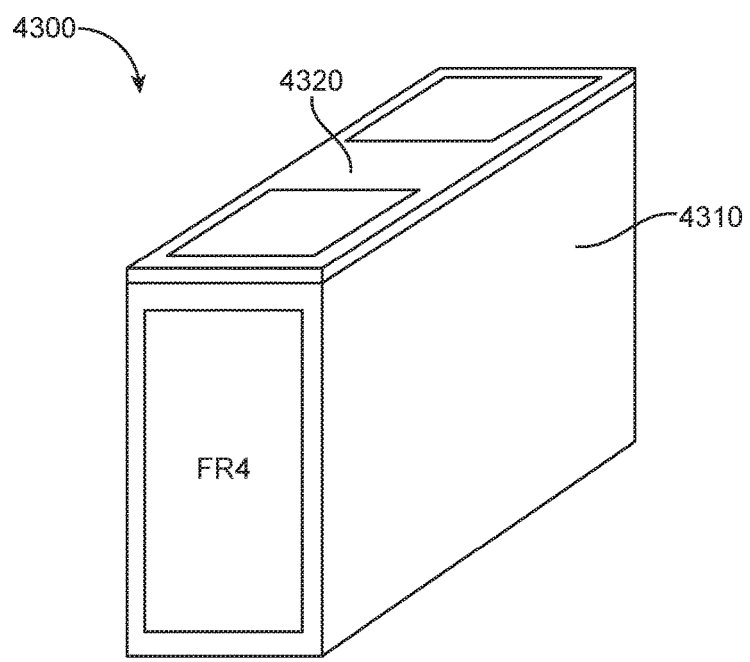
FIG. 43 illustrates a brick that may be formed from a portion of a printed circuit board.

FIG. 43 illustrates a brick that may be formed from a portion of a printed circuit board. In this example, a printed circuit board section 4300 may be plated with copper regions 4310 and have a solder mask 4320.

In these and other embodiments of the present invention, printed circuit board portion 4300 may be formed of a number of layers. These layers may be used to provide support for vertical interconnect lines (not shown.) Copper regions 4310 may form interconnect paths, shielding, or other structures. Solder mask 4320 may define regions of printed circuit board section 4300 that may be soldered to surfaces of a printed circuit board, shield can, other printed circuit board sections 4300, or other structures, such as bricks 4200 (shown in FIG. 42.)

These bricks may be stacked in various ways. An example is shown in the following figure.

Figure 44:
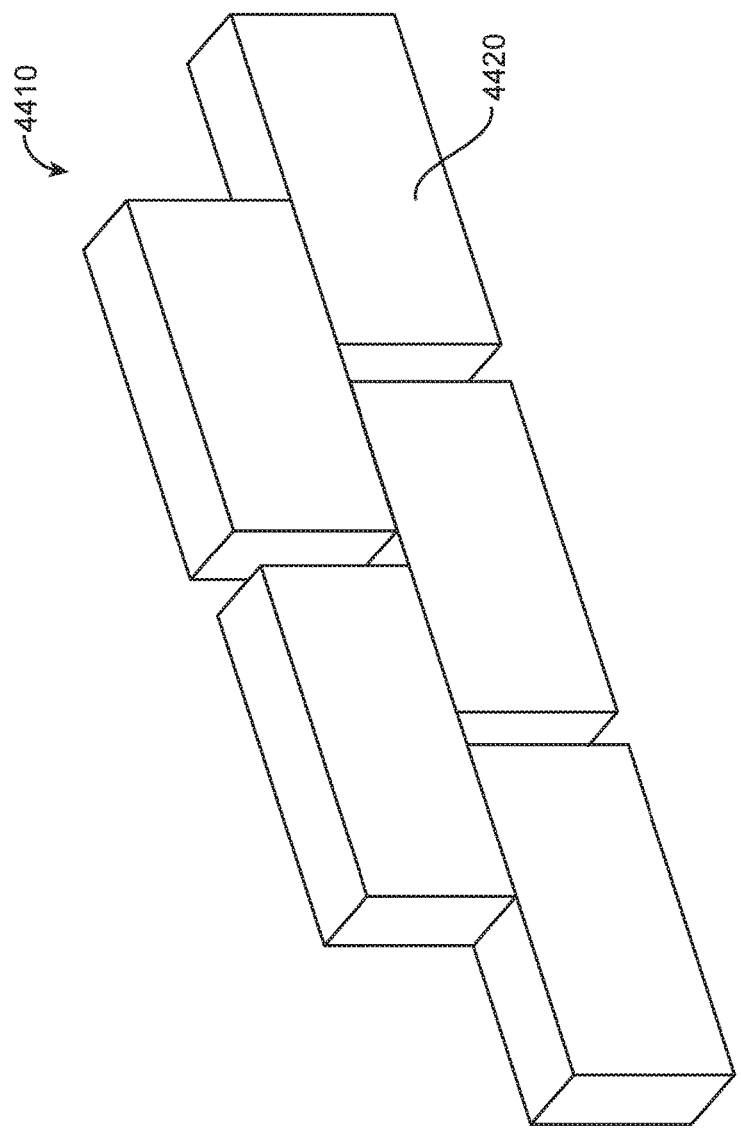
FIG. 44 illustrates a stack of bricks that may be used in a system-in-a-package module according to an embodiment of the present invention.

FIG. 44 illustrates a stack of bricks that may be used in a system-in-a-package module according to an embodiment of the present invention. A stack 4410 of bricks 4420 may be used as a fence, shield, vertical interconnect, or other structure in a system-in-a-package module. The stack 4410 of bricks 4420 may be soldered or otherwise fixed to a board, shield can, or other structure in a system-in-a-package module.

Figure 45:
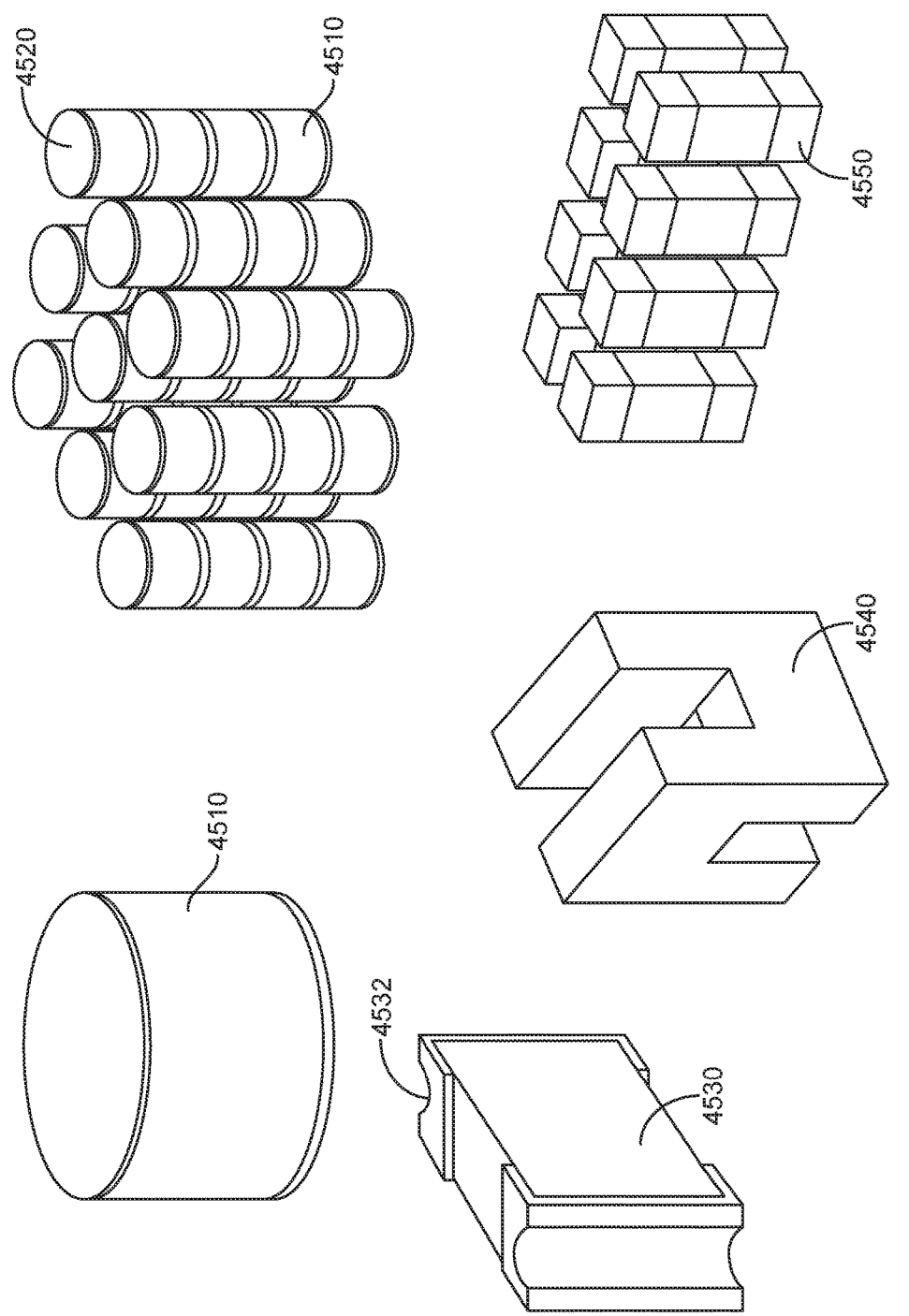
FIG. 45 illustrates a number of structures that may be used as isolating structures, shields, or vertical interconnect according to an embodiment of the present invention.

FIG. 45 illustrates a number of structures that may be used as isolating structures, shields, or vertical interconnect according to an embodiment of the present invention. A portion of a printed circuit board may be used as brick 4530 to form a wall, vertical interconnect, or other structure. Brick 4530 may include rounded contacting areas in solderable regions 4532, in which vertical connectors, such as vertical connectors 4520, may be placed.

Bricks 4540 may be stacked to form vertical interconnect or other structures (not shown.) Pillars 4550 may be used for vertical interconnect or isolation. Disks 4510 may be stacked to form vertical connectors 4520.

Figure 46A:
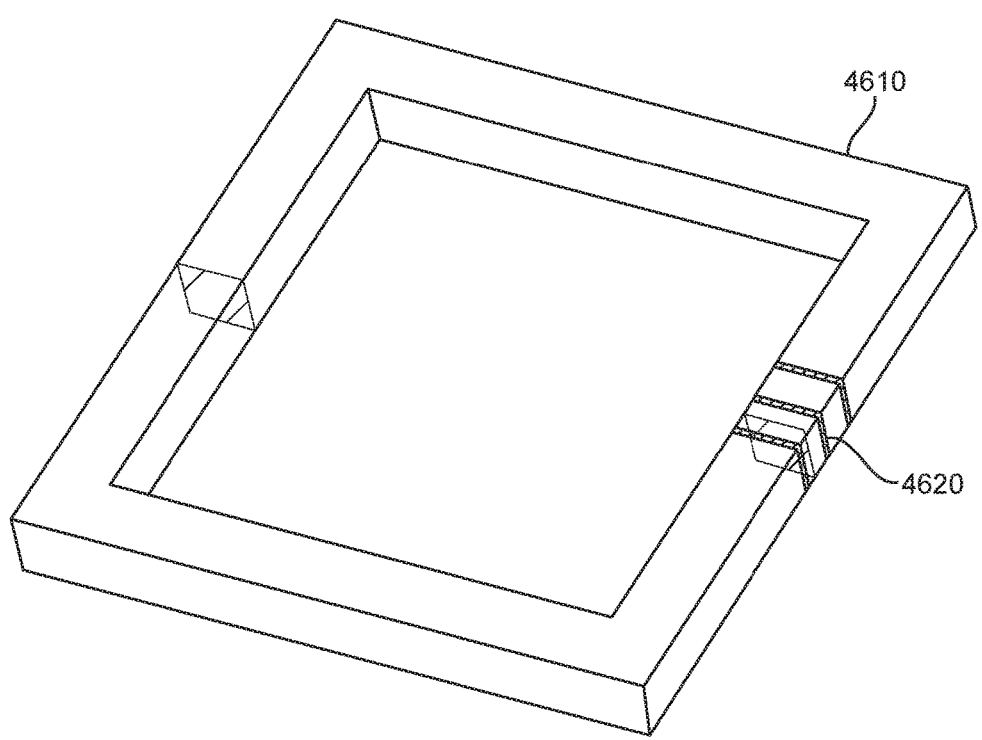
FIGS. 46A and 46B illustrate frames that may be used for vertical interconnect according to an embodiment of the present invention.
Figure 46B:
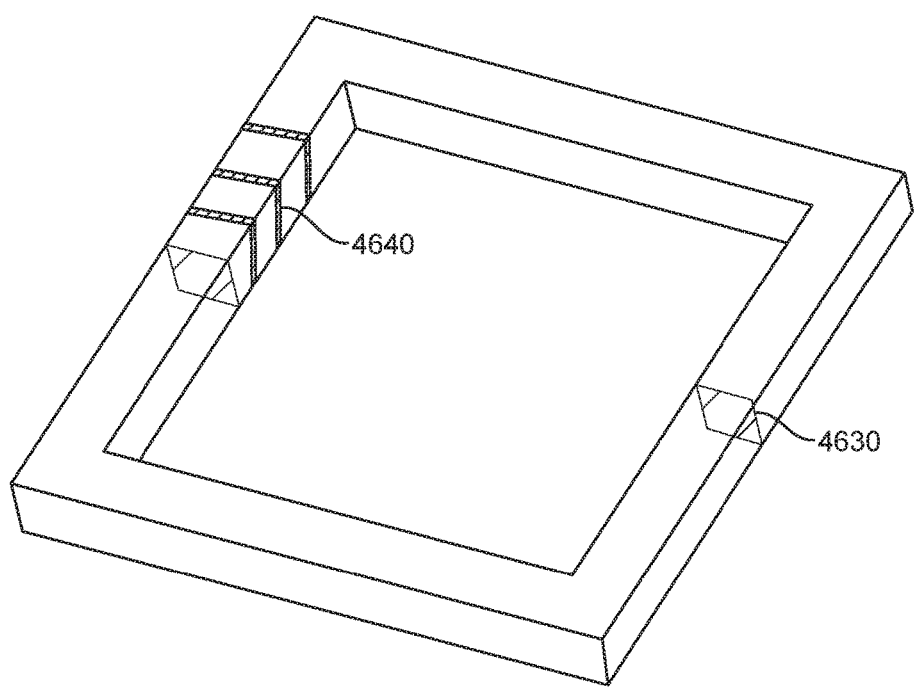

FIGS. 46A and 46B illustrate frames that may be used for vertical interconnect according to an embodiment of the present invention. In FIG. 46A, frame 4610 may include interconnect lines 4620. Frame 4610 may be formed of plastic, Laser Direct Structuring (LDS), epoxy, or other material. Frame 4610 may include interconnect lines 4620 along one or more of the top, bottom, and sides of frame 4610. Interconnect lines 4620 may be formed by ink jet, aerosol jet, or other process. When frame 4610 is LDS, interconnect lines 4620 may be formed by outlining the traces with a laser and then plating frame 4610. Interconnect lines 4620 may be printed on one, two, three, or four sides of frame 4610. Frames 4610 may be used as a vertical interconnect, or they may be stacked to form vertical interconnect structures.

In FIG. 46B, frame 4630 may include interconnect lines 4640. Frame 4630 may be formed of plastic, Laser Direct Structuring (LDS), epoxy, or other material. Frame 4630 may include interconnect lines 4640 along one or more of the top, bottom, and sides of frame 4630. Interconnect lines 4640 may be formed by ink jet, aerosol jet, or other process. When frame 4630 is LDS, interconnect lines 4640 may be formed by outlining the traces with a laser and then plating frame 4630. Interconnect lines 4640 may be printed on one, two, three, or four sides of frame 4630. Frames 4630 may be used as a vertical interconnect, or they may be stacked to form vertical interconnect structures. In these and other embodiments of the present invention, frames 4630 may be cut from a panel. In this case, interconnect lines 4640 might be absent from an outside surface of frame 4630. One such panel is shown in the following figure.

Figure 47:
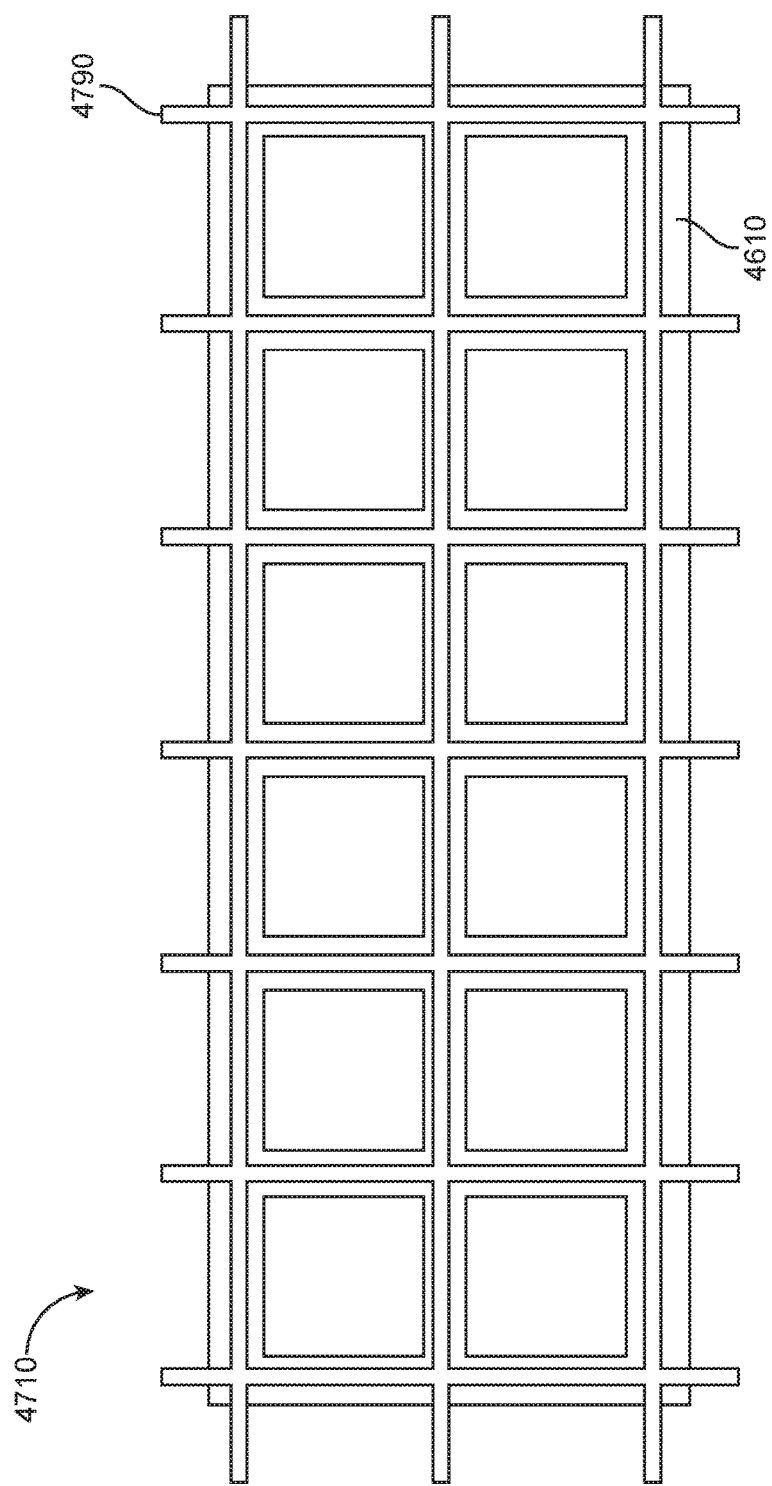
FIG. 47 illustrates a panel of frames according to an embodiment of the present invention.

FIG. 47 illustrates a panel of frames according to an embodiment of the present invention. Panel 4710 may include frames 4610 (or 4630). Panel may be cut along lines 4790 to form frames 4610. Interconnect lines 4620 or 4640 may be formed on frames 4610 either before or after panel 4710 is divided. Panel 4710 may be formed by injection molding, other types of molding, or other types of processes.

Figure 48:
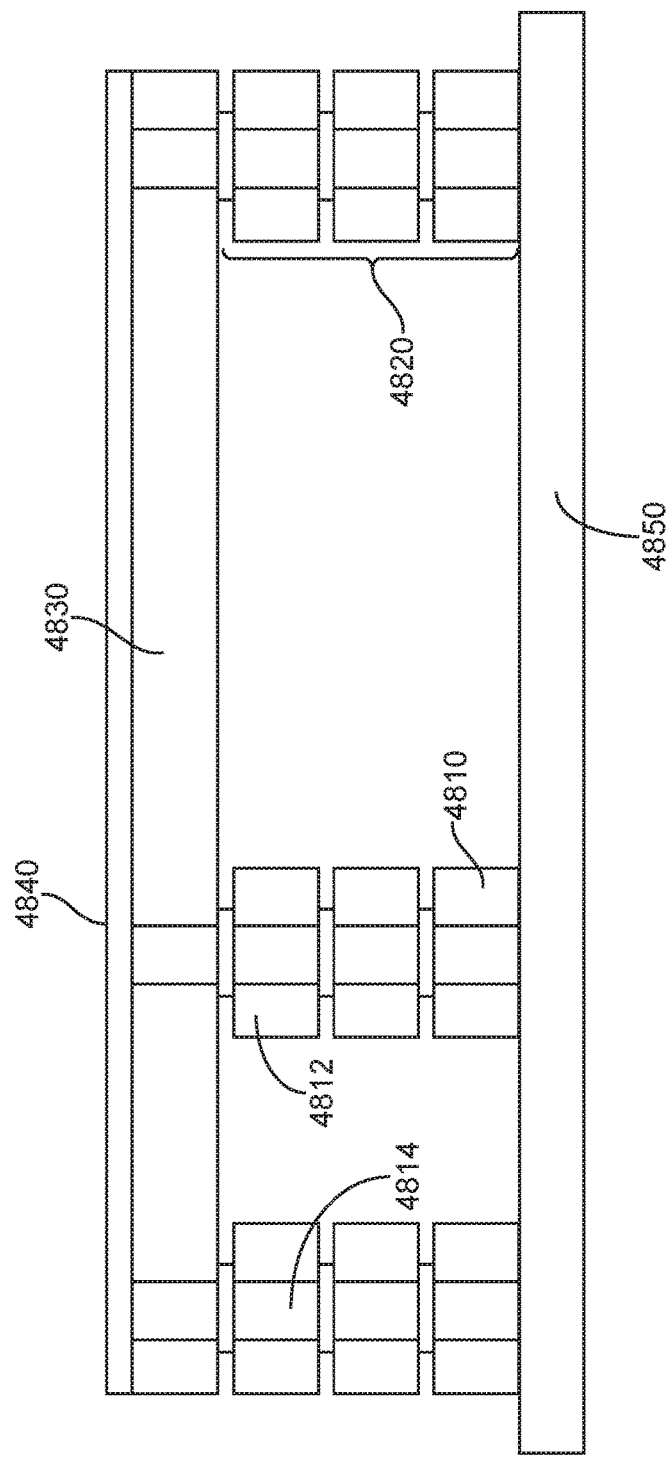
FIG. 48 illustrates structures that may be formed of frames according to an embodiment of the present invention.

FIG. 48 illustrates structures that may be formed of frames, bricks, or other structures according to an embodiment of the present invention. Specifically, frames, bricks, or other structures 4810 may be stacked to form posts 4820. Posts 4820 may form vertical interconnect between board 4850 and top 4830. Posts 4820 may support top 4830. Top 4830 may be shielded by plating or otherwise covered with metal 4840. Top 4830 may thus form a shield cap for a system-in-a-package module. Posts 4820 may be used as vertical interconnect in a system-in-a-package module. Posts 4820 may be extended laterally to form walls for isolation in a system-in-a-package module. Frames, bricks, or other structures 4810 may include conductive portion 4814 supported by housing portion 4812.

Figure 49:
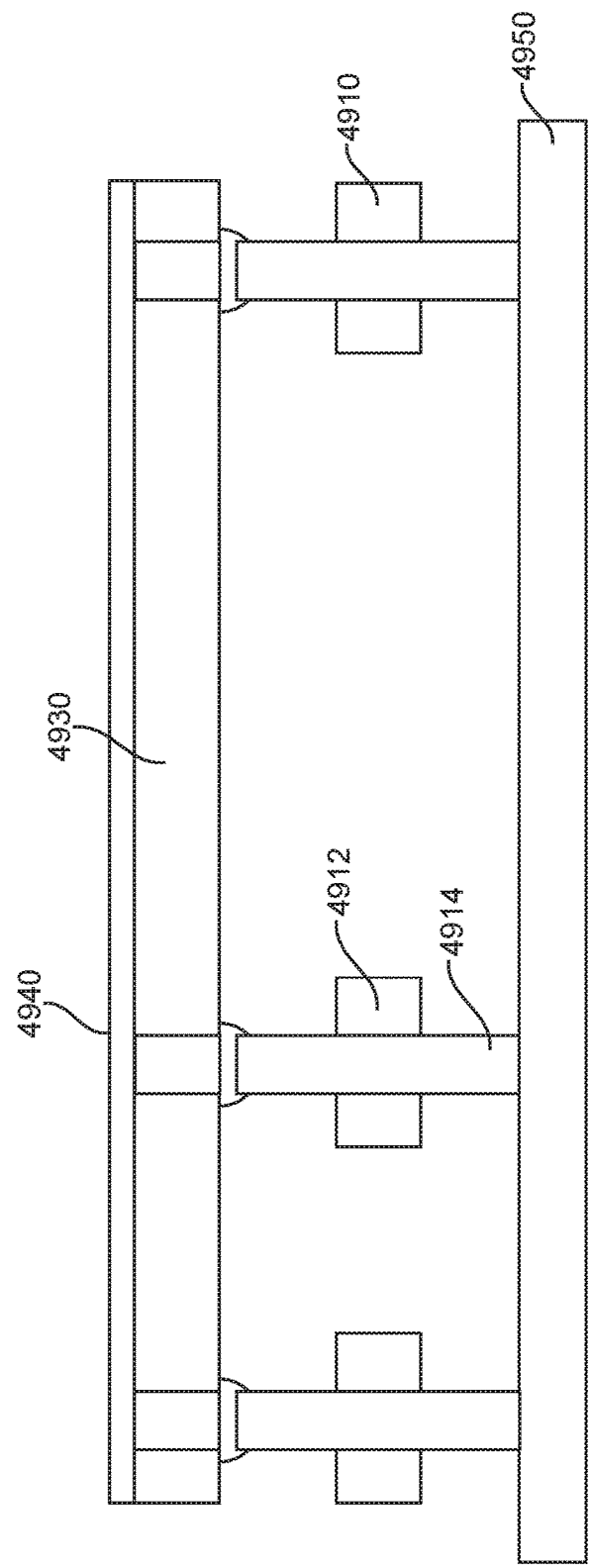
FIG. 49 illustrates another vertical interconnect structure according to an embodiment of the present invention.

FIG. 49 illustrates another vertical interconnect structure according to an embodiment of the present invention. In this example, post 4910 may provide interconnect or shielding between board 4950 and top 4930. Posts 4910 may include conductive paths 4914 supported by frames or other housing 4912. Posts 4910 may be used in supporting top 4930 and shield 4940.

Figure 50:
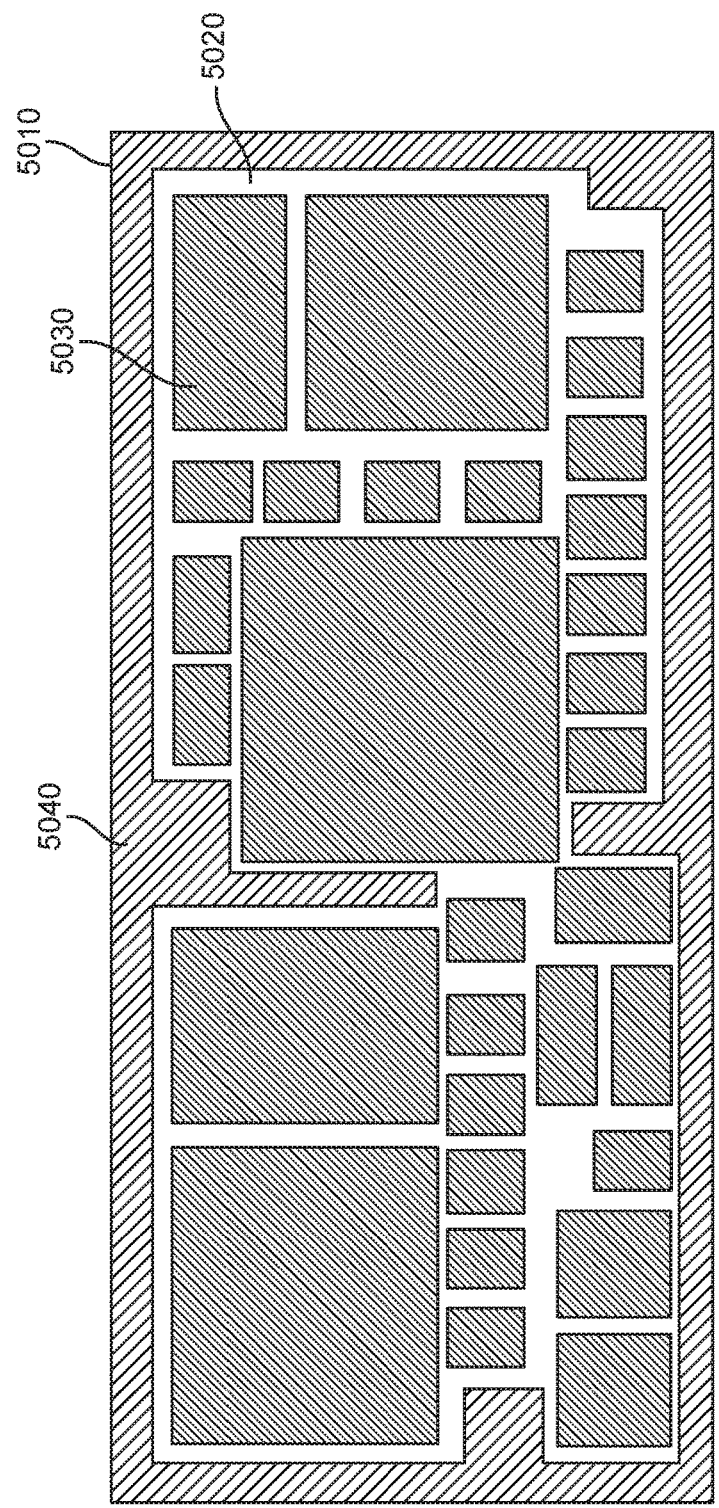
FIG. 50 illustrates a bottom side view of a system-in-a-package module according to an embodiment of the present invention.

FIG. 50 illustrates a bottom side view of a system-in-a-package module according to an embodiment of the present invention. In this example, a number of components 5030 may be located in recess 5020 in adaptive shield 5010. Adaptive shield 5010 may include sidewalls 5040 along its sides and interior. Examples of adaptive shields 5010 and how adaptive shields 5010 may be formed are shown in the following figures.

Figure 51:
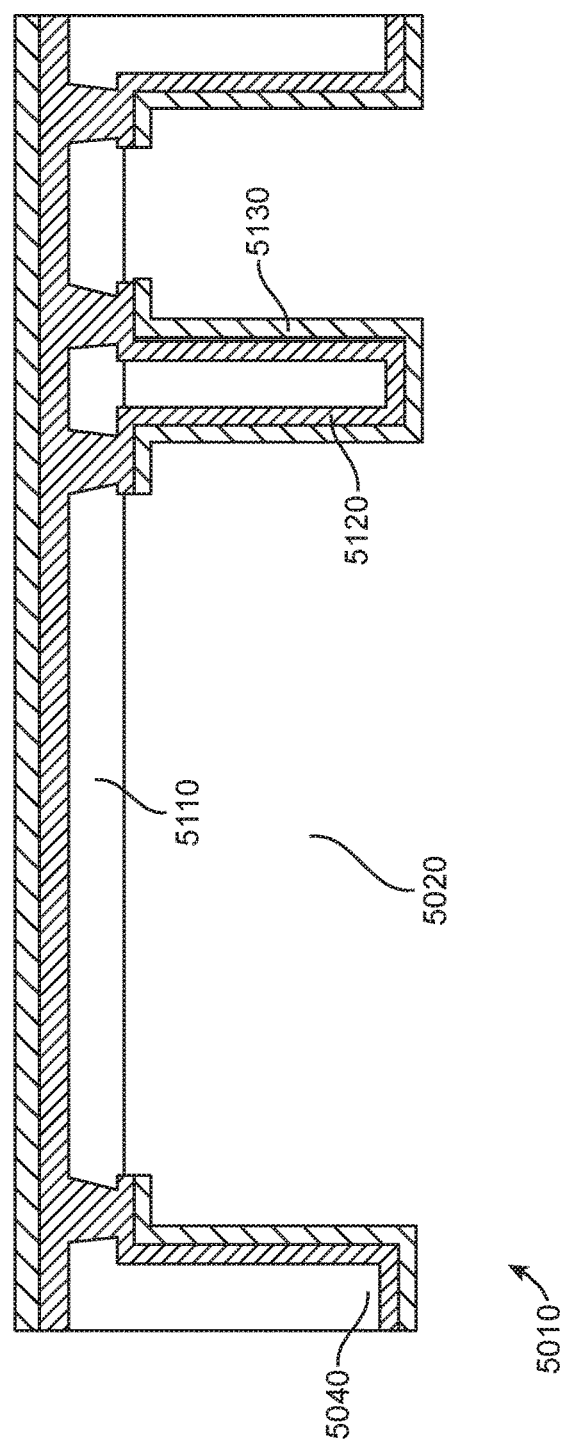
FIG. 51 illustrates an adaptive shield according to an embodiment of the present invention.

FIG. 51 illustrates an adaptive shield according to an embodiment of the present invention. In this example, adaptive shield 5010 may be formed of board 5110 and may be partially plated with copper layer 5120 and gold layer 5130. Gold layer 5130 may provide a desirable cosmetic effect, shielding, grounding, or other function. In these and other embodiments of the present invention, other materials besides copper and gold may be used. Copper layer 5120 and gold layer 5130 may be formed over sidewalls 5040.

Figure 52:
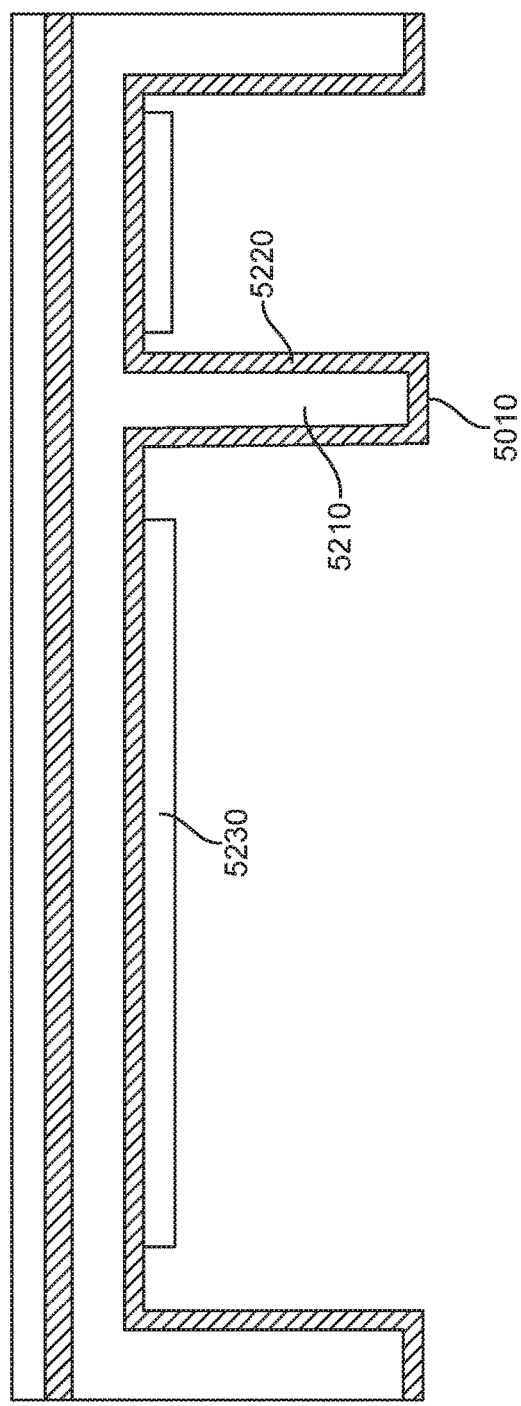
FIG. 52 illustrates an adaptive shield according to an embodiment of the present invention.

FIG. 52 illustrates an adaptive shield according to an embodiment of the present invention. In this example, black solder mask 5230 may be applied along various portions of adaptive shield 5010. Black solder mask 5230 may provide rigidity and insulation. It may also have a desirable cosmetic effect.

In various embodiments of the present invention, these adaptive shield may include interconnect paths. Examples are shown in the following figures.

Figure 53:
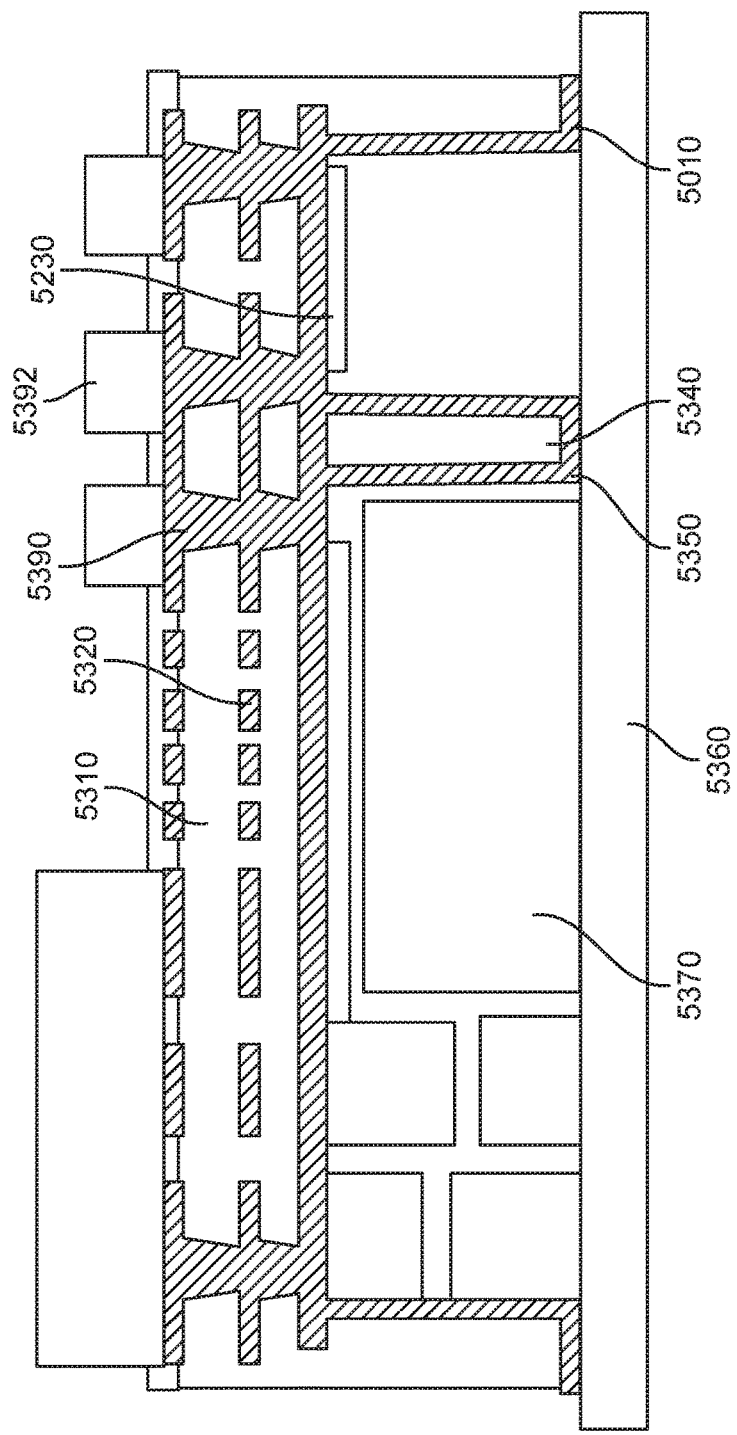
FIG. 53 illustrates an adaptive shield according to an embodiment of the present invention.

FIG. 53 illustrates an adaptive shield according to an embodiment of the present invention. In this example, adaptive shield 5010 may include a top portion 5310. Top portion 5310 may support a number of route paths 5320. Top portion 5310 may also include a number of vias 5390, which may provide vertical interconnect to components 5392. Top portion 5310 may shield components 5370, which may be located on board 5360. Adaptive shielded 5010 may also include sidewalls 5340. Sidewalls 5340 may be plated with conductive layer 5350. Black solder mask 5230 may provide rigidity and insulation to top portion 5310.

Figure 54:
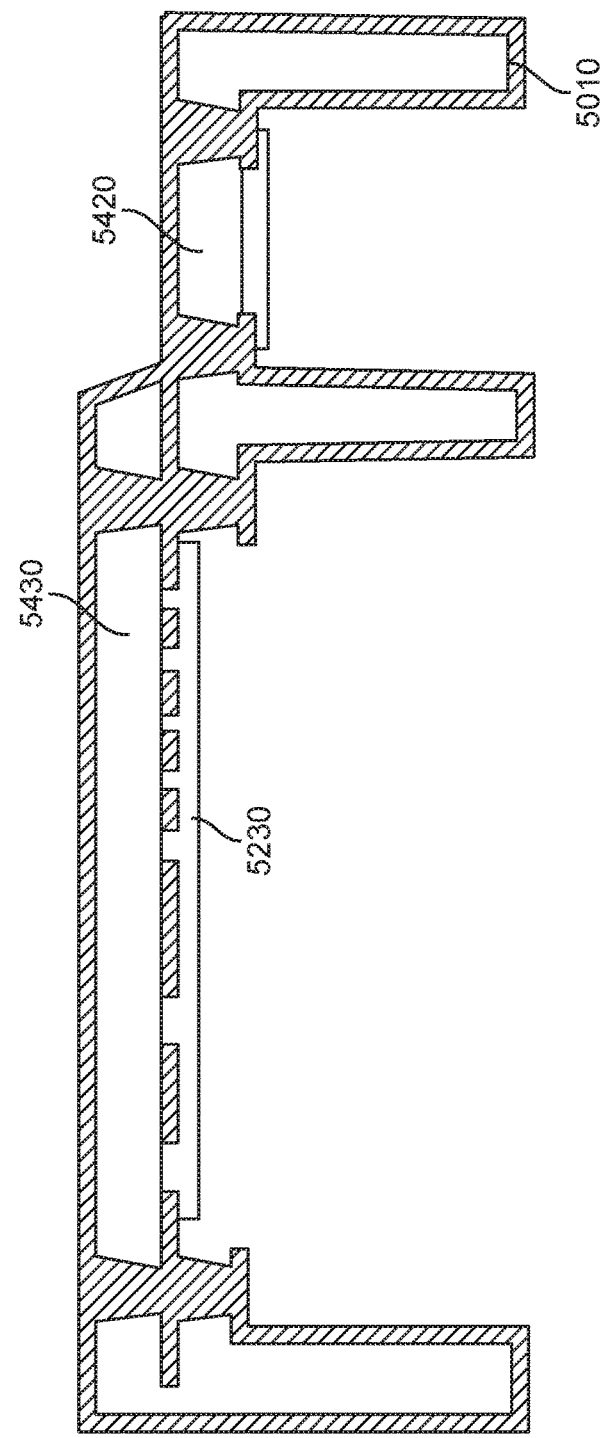
FIG. 54 illustrates a multiple layer adaptive shield according to an embodiment of the present invention.

FIG. 54 illustrates a multiple layer adaptive shield according to an embodiment of the present invention. In this case, adaptive shielded 5010 may include a first layer 5420 and a second layer 5430. In this way an adaptive shield may conform to a space inside an electronic device housing the module. That is, the first layer 5420 may have a lower height or profile as compared to second layer 5430. This may provide room for components to be placed over first layer 5420. Black solder mask 5230 may be applied along various portions of adaptive shield 5010. Black solder mask 5230 may provide rigidity and insulation. It may also have a desirable cosmetic effect.

Figure 55:
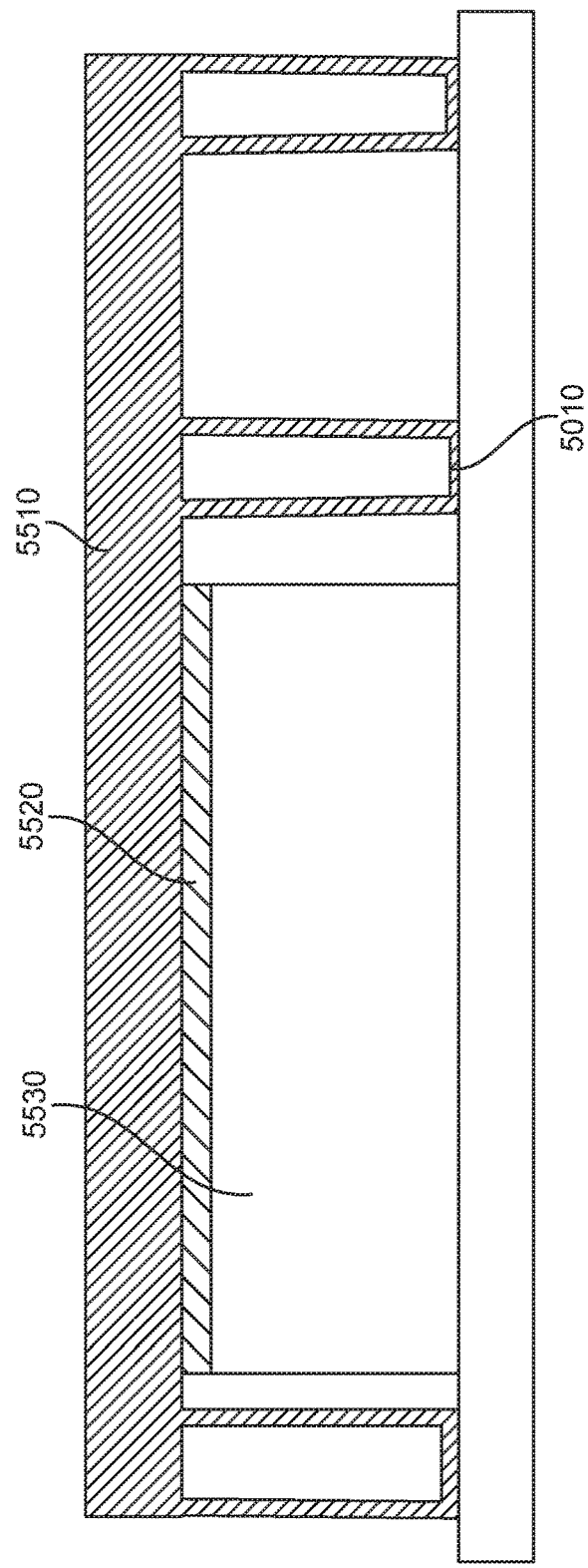
FIG. 55 illustrates an adaptive shield having a heat sink according to an embodiment of the present invention.

FIG. 55 illustrates an adaptive shield having a heat sink according to an embodiment of the present invention. In this example, adaptive shield 5010 may include heat sinks 5510. Heat sink 5510 may be thermally connected to module 5530 by thermal paste 5520 or other thermally conductive layer. Heat sink 5510 may be formed of copper or other material. Heat sink 5510 may dissipate heat generated by module 5530.

In various embodiments of the present invention, these adaptive modules may be combined with other vertical interconnect structures. Examples are shown in the following figures.

Figure 56:
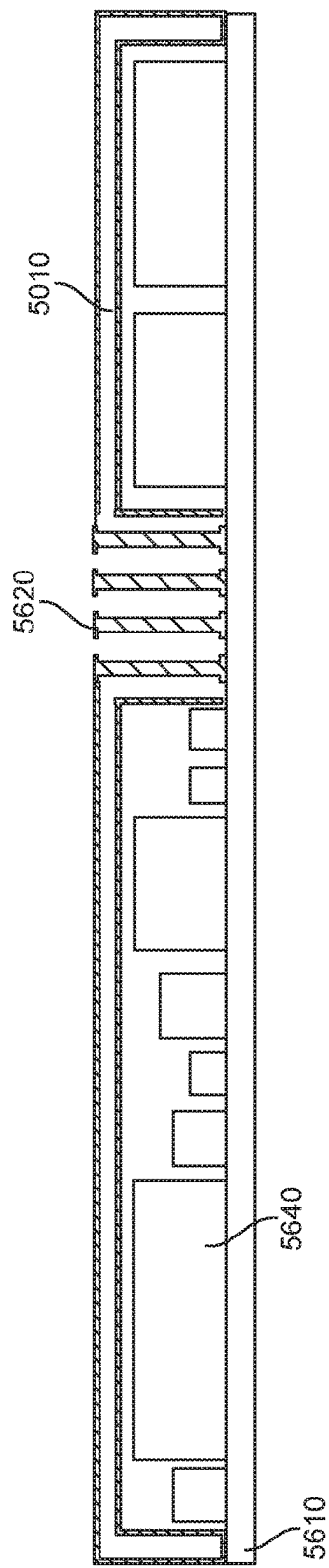
FIG. 56 illustrates an adaptive shield according to an embodiment of the present invention.

FIG. 56 illustrates an adaptive shield according to an embodiment of the present invention. In this example, adaptive shield 5010 may be attached to or otherwise located on board 5610. Components 5640 may be soldered or otherwise fixed to a surface of board 5610. Adaptive shield 5010 may further include vertical interconnect structures 5620. Vertical interconnect structures 5620 may be attached to contacts of flexible circuit board, contacts of a second system in a package module, or they may be attached to another components, components, circuits, or devices.

Figure 57:
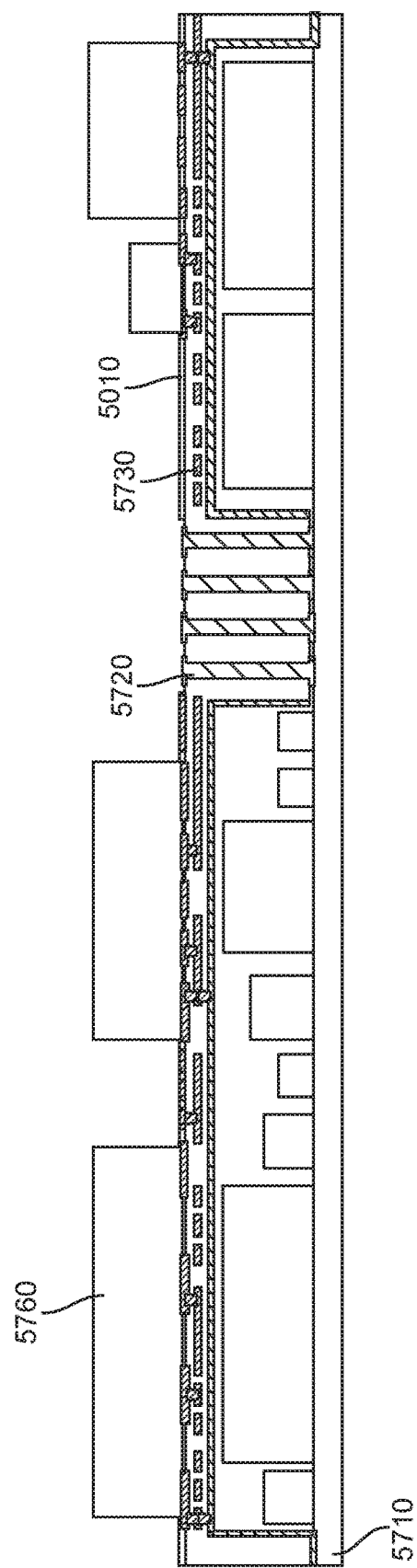
FIG. 57 illustrates an adaptive shield according to an embodiment of the present invention.

FIG. 57 illustrates an adaptive shield according to an embodiment of the present invention. Adaptive shield 5010 may be attached to or other was located on board 5710. Components 5750 may be located on board 5710. Adaptive shield 5010 may include vertical interconnect structures 5720. Vertical interconnect structures 5720 may be attached to contacts of flexible circuit board, contacts of a second system in a package module, or they may be attached to another components, components, circuits, or devices.

Adaptive shield 5010 may further support route paths 5730. Route paths 5730 may provide interconnect to components 5760 on a top surface of adaptive shield 5010. Vertical interconnect structures 5700 may connect to route paths 5730 to provide interconnect paths form board 5710 through adaptive shield 5010 to components 5760.

Figure 58:
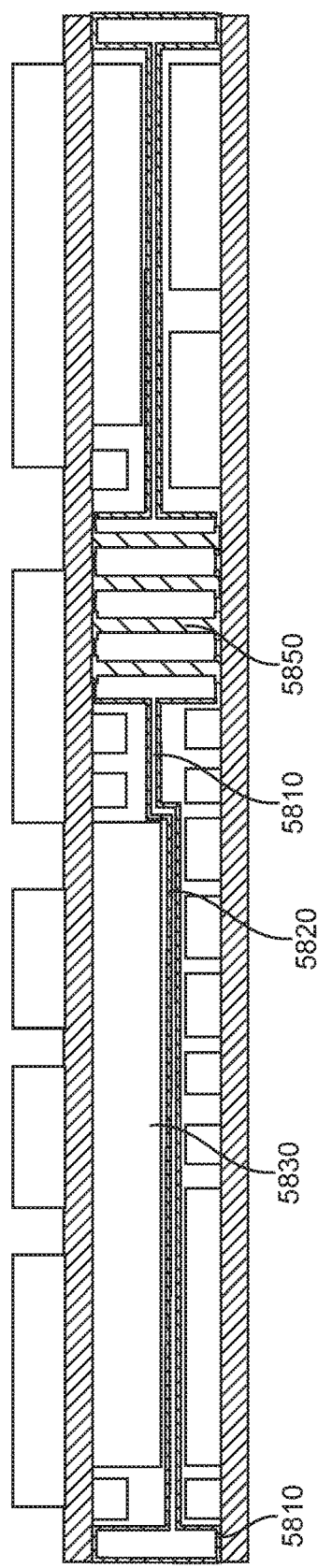
FIG. 58 illustrates an adaptive shield that may be used in a module according to an embodiment of the present invention.

FIG. 58 illustrates an adaptive shield that may be used in a module according to an embodiment of the present invention. Adaptive shield 5010 may be located on board 5810 and may include routing portion 5820. Routing portion 5820 may be formed to route signals or power between components 5830. Adaptive shield 5010 may also include vertical interconnect 5850, which may serve similar functions as vertical interconnect 5620 and 5720 (shown in FIGS. 56 and 57.)

The various layers of these adaptive shields may be formed in various ways. Examples are shown in the following figures.

Figure 59:
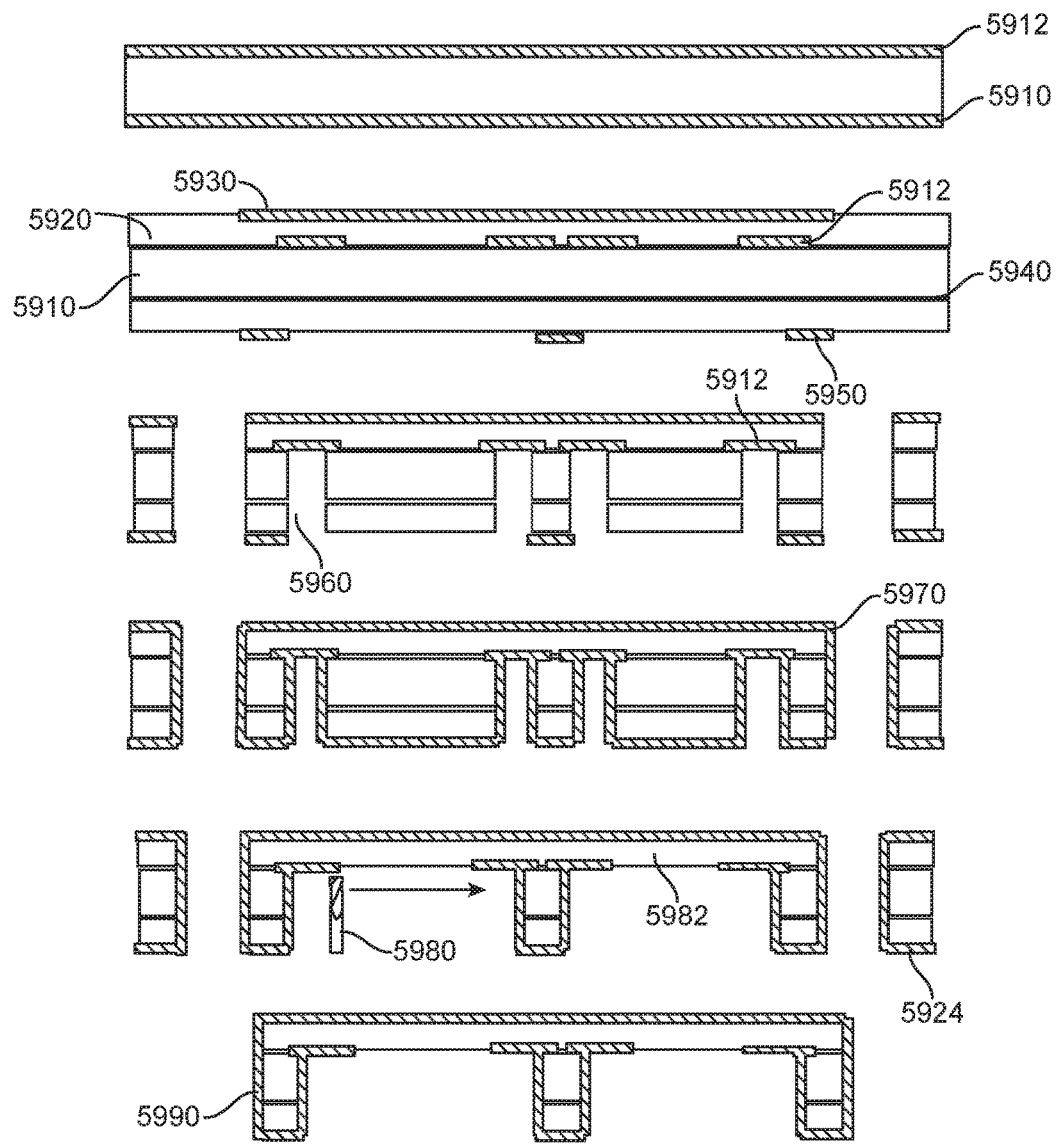
FIG. 59 illustrates a method of manufacturing an adaptive shield according to an embodiment of the present invention.

FIG. 59 illustrates a method of manufacturing an adaptive shield according to an embodiment of the present invention. In this example, core layers 5910 may be plated with metal a layers 5912. Plating layers 5912 may be etched as shown. Additional layers 5920 may be added to a top and bottom side of or layer 5910. Additional insulating layers 5930 and 5950 may be added and etched.

Sections 5960 may be removed with a laser. Layer 5912 may act as a stop for the laser. The results may be plated with layer 5970. A drill, router, or other tool 5980 may be used to clear area 5982. The resulting adaptive shields 5950 may be separated into individual units.

Figure 60:
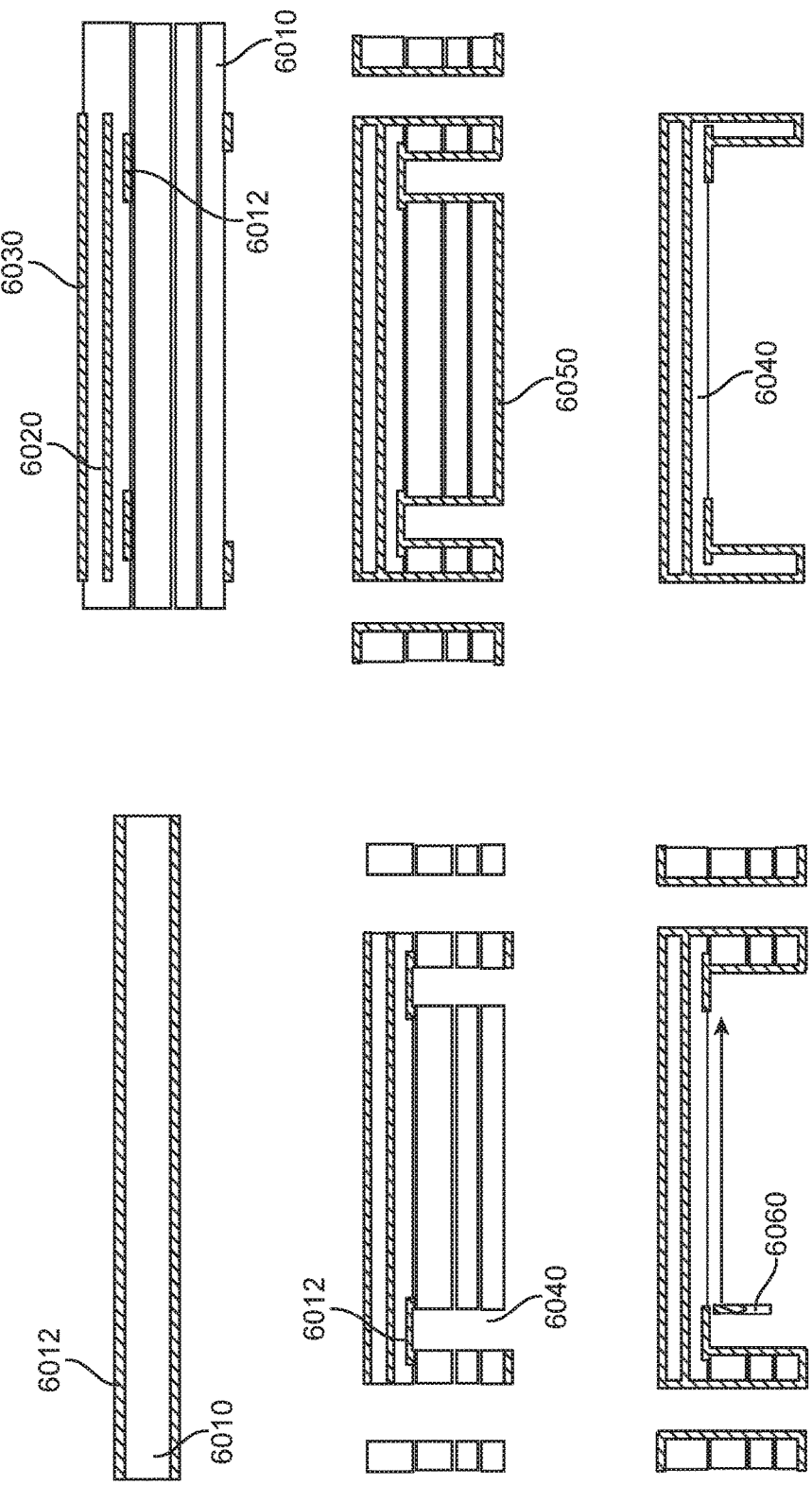
FIG. 60 illustrates another method of forming an adaptive shield according to an embodiment of the present invention.

FIG. 60 illustrates another method of forming an adaptive shield according to an embodiment of the present invention. Again, a core including layers 6010 having plating 6012 may be provided. Plating 6012 may be etched, and additional layers 6010 and 6020 insulating layers 6030 may be added. A laser may form openings 6040. Plating 6012 may act as a laser stop. This may be plated by layer 6050. As before, a drill, router or other tool 6060 may be used to clear area 6040. The individual adaptive shields may be separated at this point.

Various features may be formed in adaptive shields according to embodiments of the present invention. Examples are shown in the following figures.

Figure 61:
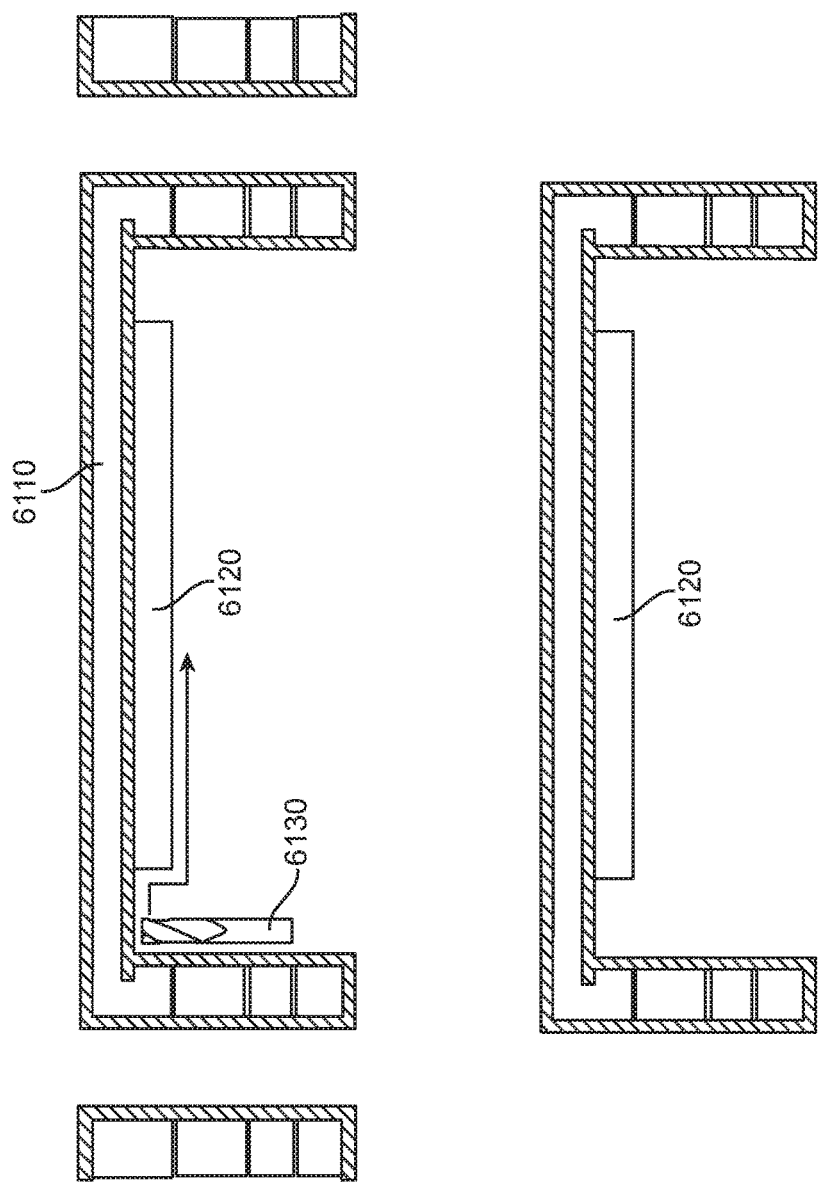
FIG. 61 illustrates an adaptive shield having a boss according to an embodiment of the present invention.

FIG. 61 illustrates an adaptive shield having a boss according to an embodiment of the present invention. In this example, a drill, router, or other tool 6130 may be used to form boss 6120.

Figure 62:
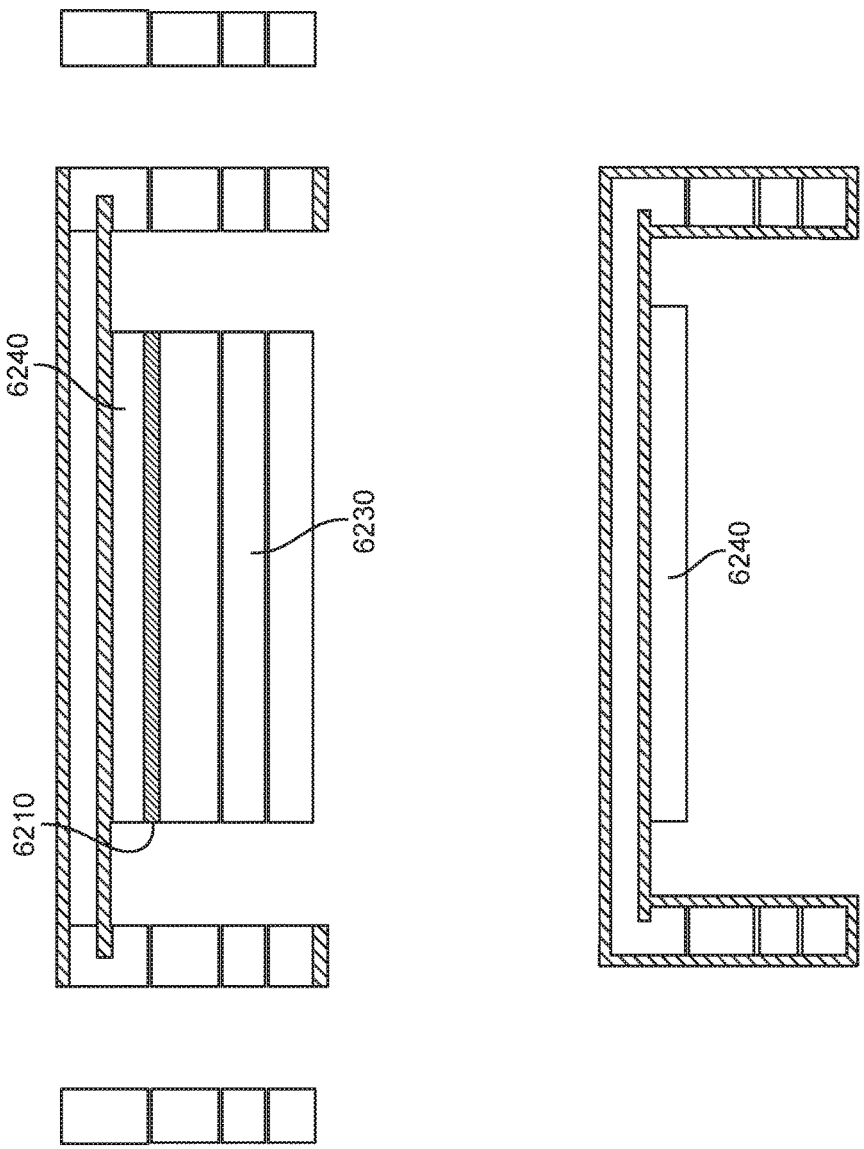
FIG. 62 illustrates another method of manufacturing a boss on an adaptive shield according to an embodiment of the present invention.

FIG. 62 illustrates another method of manufacturing a boss on an adaptive shield according to an embodiment of the present invention. In this example, a release layer 6210 may be placed or formed between boss 6240 and remaining portions 6230. Release layer 6210 may be used to remove remaining portions 6230 leaving boss 6240 behind.

Various structures for shielding, vertical interconnect, and other purposes may be formed in various ways. Examples are shown in the following figures.

Figure 63:
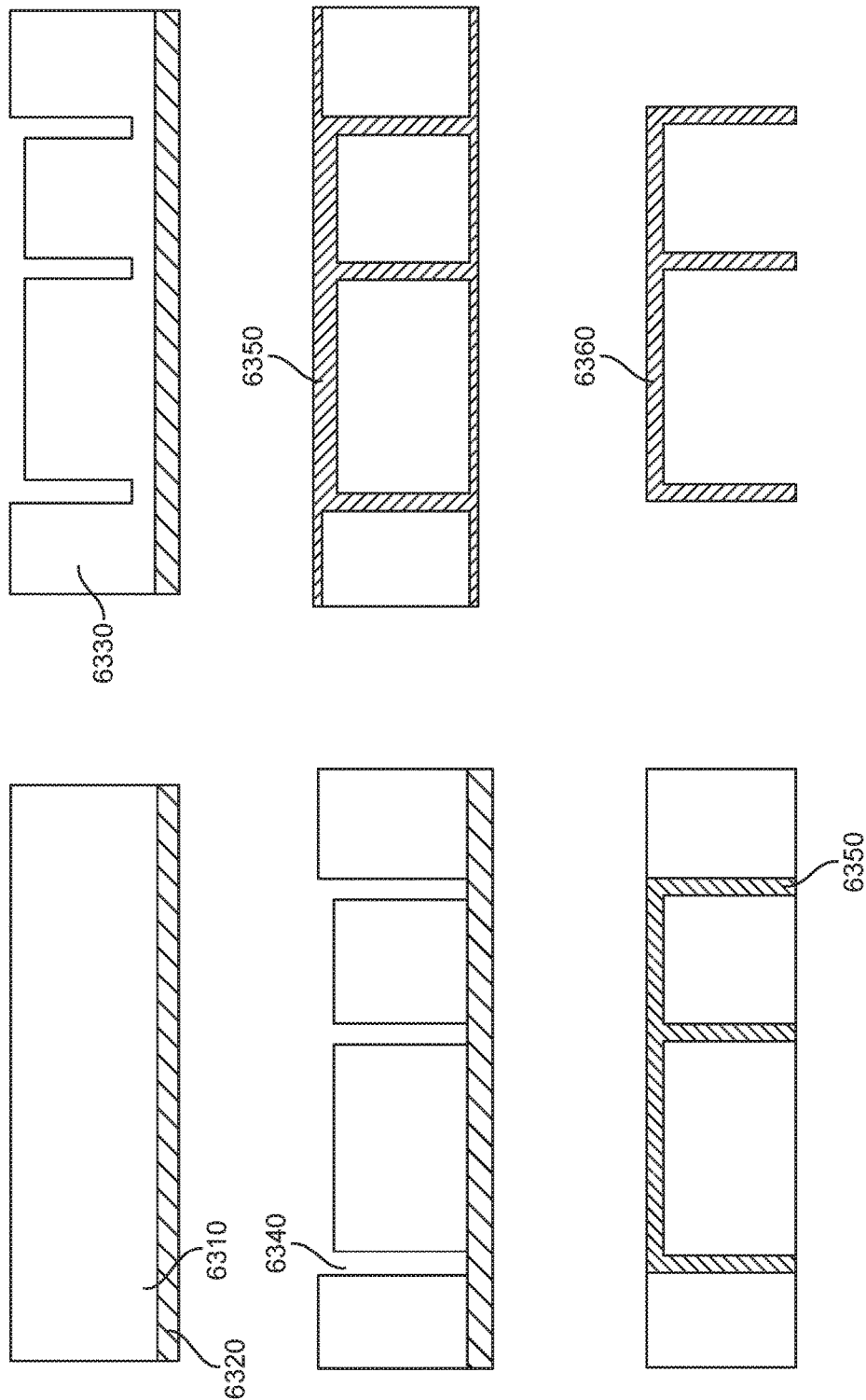
FIG. 63 illustrates a method of manufacturing shielding or vertical interconnect according to an embodiment of the present invention.

FIG. 63 illustrates a method of manufacturing shielding or vertical interconnect according to an embodiment of the present invention. Sacrificial plastic 6310 may be placed on board or other substrate 6320. Sacrificial plastic 6310 may be laser etched to form plastic frame 6330. Openings 6340 may be completed with a laser. Copper or other conductive material 6350 may fill passages 6340. A bottom portion of material 6350 may be removed. The plastic fame 6330 may be removed, resulting in structure 6360.

Figure 64:
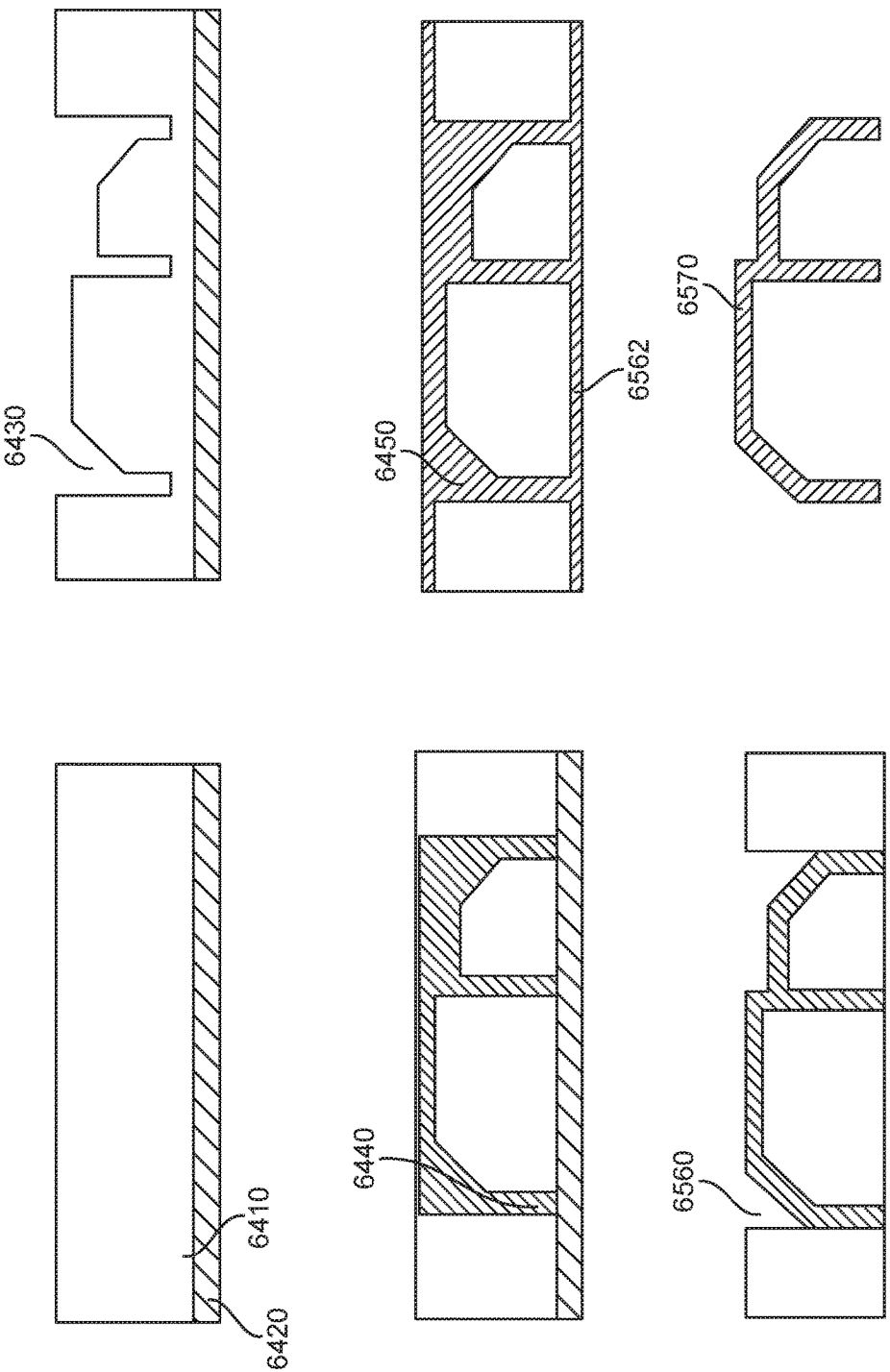
FIG. 64 illustrates another method of manufacturing shielding or vertical interconnect according to an embodiment of the present invention.

FIG. 64 illustrates another method of manufacturing shielding or vertical interconnect according to an embodiment of the present invention. Again, sacrificial plastic 6410 may be located on board or other appropriate substrate 6420. Sacrificial plastic 6410 may be etched at 6430 and lasered at 6440, and the resulting structure may be filled with copper or other conductive material 6450. The copper or other material 6450 may be etched at 6560 and a bottom portion 6562 may be removed. The remaining plastic may then be removed, resulting in structure 6570.

In the above portions of electronic systems, and in other portions of electronic systems provided by embodiments of the present invention, it may be desirable to isolate some components from other components. This may be done using one or more columns or walls, such as columns 130 or walls 140 or 2850 above, or other columns or walls provided by embodiments of the present invention. These columns or walls, such as columns 130 or walls 140 or 2850 and the other columns or walls shown here may be formed of aluminum, steel, copper, or other conductive material. These columns or walls may be formed by stamping, forging, metallic injection molding, machining, micro-machining, or other manufacturing technique. In still other embodiments of the present invention, these columns or walls may be formed of a conductive adhesive. These conductive adhesive columns or walls may be formed using printing, stenciling, or other appropriate technique. These columns or walls may extend from top plate 3530 to bottom plate 3540, or between other plates or layers in embedded substrate 3520 or other electronic system structure.

It should be noted that while the interconnect structures described above are well-suited to forming system-in-a-package modules, in other embodiments of the present invention, other types of electronic devices may be formed using these techniques.

In various embodiments of the present invention, contacts, interconnect paths, and other conductive portions of SIP modules may be formed by stamping, metal-injection molding, machining, micro-machining, ink-jet, 3-D, aerosol-jet, or other type of printing, or other manufacturing process. The conductive portions may be formed of stainless steel, steel, copper, copper titanium, phosphor bronze, or other material or combination of materials. They may be plated or coated with nickel, gold, or other material. The nonconductive portions, such as the moldings, may be formed using injection or other molding, ink-jet, 3-D, aerosol-jet, or other type of printing, machining, or other manufacturing process. The nonconductive portions, such as the various overmolded portions including overmold 120 and 2010, may be formed of silicon or silicone, rubber, hard rubber, plastic, nylon, liquid-crystal polymers (LCPs), plastic, epoxy, resin, or other nonconductive material or combination of materials. The printed circuit boards used may be formed of FR-4, BT or other material. Printed circuit boards may be replaced by other substrates, such as flexible circuit boards, in many embodiments of the present invention, while flexible circuit boards may be replaced by printed circuit boards in these and other embodiments of the present invention.

Embodiments of the present invention may provide SIP modules that may be located in various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A system-in-a-package module comprising:
a board;
a first component having a first contact directly connected to a second contact on the board;
a second component having a third contact directly connected to a fourth contact on the board; and
a third component having a fifth contact directly connected to the first contact of the first component and the third contact of the second component.

2. The module of claim 1 wherein the first component is a capacitor.

3. The module of claim 1 wherein the first component is a resistor having a value of near zero ohms.

4. The module of claim 1 further comprising molding compound encapsulating the first component and the second component.

5. The module of claim 4 further comprising a conductive layer on a top surface of the molding compound, wherein the second contact on the board is electrically connected to the conductive layer though the first contact on the first component and the fifth contact on the third component.

6. The module of claim 5 wherein the conducive layer is a trace.

7. The module of claim 5 wherein the conducive layer is a shield.

8. A system-in-a-package module comprising:
a board;
an adaptive shield comprising a top shield portion comprising a heat sink and attached to a surface of the board through a sidewall, the sidewall forming a recess; and a plurality of components on the surface of the board and below the top shield portion of the adaptive shield, where the heat sink is thermally coupled to the plurality of components via a layer of thermal paste.

9. The module of claim 8 further comprising a layer of black solder mask on an underside of the top shield portion.

10. The module of claim 8 further wherein the heat sink is copper.

11. The module of claim 8 further comprising a plurality of vertical interconnect paths through a sidewall of the adaptive shield.

12. The module of claim 8 further comprising a plurality of route paths through the top shield portion of the adaptive shield.

13. A system-in-a-package module comprising:
   a substrate;
   a plurality of electrical components on a surface of the substrate;
   a vertical interconnect structure;
   an overmold over the plurality of electrical components and the vertical interconnect structure; and
   a top shield over the overmold, the top shield formed separately from the vertical interconnect structure, wherein the vertical interconnect structure extends from the surface of the substrate to a bottom of a shallow trench in a top surface of the overmold where it electrically connects to the top shield.

14. The module of claim 13 wherein the vertical interconnect structure comprises a column formed by stacking drops of solder.

15. The module of claim 13 wherein the vertical interconnect structure comprises a column of sinter.

16. The module of claim 15 wherein the column is formed of copper-tin.

17. The module of claim 13 wherein the vertical interconnect structure comprises a wall formed by layers of solder.

18. The module of claim 13 wherein the vertical interconnect structure comprises a wall formed by sintering layers of copper-tin.

19. The module of claim 13 wherein the vertical interconnect structure comprises a wall formed by a wire bond.

20. The module of claim 13 wherein the substrate is a printed circuit board.

* * * * *